(12) United States Patent
Slater et al.

(10) Patent No.: US 6,392,220 B1
(45) Date of Patent: May 21, 2002

(54) MICROMACHINED MEMBERS COUPLED FOR RELATIVE ROTATION BY HINGES

(75) Inventors: Timothy G. Slater, San Francisco; Armand P. Neukermans, Palo Alto, both of CA (US)

(73) Assignee: XROS, Inc., Santa Clara, CA (US)

( * ) Notice: Subject to any disclaimer, the term of this patent is extended or adjusted under 35 U.S.C. 154(b) by 0 days.

(21) Appl. No.: 09/388,772

(22) Filed: Sep. 2, 1999

Related U.S. Application Data

(60) Provisional application No. 60/098,881, filed on Sep. 2, 1998, and provisional application No. 60/144,953, filed on Jul. 21, 1999.

(51) Int. Cl.[7] ............ G01P 9/04; G01P 15/02; G01C 19/00; G02B 26/08

(52) U.S. Cl. ............ 250/216; 73/504.02; 73/504.12; 73/504.14; 73/514.01; 73/514.38; 250/231.1

(58) Field of Search ............ 250/216, 234, 250/235, 236, 231.1, 231.13; 73/504.02, 504.03, 504.08, 504.9, 504.12, 504.14, 504.15, 504.16, 504.18, 514.01, 514.15, 514.16, 514.19, 514.21, 514.23, 514.26, 514.29, 514.38, 862.08, 862.381; 257/254

(56) References Cited

U.S. PATENT DOCUMENTS

| | | | |
|---|---|---|---|
| 4,317,611 A | 3/1982 | Petersen | 350/6.6 |
| 4,468,282 A | 8/1984 | Neukermans | 156/633 |
| 4,598,585 A | 7/1986 | Boxenhorn | 73/505 |

(List continued on next page.)

FOREIGN PATENT DOCUMENTS

| | | | |
|---|---|---|---|
| WO | 9809286 | 3/1998 | G11B/11/10 |
| WO | 9809287 | 3/1998 | G11B/11/10 |
| WO | 9809288 | 3/1998 | G11B/11/10 |
| WO | 9809289 | 3/1998 | G11B/11/10 |
| WO | 9809392 | 3/1998 | H04B/10/135 |
| WO | 9809279 | 5/1998 | G11B/7/135 |
| WO | 9809280 | 5/1998 | G11B/7/135 |
| WO | 9809284 | 5/1998 | G11B/11/10 |
| WO | 9809285 | 5/1998 | G11B/11/10 |
| WO | 9850813 | 11/1998 | G02B/26/02 |
| WO | 9852193 | 11/1998 | G11B/13/00 |
| WO | 9915925 | 4/1999 | G02B/6/35 |

OTHER PUBLICATIONS

Boxenhorn, B., et al., "Monolithic Silicon Accelerometer," Sensors and Actuators, A21–A23, (1990) pp. 273–277.

Breng, U., et al., "Electrostatic Micromechanic Actuators," Journal of Micromechanics and Microengineering, 2(1992) pp. 256–261.

(List continued on next page.)

Primary Examiner—John R. Lee
(74) Attorney, Agent, or Firm—D. E. Schreiber, Esq.

(57) ABSTRACT

A monolithically fabricated micromachined structure (52) couples a reference frame (56) to a dynamic plate (58) or second frame for rotation of the plate (58) or second frame with respect to the reference frame (56). Performance of torsional oscillators or scanners (52) benefits greatly by coupling the frame (56) to the plate (58) or second frame with torsional flexure hinges (56) rather than torsion bars (54). Appendages (122), tethers (142) or an improved drive circuit enhance electrostatic drive stability of torsional oscillators (52). Wide and thin torsional flexure hinges (96) and isotopically pure silicon enhance thermal conductivity between the plate (58) and the frame (56). Dampening material bridging slots (232) adjacent to torsional flexure hinges (96) drastically reduce the dynamic member's Q. A widened section (252) of narrow torsional flexure hinges (96) permit inclusion of a torsion sensor (108). A dynamic member (58) that includes an actuator portion (302) performs light beam switching. Reflective coatings (76), wire grid polarizers (362), photo-detectors (372) and Fresnel lenses (376) enhance optical performance of the torsional scanners (58).

82 Claims, 21 Drawing Sheets

U.S. PATENT DOCUMENTS

| | | | |
|---|---|---|---|
| 4,670,092 A | 6/1987 | Motamedi | 156/643 |
| 4,699,006 A | 10/1987 | Boxenhorn | 73/517 |
| 4,732,440 A | 3/1988 | Gadhok | 350/6.6 |
| 4,869,107 A | 9/1989 | Murakami | 73/517 R |
| 4,942,766 A | 7/1990 | Greenwood et al. | 73/704 |
| 5,016,072 A | 5/1991 | Greiff | 357/26 |
| 5,111,693 A | 5/1992 | Greiff | 73/514 |
| 5,202,785 A | 4/1993 | Nelson | 359/214 |
| 5,203,208 A | 4/1993 | Bernstein | 73/505 |
| 5,220,835 A | 6/1993 | Stephan | 73/517 R |
| 5,251,485 A | 10/1993 | Kondo | 73/517 R |
| 5,331,852 A | 7/1994 | Greiff et al. | 73/505 |
| 5,416,324 A | 5/1995 | Chun | 250/341.3 |
| 5,488,862 A | 2/1996 | Neukermans et al. | 73/504.02 |
| 5,508,841 A | 4/1996 | Lin et al. | 359/318 |
| 5,579,148 A | 11/1996 | Nishikawa et al. | 359/214 |
| 5,629,790 A | 5/1997 | Neukermans et al. | 359/198 |
| 5,635,639 A * | 6/1997 | Greiff et al. | 257/254 |
| 5,648,618 A | 7/1997 | Neukermans et al. | 73/862.08 |
| 5,650,568 A * | 7/1997 | Greiff et al. | 73/504.09 |
| 5,673,139 A | 9/1997 | Johnson | 359/291 |
| 5,760,305 A * | 6/1998 | Greiff | 73/514.15 |
| 5,841,553 A | 11/1998 | Neukermans | 358/494 |
| 5,861,549 A | 1/1999 | Neukermans et al. | 73/105 |
| 5,895,866 A | 4/1999 | Neukermans et al. | 73/861.74 |
| 5,905,201 A * | 5/1999 | Petri | 73/504.03 |
| 6,000,280 A | 12/1999 | Miller et al. | |
| 6,044,705 A * | 4/2000 | Neukermans et al. | 73/504.02 |

OTHER PUBLICATIONS

Buser, R. A., et al., "Very High Q–factor Resonators in Monocrystalline Silicon," Sensors and Actuators, A12–A23 (1990) pp. 323–327.

Dien, B., et al., "SOI (SIMOX) as a Substrate For Surface Micromachining of Single Crystalline Silicon Sensors and Actuators," The 7th International Conference on Solid–State Sensors and Actuators, (1993) pp. 233–236.

Jaecklin, V.P., et al., "Mechanical and Optical Properties of Surface Micromachined Torsional Mirrors in Silicon, Polysilicon and Aluminum," The 7th International Conference on Solid–State Sensors and Actuators, (1993) pp. 948–961.

Kleiman, R. N., et al., "Single–crystal Silicon High–Q Torsional Oscillators," Rev. Sci. Instum. 56(11), Nov. 1985, pp. 2088–2091.

Pfann, W. G., et al., "Semiconducting Stress Transducers Utilizing the Transverse and Shear Piezoresistance Effects," Journal of Applied Physics, vol. 32, No. 10, (1961) pp. 2008–2016.

Wagner, B., et al., "Electromagntic Microactuators with Multiple Degrees of Freedom," 1991 International Conference on Solid–State Sensors adn Actuators, Digest of Technical Papers. (IEEE Cat No. 91CH2817–5) pp. 614–617.

Peterson, K., "Silicon Torsional Mirror," Proceedings of the IEEE vol. 70, No. 5 (1982), pp. 61–62.

"Handbook of Optics", McGraw Hill, copyright 1978, pp. 10–72–10–77.

* cited by examiner

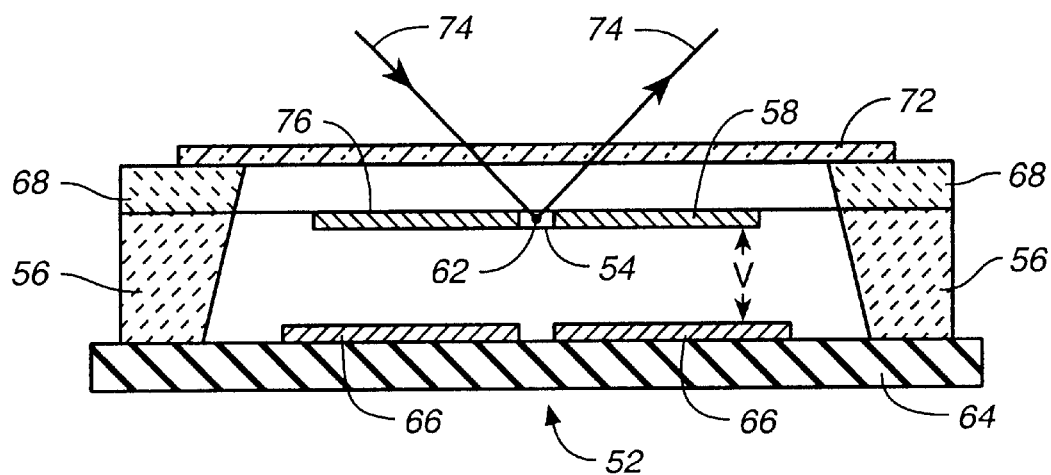
FIG._1
*(PRIOR ART)*
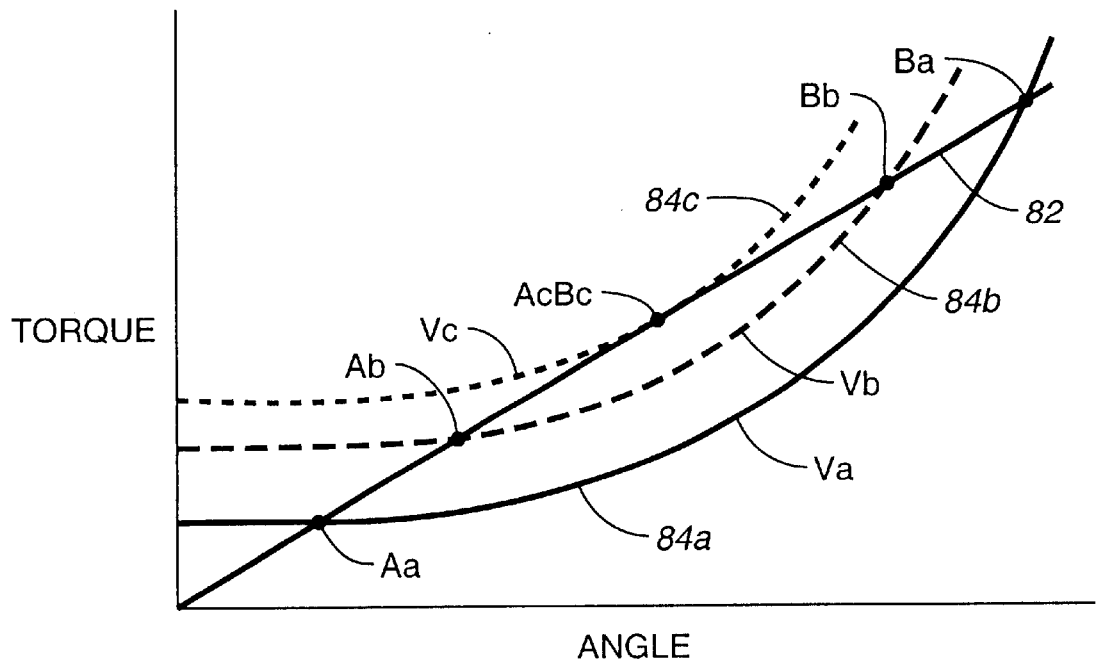
FIG._2

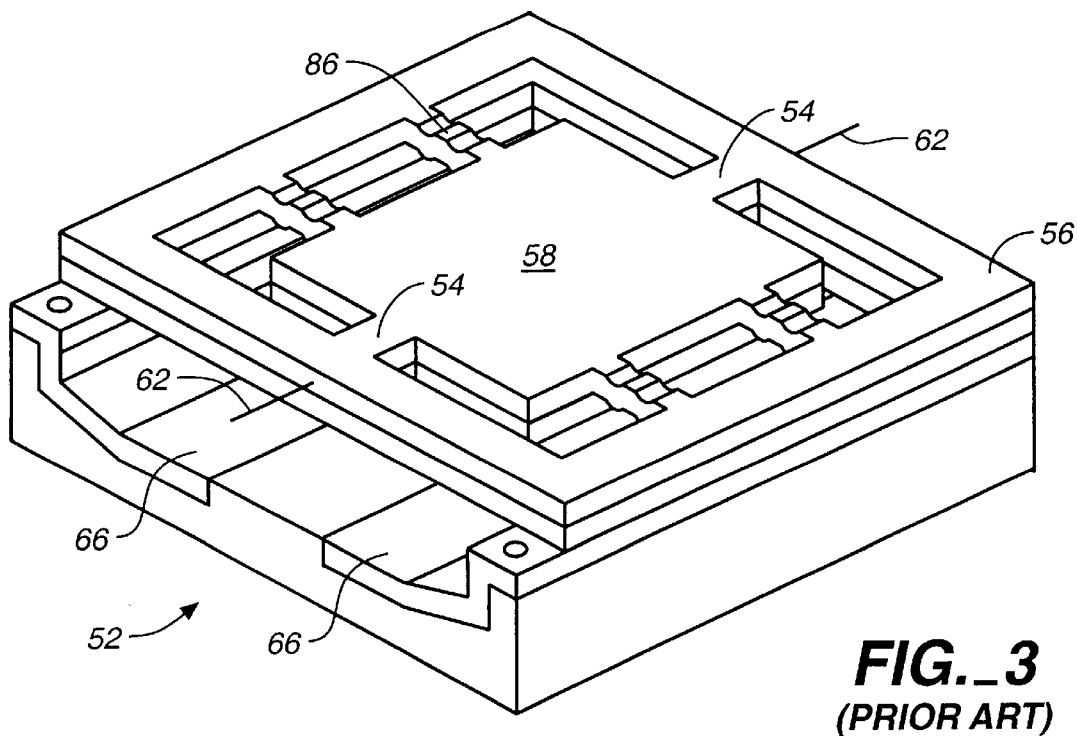
FIG._3
*(PRIOR ART)*
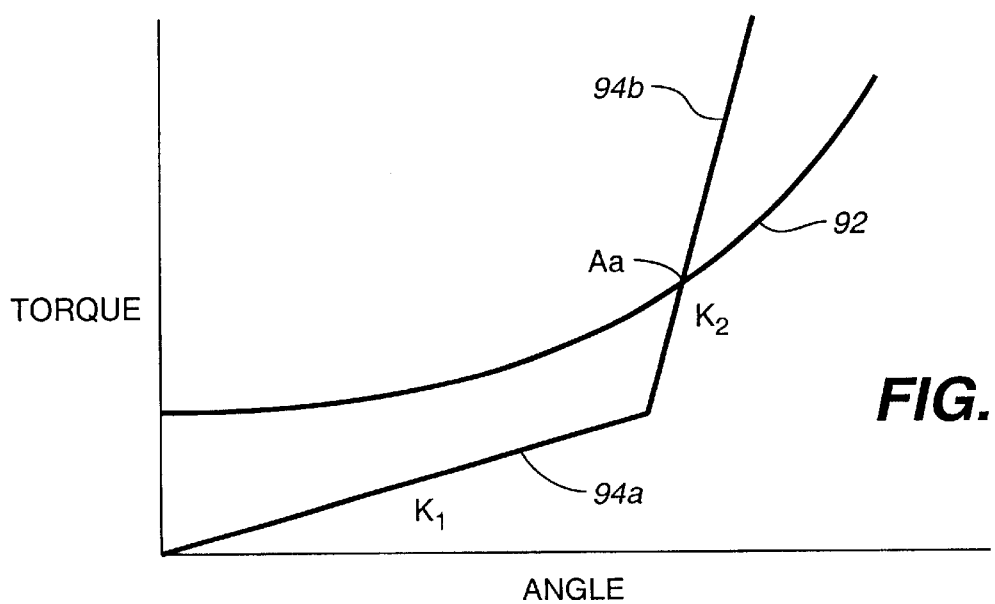
FIG._3a

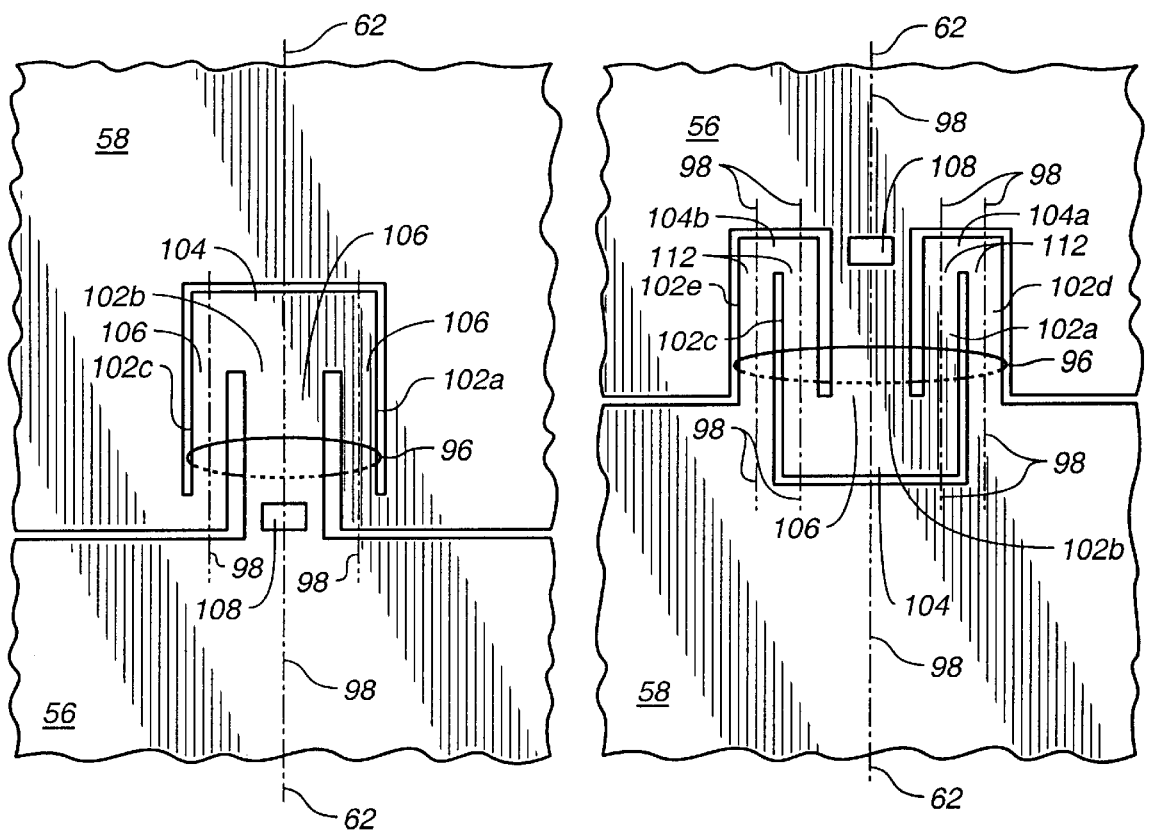
FIG._4a  FIG._4b
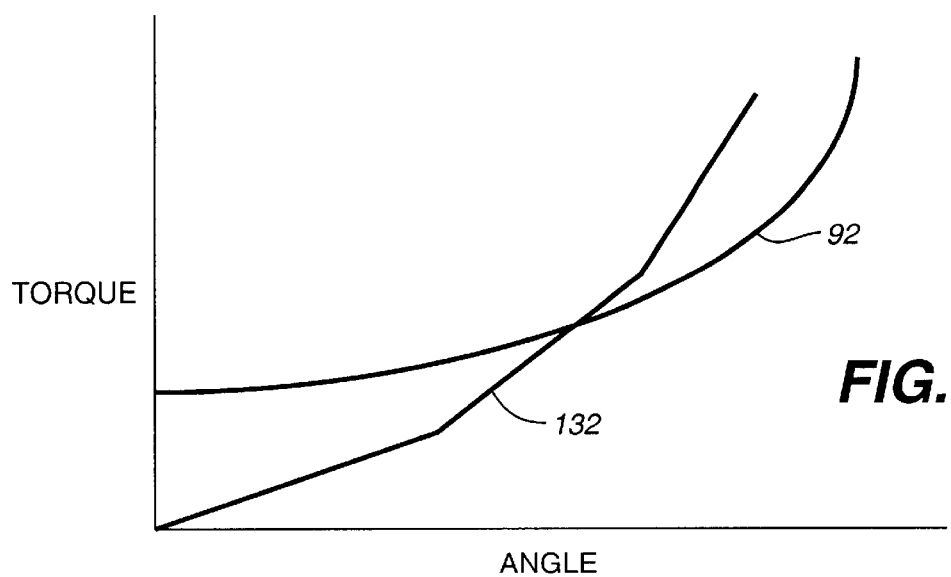
FIG._8c

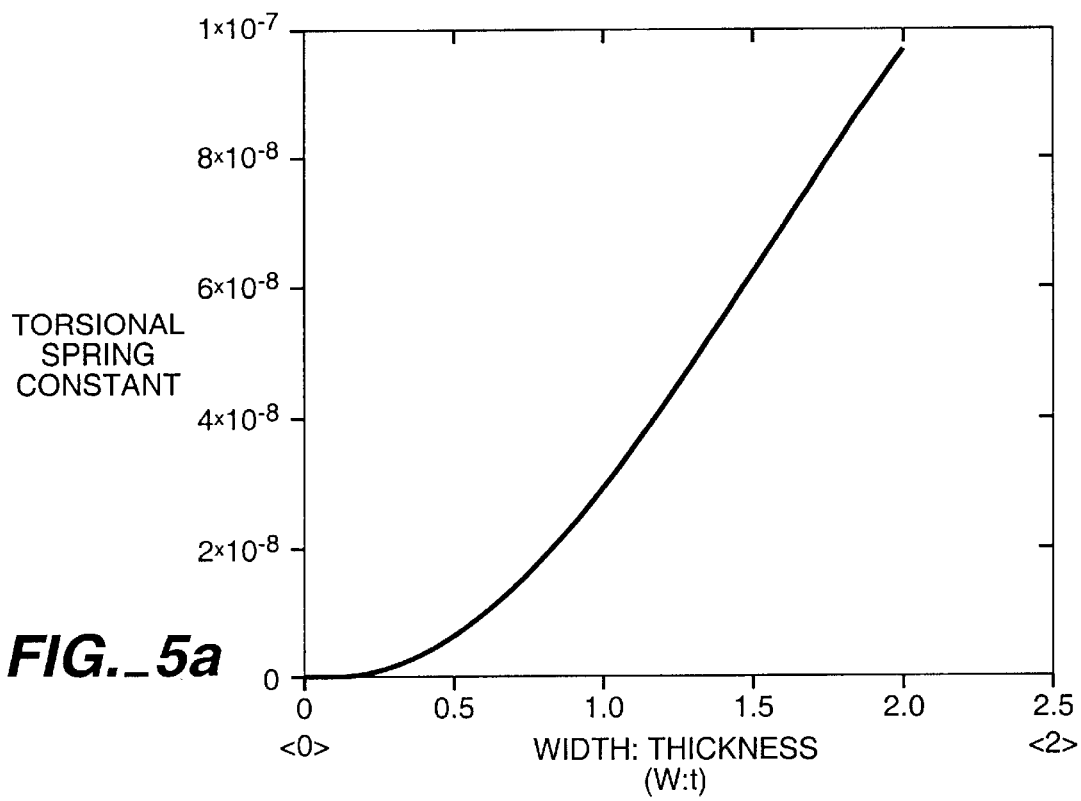
FIG._5a
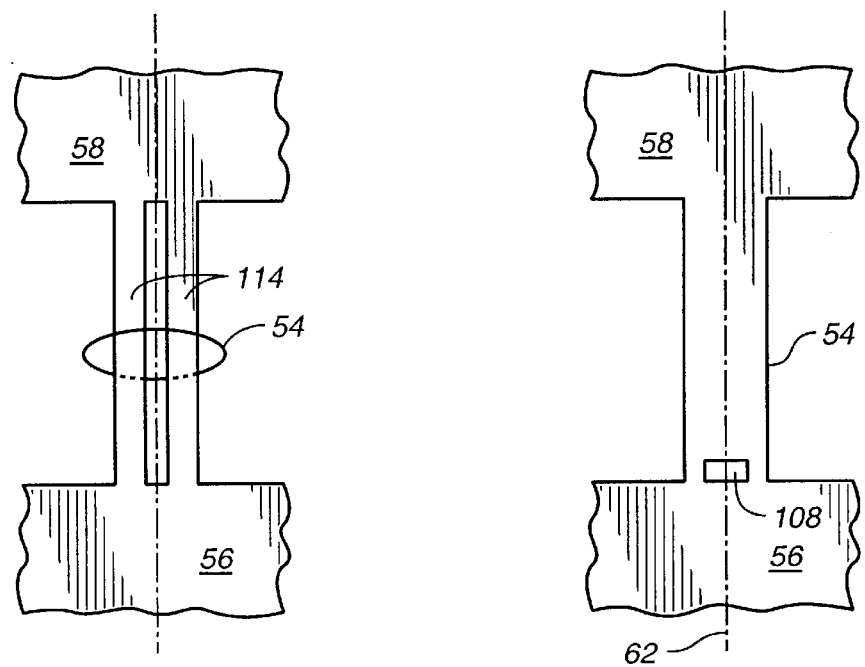
FIG._5b  FIG._6a

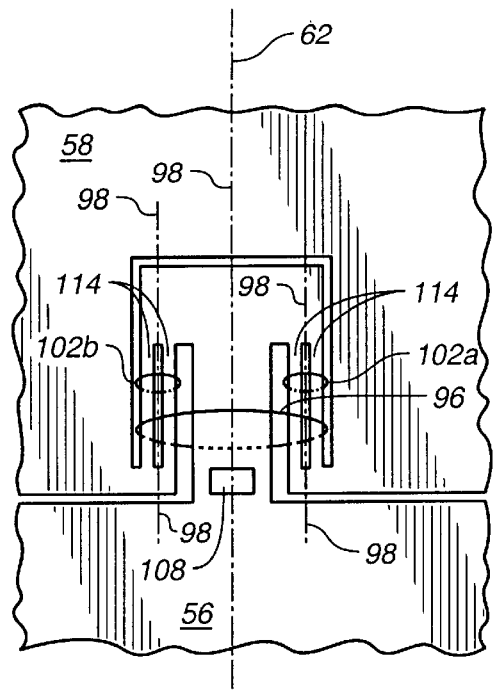
FIG._6b
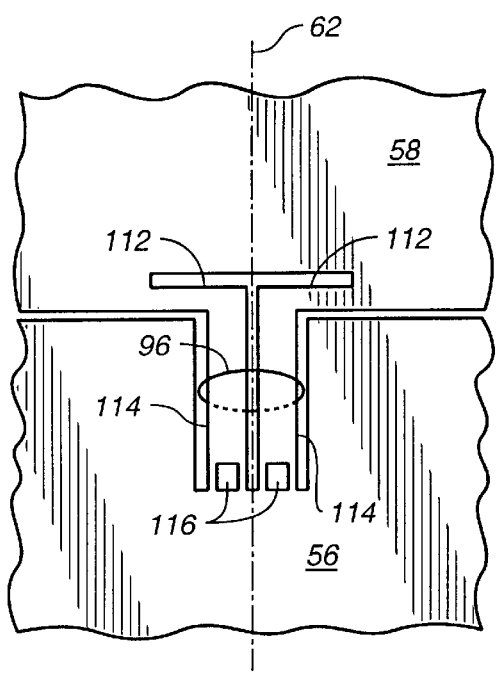
FIG._7a
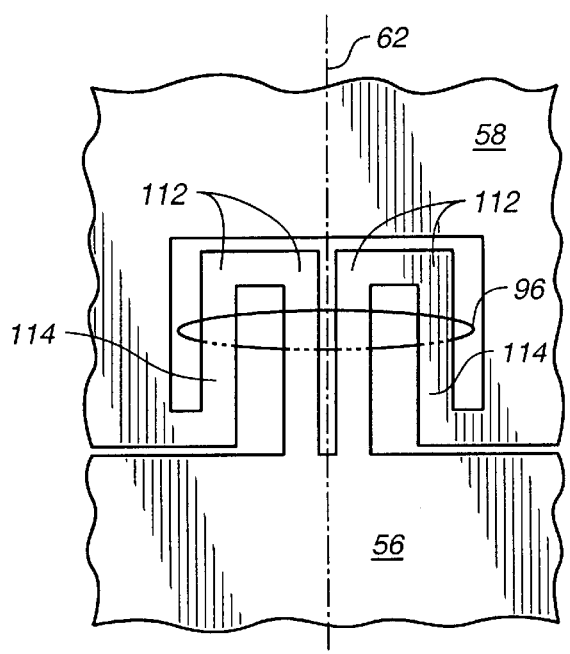
FIG._7b
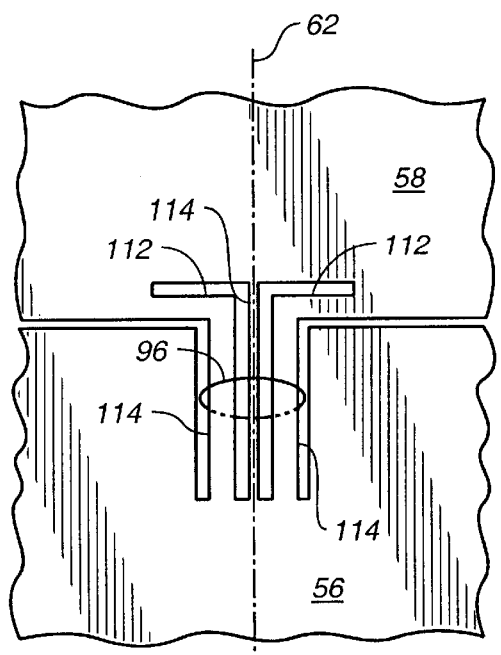
FIG._7c

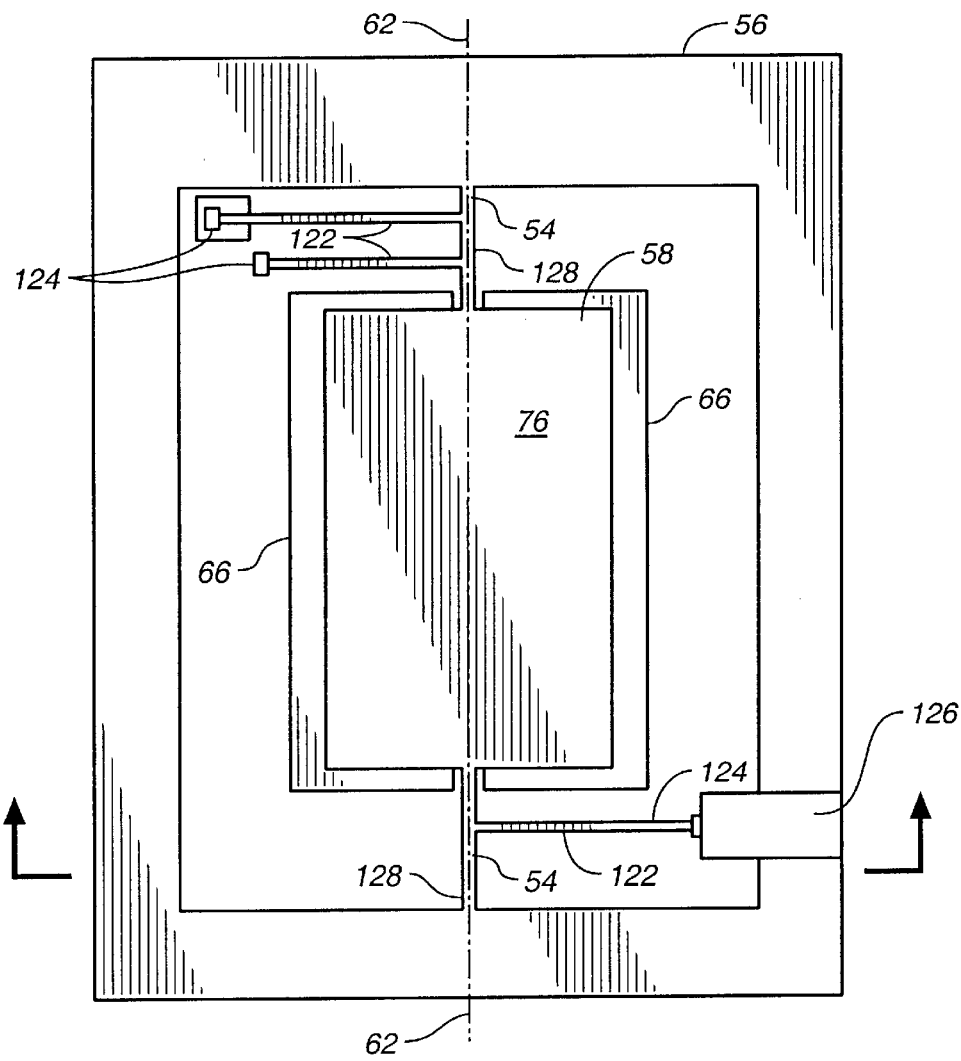
FIG._8a
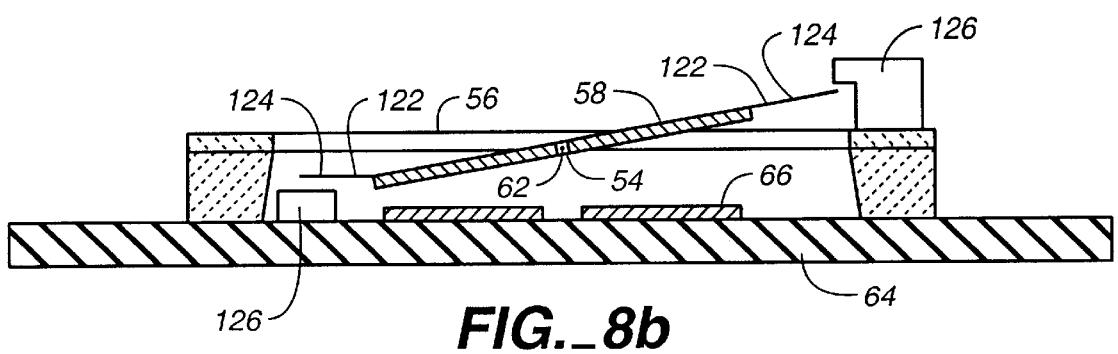
FIG._8b

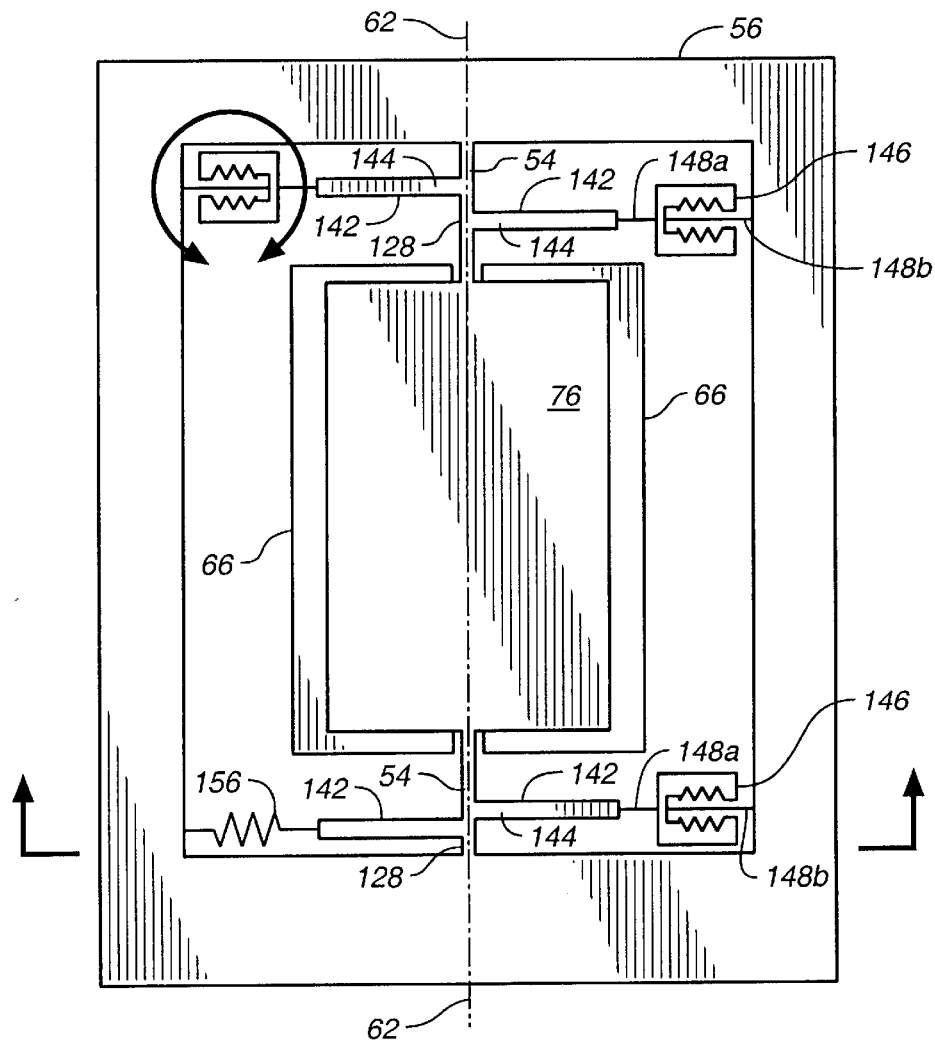
FIG._9a
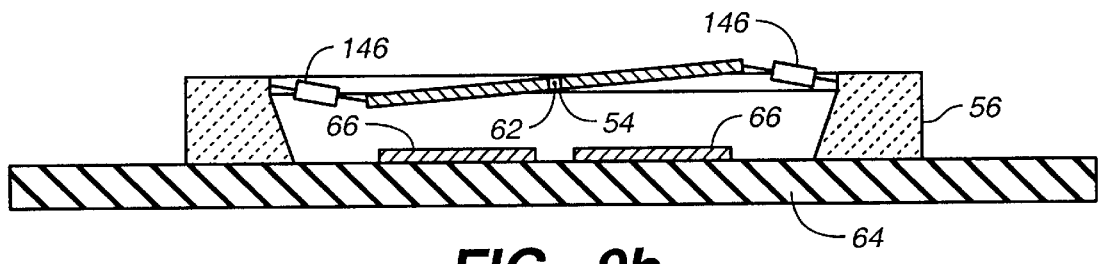
FIG._9b

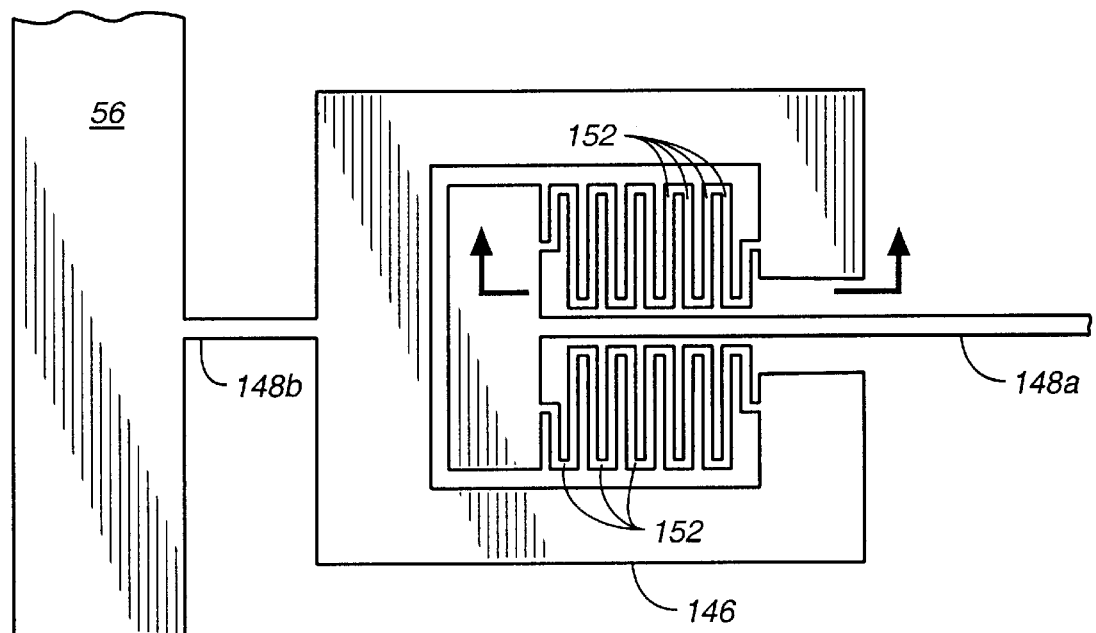
FIG._9c
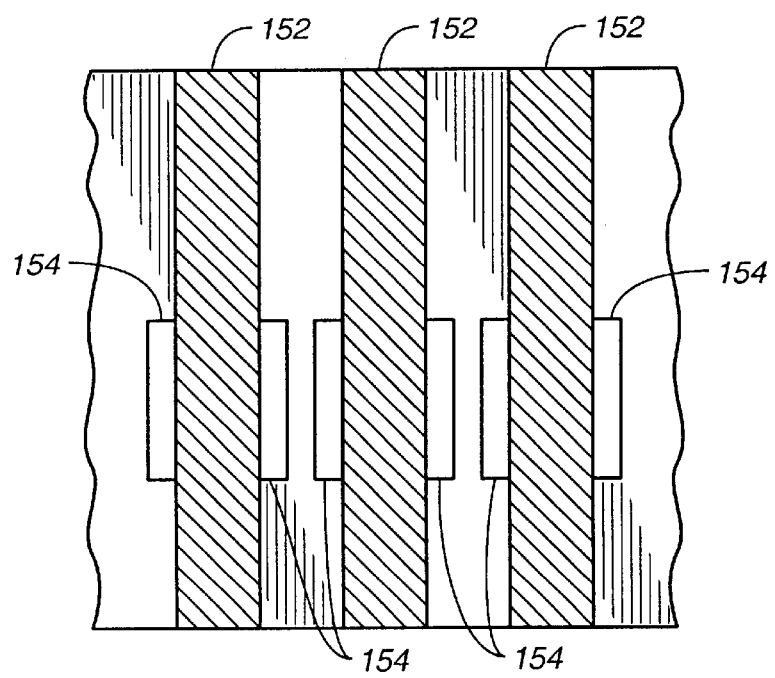
FIG._9d

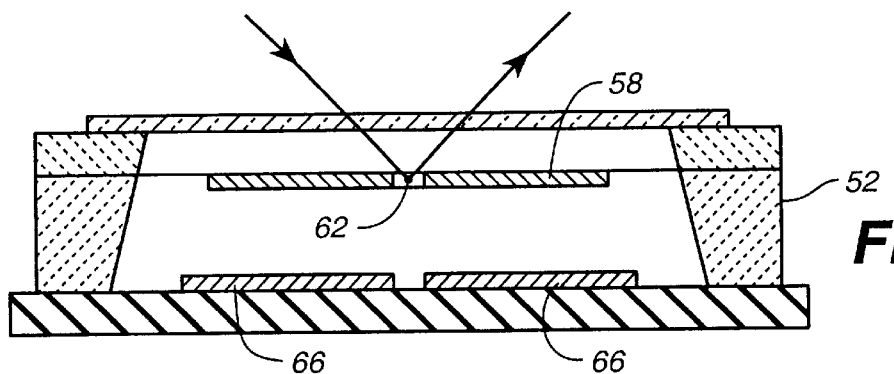
FIG._10
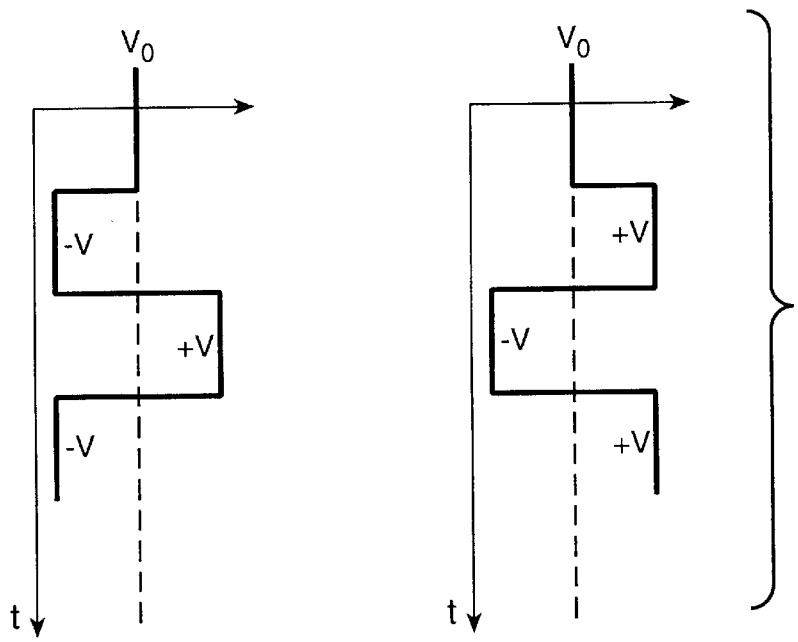
FIG._10a
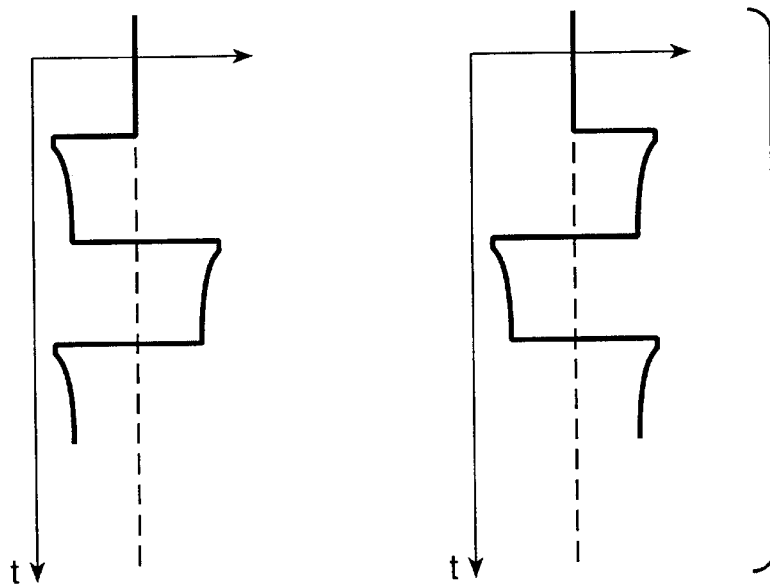
FIG._10c

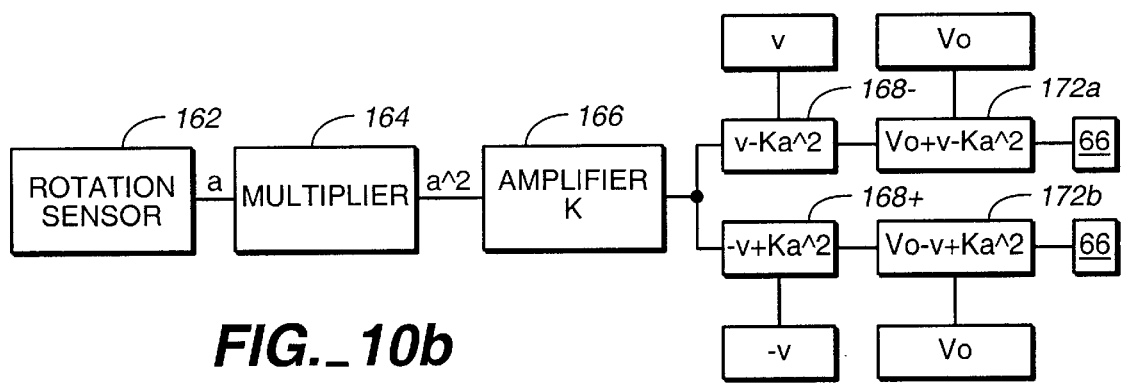
FIG._10b
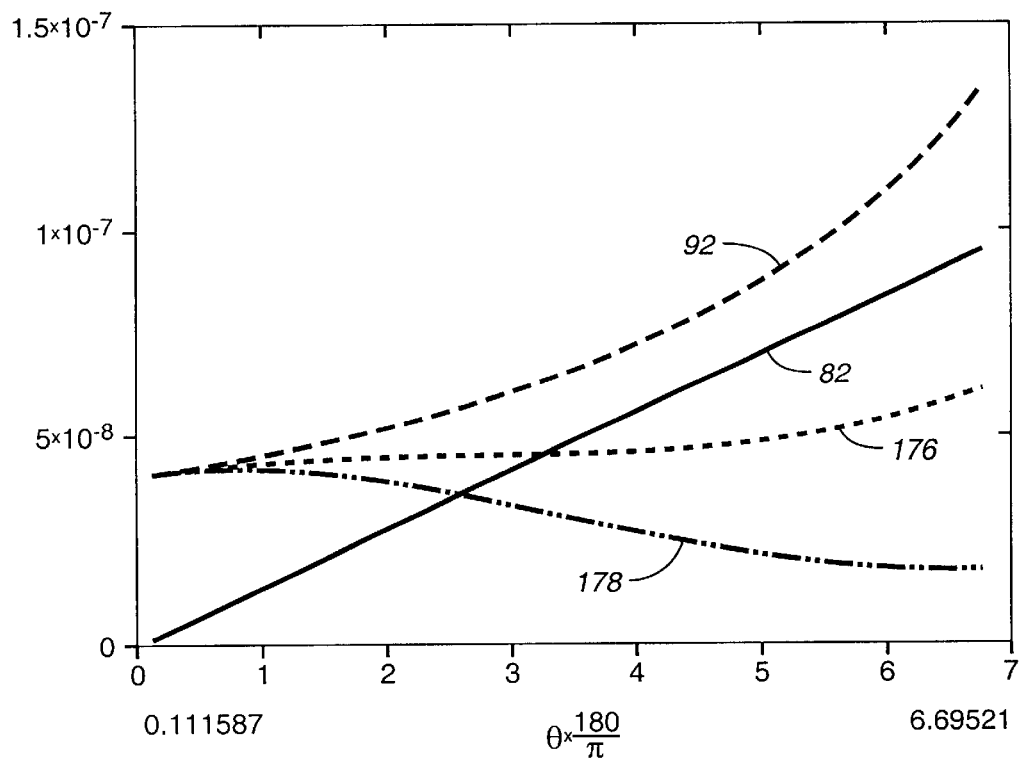
FIG._11

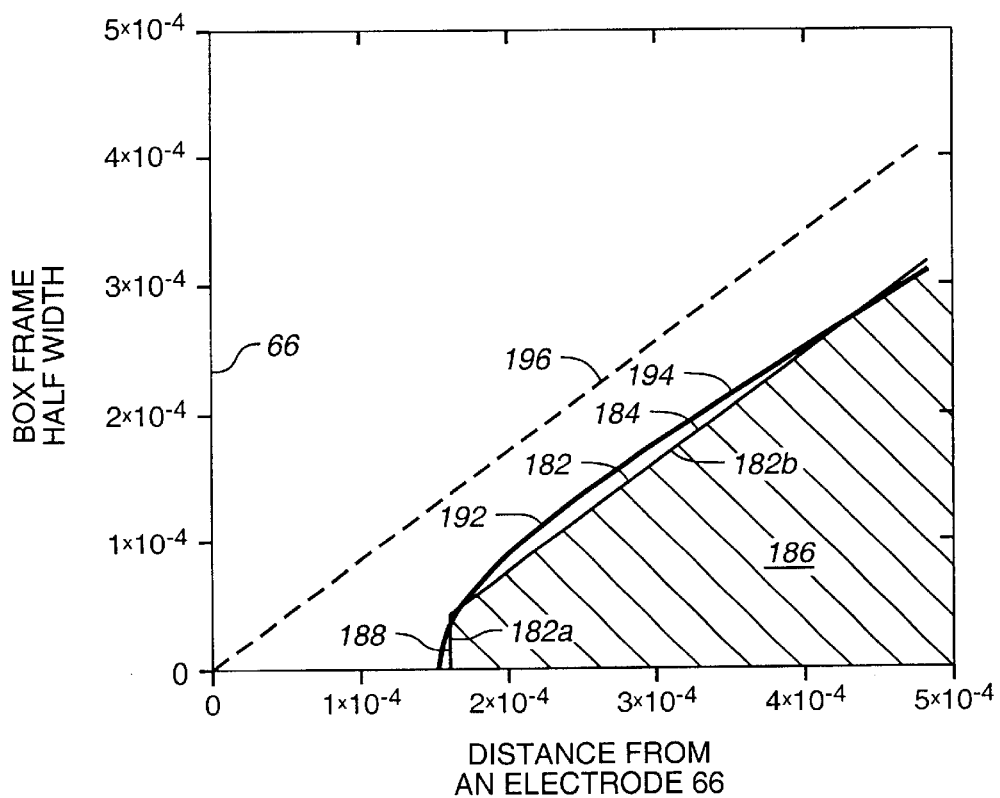
FIG._12a
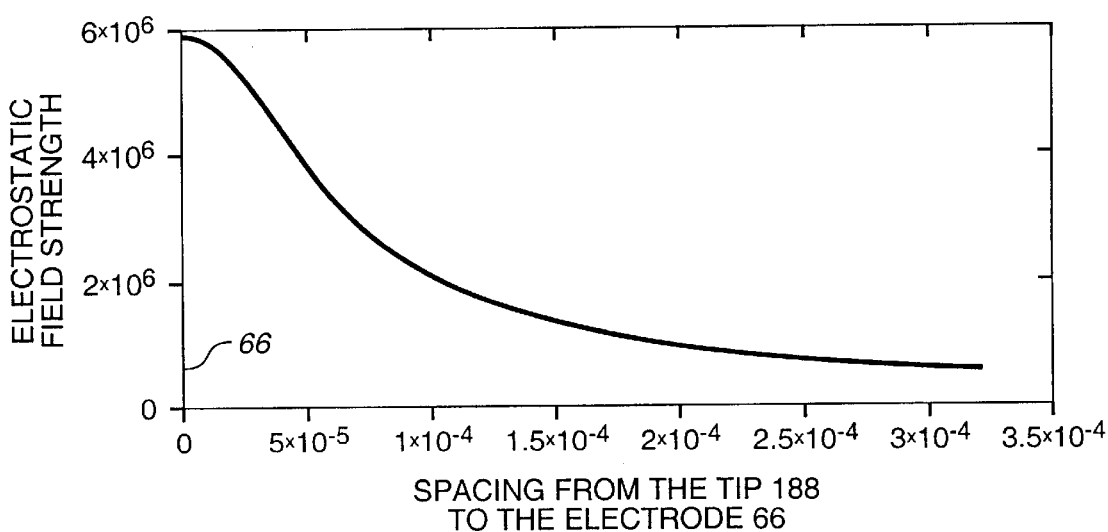
FIG._12b

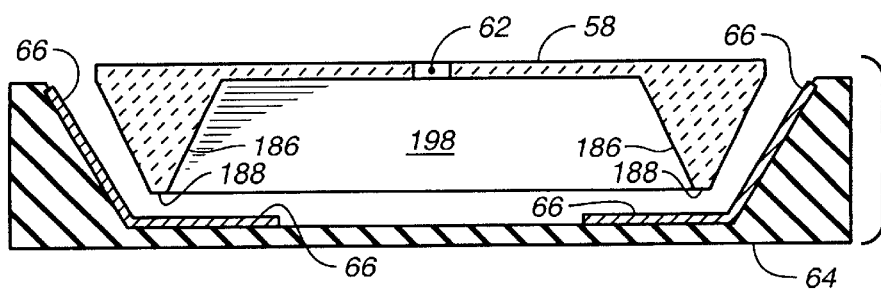
FIG._12c
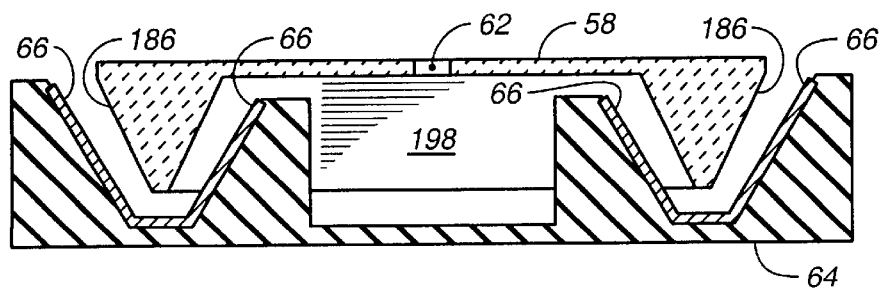
FIG._12d
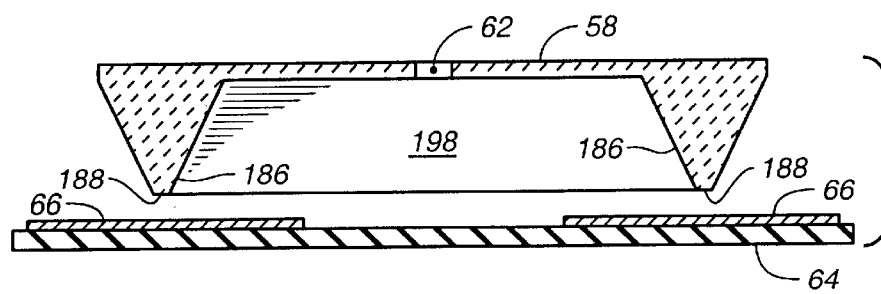
FIG._13a
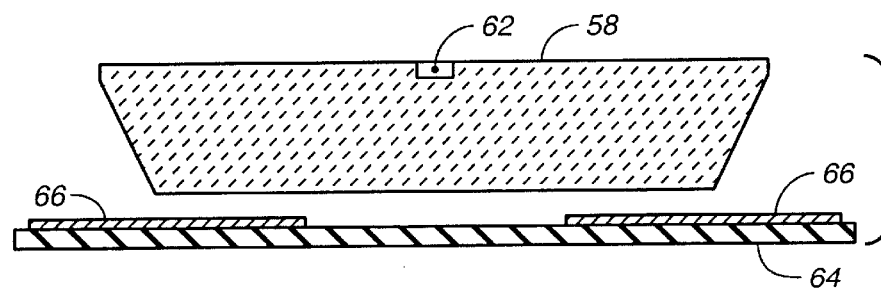
FIG._13b
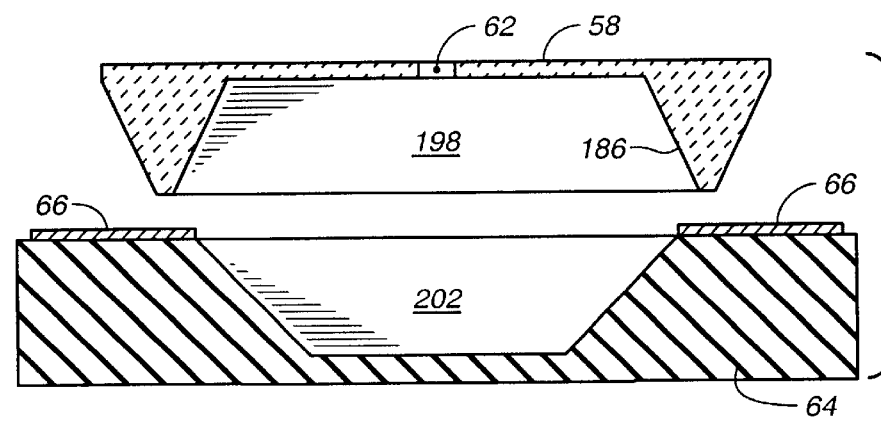
FIG._13c

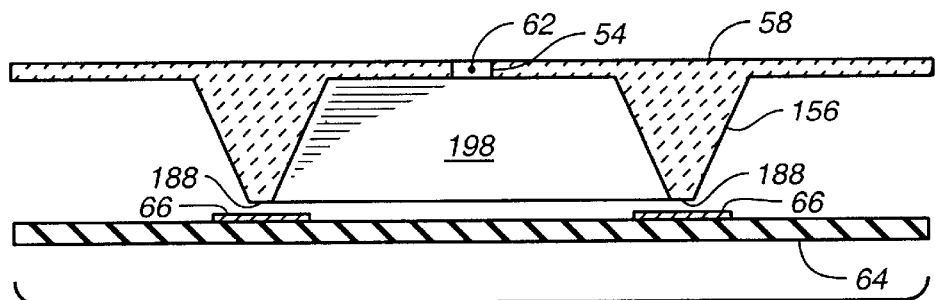
FIG._13d
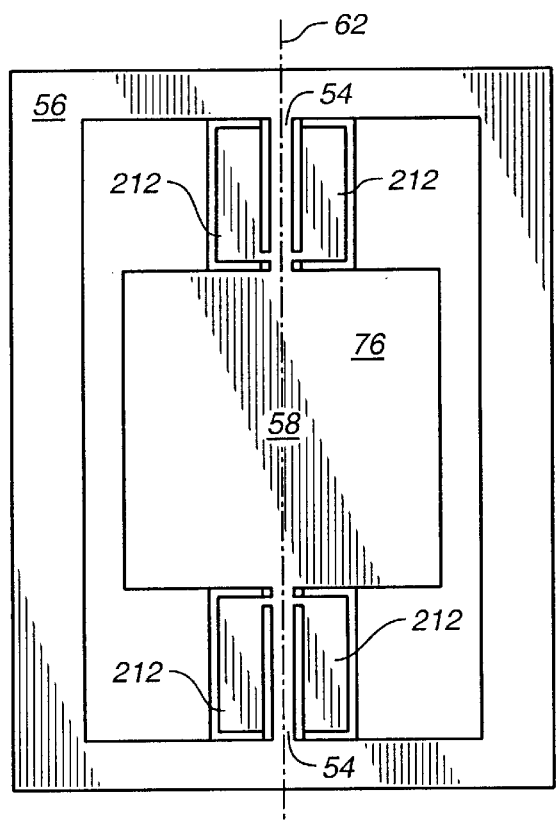
FIG._13e
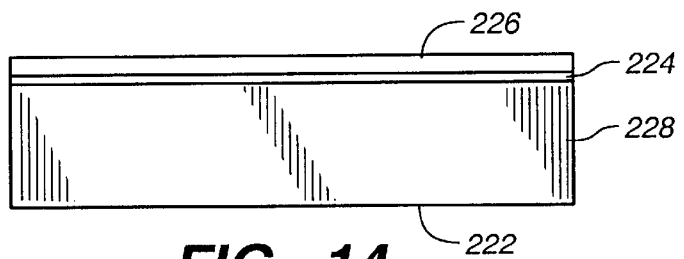
FIG._14

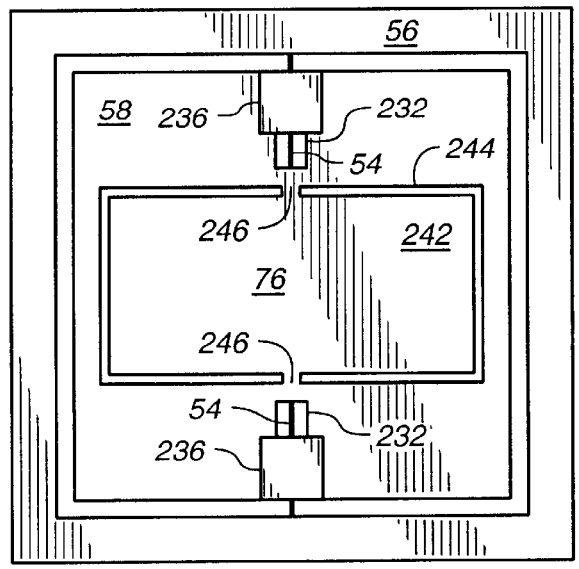
FIG._15a
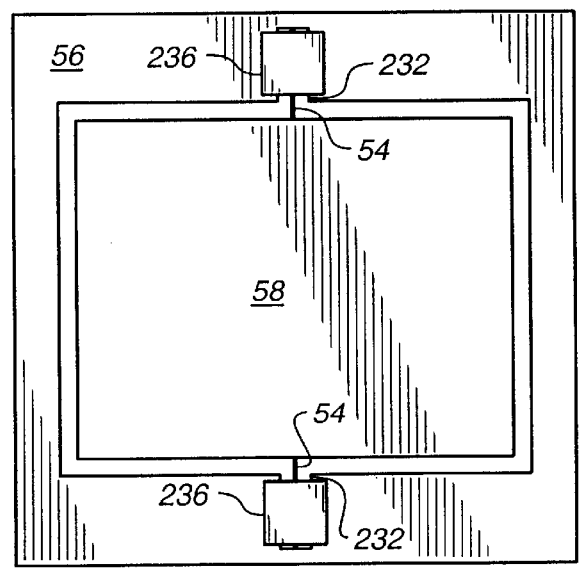
FIG._15b
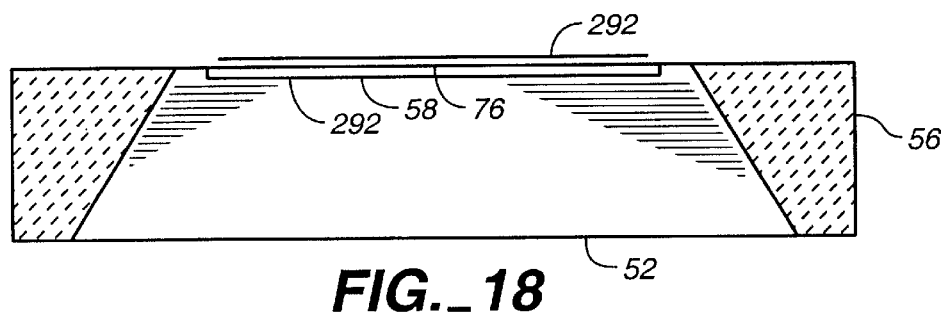
FIG._18

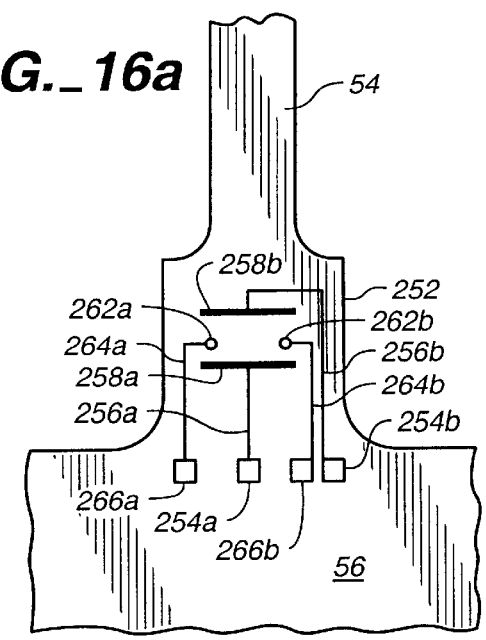
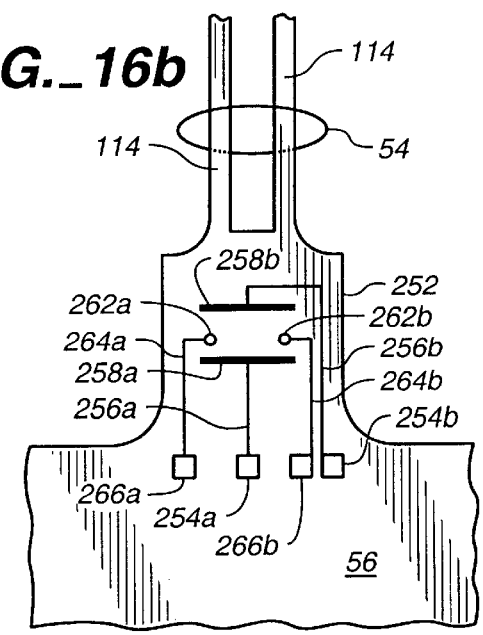
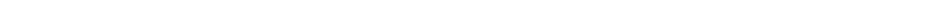
FIG._17a
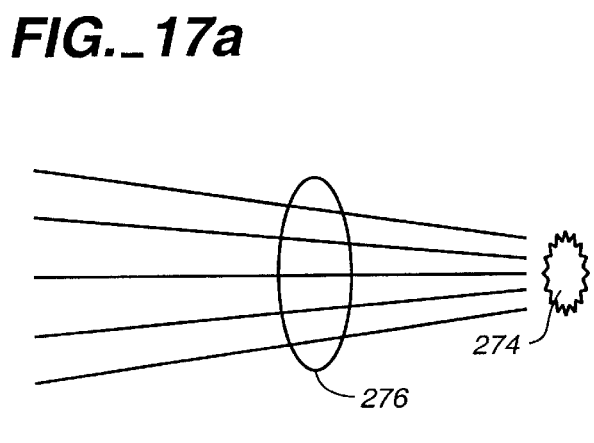
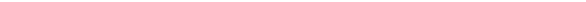
FIG._17b

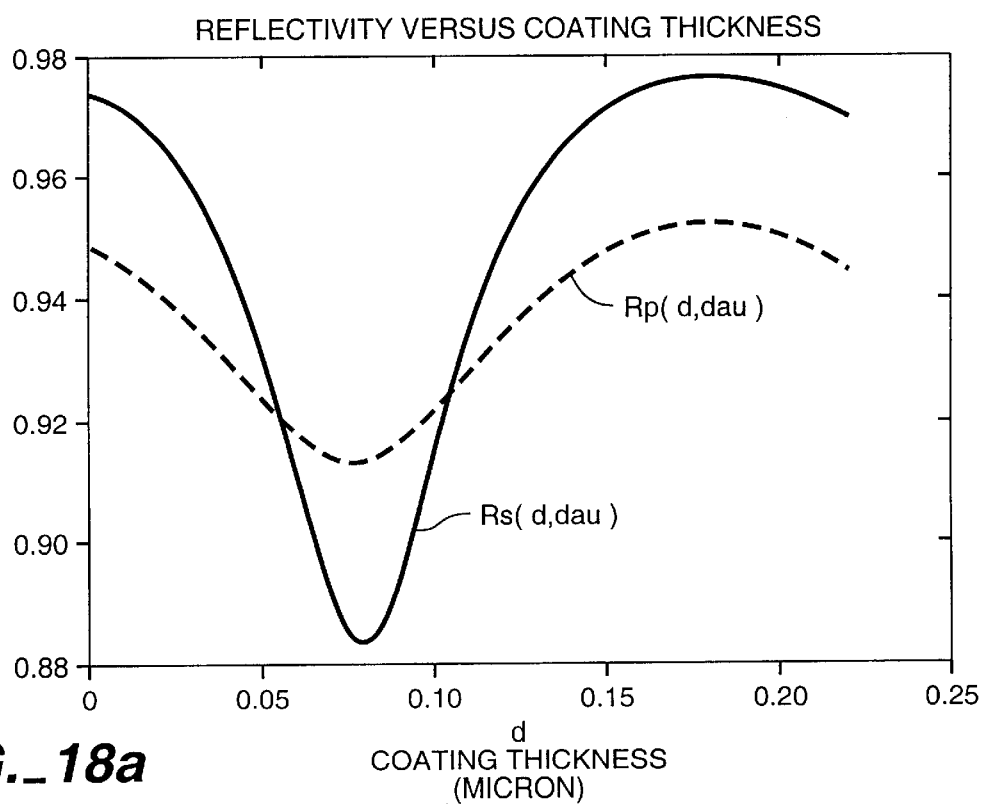
FIG._18a
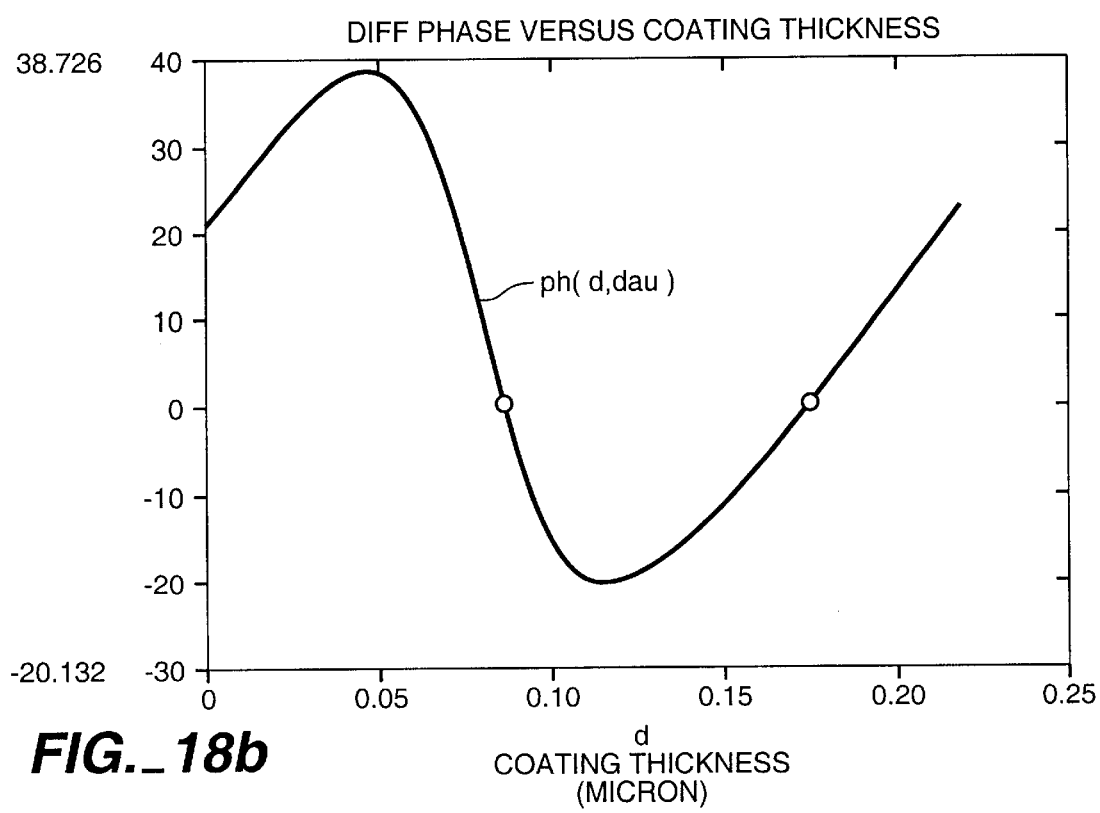
FIG._18b

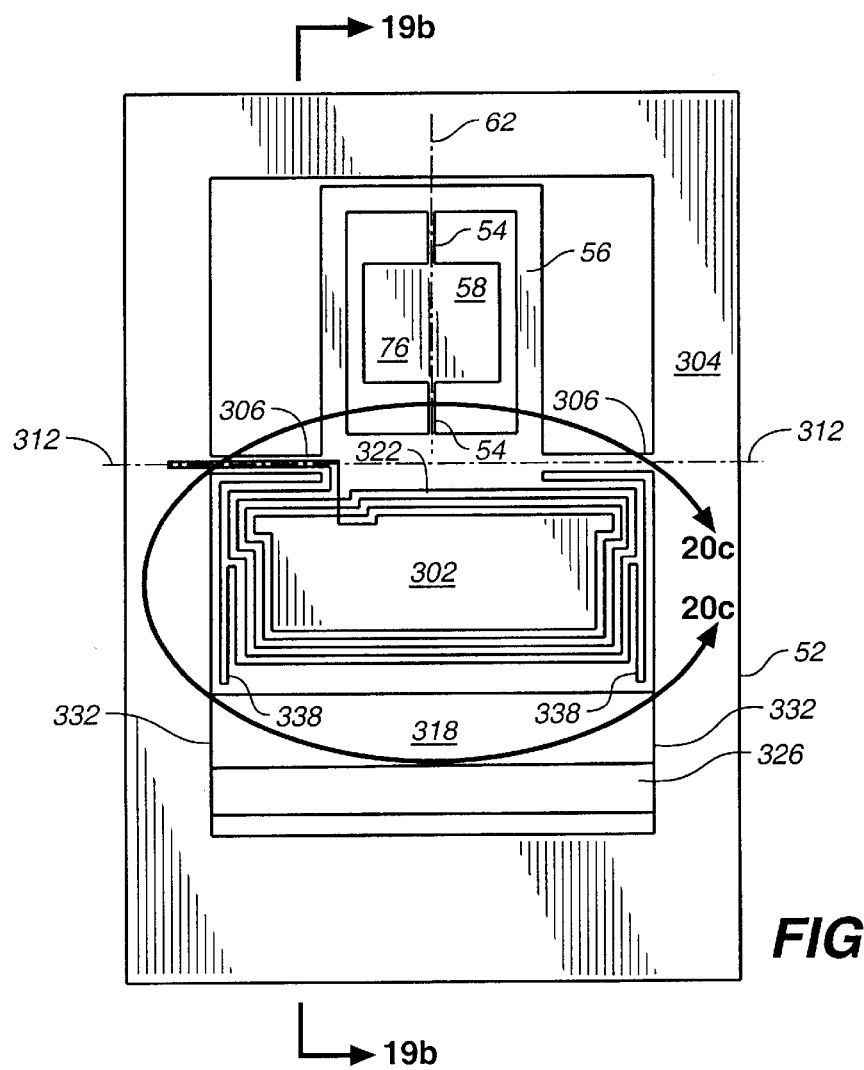
FIG._19a
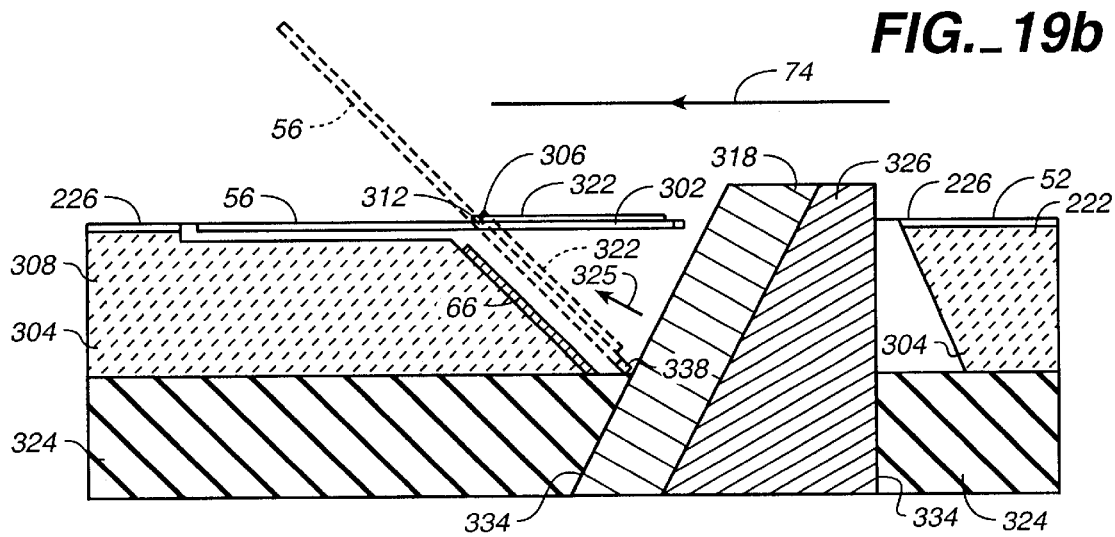
FIG._19b

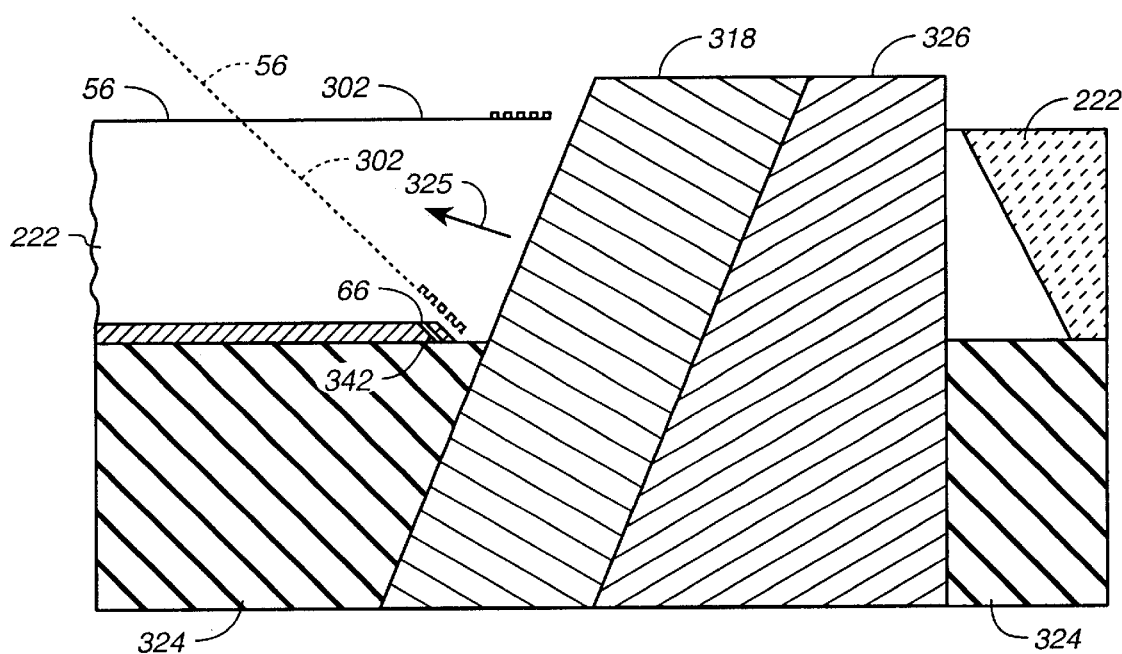
FIG._20a
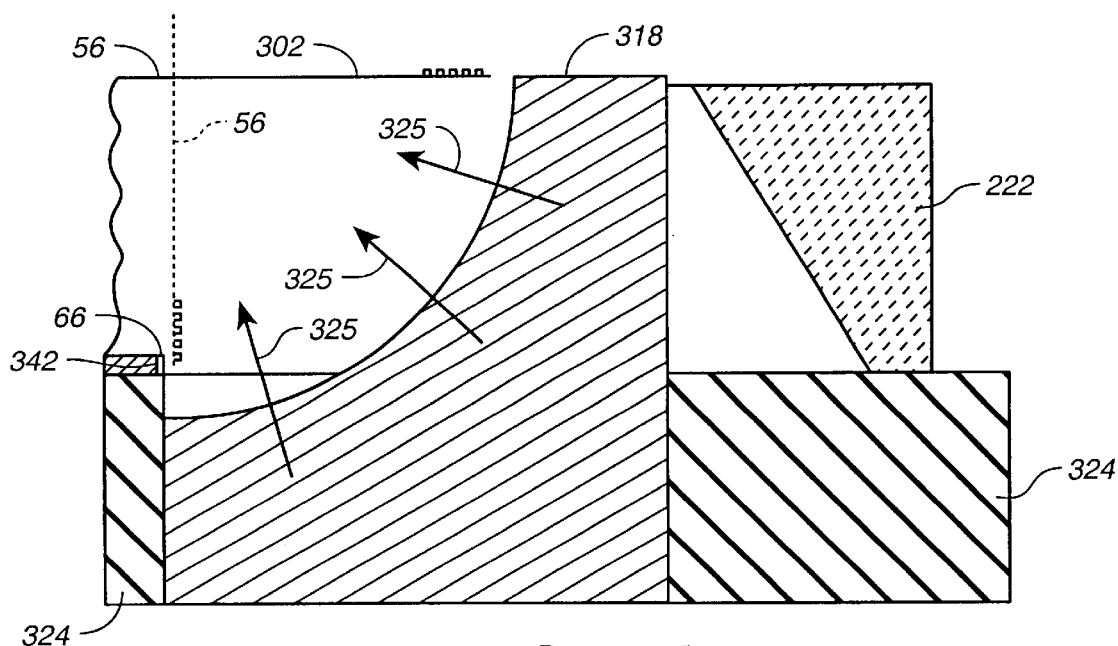
FIG._20b

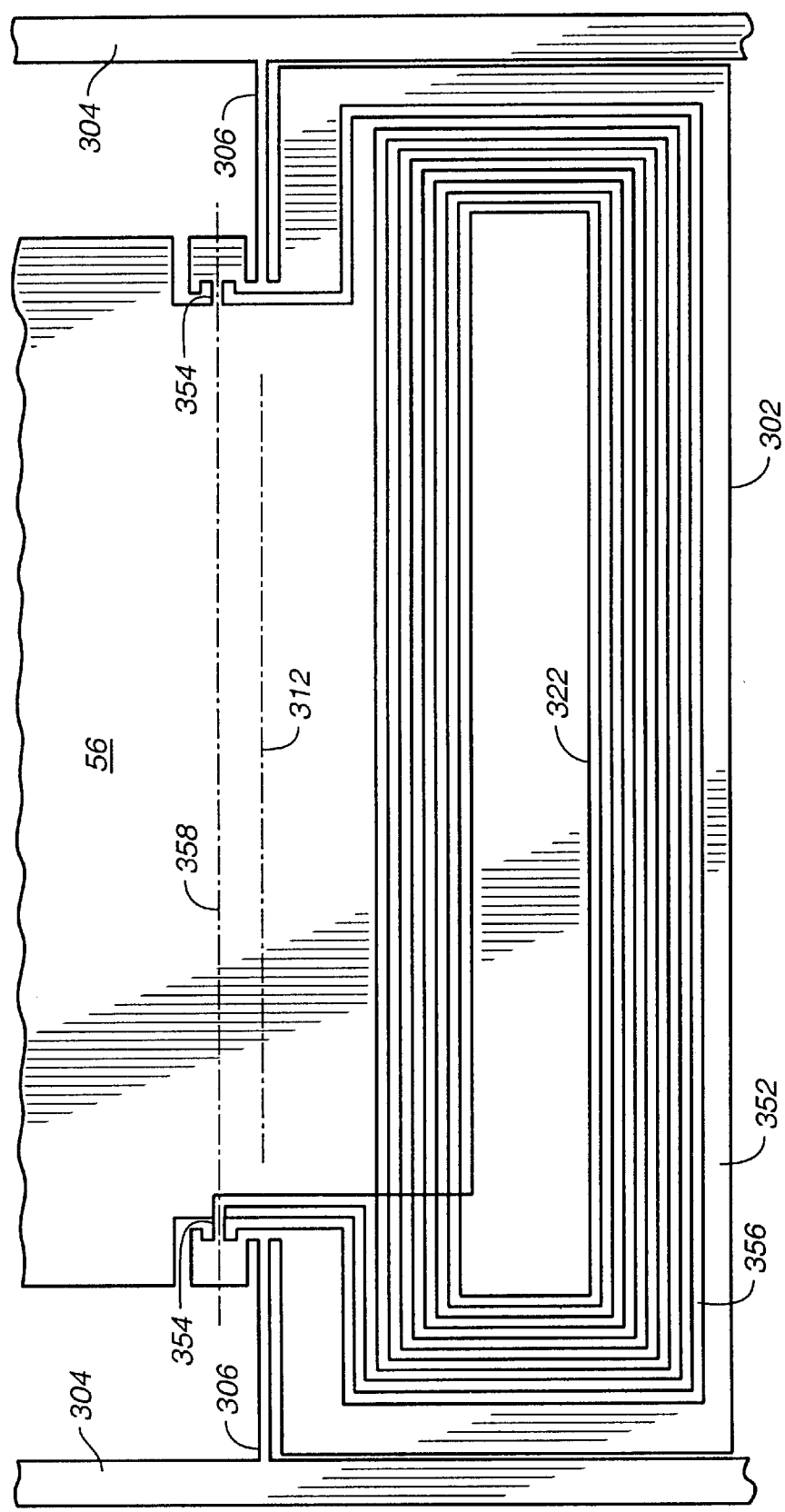
FIG._20c

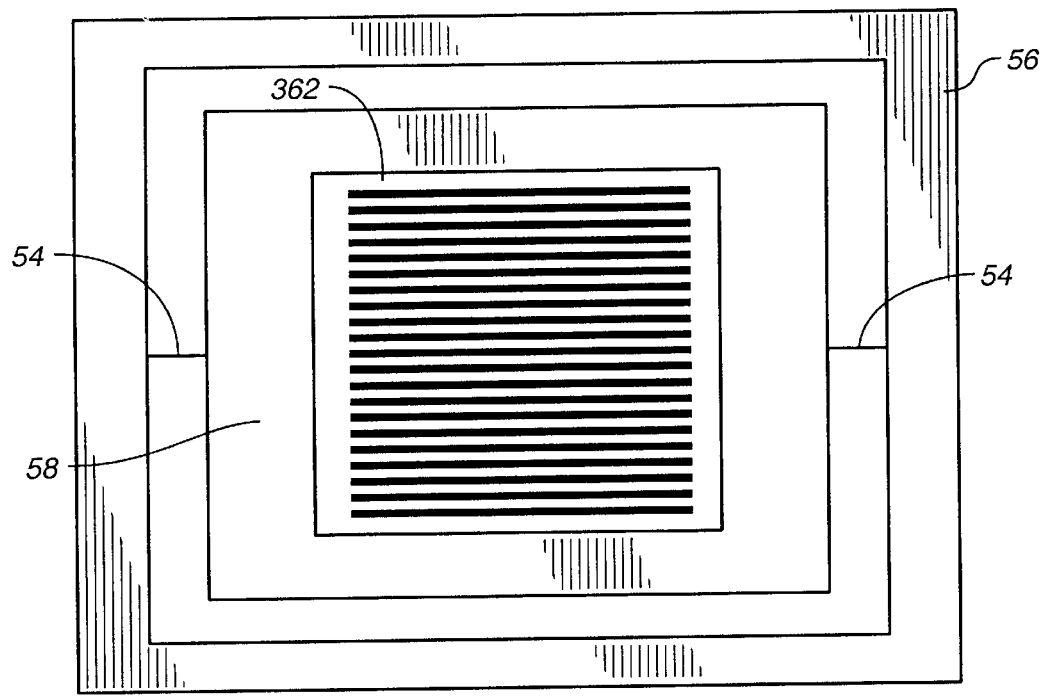
FIG._21
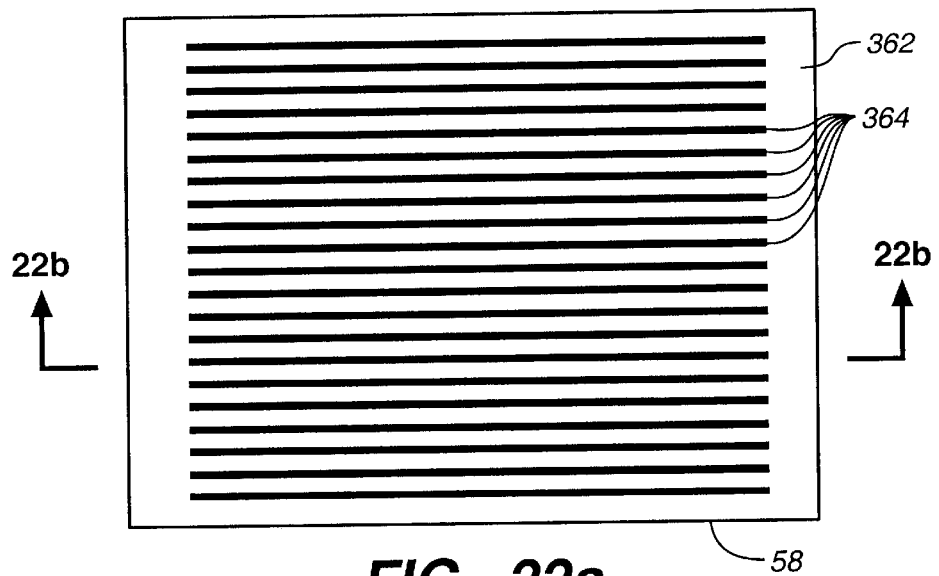
FIG._22a
FIG._22b

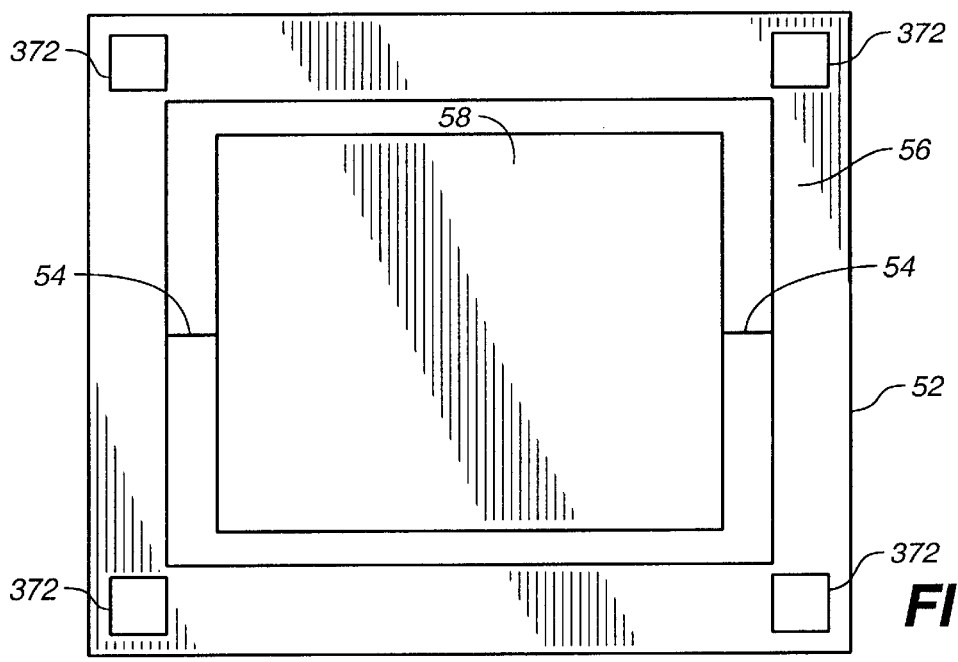
FIG._23
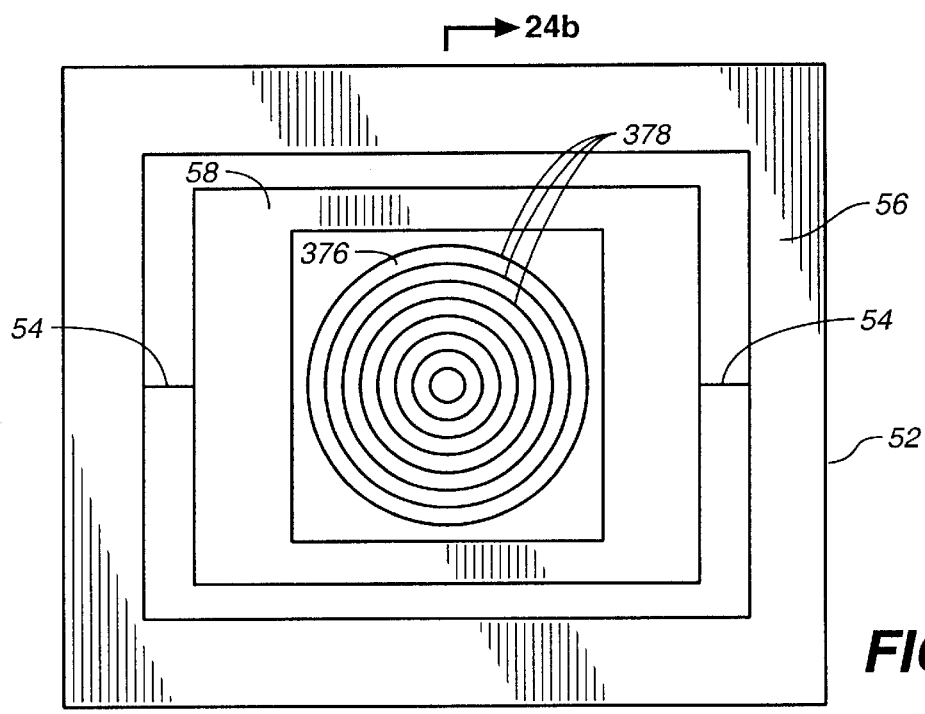
FIG._24a
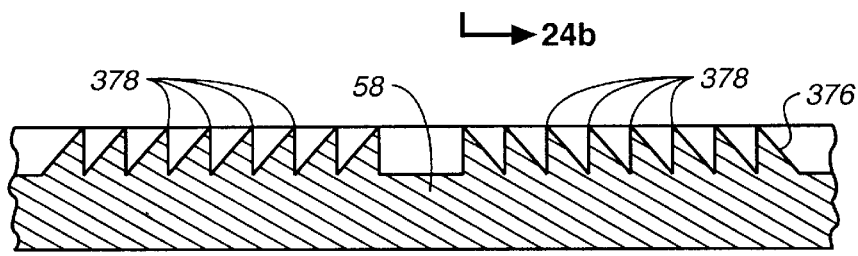
FIG._24b

MICROMACHINED MEMBERS COUPLED FOR RELATIVE ROTATION BY HINGES

This application claims the benefits of U.S. Provisional Patent Application No. 60/098,881 entitled "Improved Light Beamdeflectors" filed on Sep. 2, 1998, and of U.S. Provisional Patent Application No. 60/144,953 entitled "Arrangements For Large Fiber Optic N×N Fiber Switch" filed on Jul. 21, 1999.

BACKGROUND OF THE INVENTION

1. Field of the Invention

The invention relates generally to monolithically fabricated micromachined structures and, more particularly, to micromachined structures in which a first frame is coupled to a plate or to a second frame for rotation of the plate or second frame with respect to the first frame about an axis.

2. Description of the Prior Art

A fundamental micromachined structure having many diverse uses is a torsional oscillator formed by a first frame that is coupled to a plate or to a second frame by diametrically opposed torsion bars that extend between the first frame and the plate or second frame. The torsion bars permit rotation of the second frame or the plate with respect to the first frame about an axis established by the torsion bars. Practical uses for this basic micromachined structure include optical beam micromachined torsional scanners having a reflective surface, described in U.S. Pat. No. 5,629,790 ("the '790 patent"), that have uses in digital imaging, bar code reading and printing as described in U.S. Pat. No. 5,841,553 ("the '553 patent"), and in magneto-optical recording as described in Published Patent Cooperation Treaty ("PCT") International Patent Application WO 98/09289 entitled "Optical head Using Micro-Machined Elements" ("the '09289 PCT patent application"). Other practical applications for the basic micromachined structure occur in various other scientific and industrial systems such as rate gyroscopes described in U.S. Pat. No. 5,488,862, micro-flow meters described in U.S. Pat. No. 5,895,866, and profilometer and/or atomic force microscope ("AFM") heads described in U.S. Pat. No. 5,861,549 that are used in surface inspection systems.

Collectively, the preceding patents describe various techniques for applying electrostatic and electromagnetic forces to the plate and/or second frame to energize rotation about the axis established by the torsion bars. The usefulness of the basic micromachined structure is greatly enhanced by integrating a torsion sensor into at least one of the torsion bars as described in U.S. Pat. No. 5,648,618 ("the '618 patent") for measuring rotation of the second frame or the plate with respect to the first frame about an axis established by the torsion bars.

FIG. 1 illustrates a torsional oscillator, i.e. a typical torsional scanner, such as that described in '790 patent which is referred to by the general reference character 52. The torsional scanner 52 includes torsion bars 54 which extend inward from an encircling frame 56 to support a torsional scanner plate 58 and permit the plate 58 to rotate about an axis 62 established by the torsion bars 54. The frame 56 rests upon an insulating substrate 64 which also carries a pair of electrically conductive electrodes 66. A frame shaped spacer 68, resting on the frame 56, supports a membrane window 72 a short distance above the plate 58. A light beam 74, indicated by arrowed lines in FIG. 1, enters the torsional scanner 52 through the membrane window 72, impinges upon and reflects from a mirror surface 76 on the plate 58, and then exits the torsional scanner 52 through the membrane window 72. A voltage V applied alternatively between the plate 58 and first one and then the other of the electrodes 66 that switches back and forth between the electrodes 66 at the frequency of the principal torsional vibrational mode of the plate 58 applies an electrostatic force to the plate 58 which urges it to rotate back and forth at that frequency about the axis 62.

When using the basic micromachined structure for the optical beam torsional scanners 52, a mirror surface 76 on the plate 58 or second frame deflects the light beam 74, usually from a fixed light source, over an angle ranging from several degrees to tens of degrees. Such reflective torsional scanners 52 may be used for sweeping a beam of light back-and-forth at a frequency determined in part by a mechanical resonant frequency of the plate 58 or second frame. Alternatively, torsional scanners 52 may be used for moving or switching a point at which a beam of light impinges upon one or more other elements between two (2) or more alternative locations.

The '790 patent describes a critical mechanical vibrational mode spectrum which commercially practical torsional oscillators should possess. This mode spectrum is particularly desirable for sinusoidal oscillation of the torsional scanner 52 at video or even higher frequencies. The same mode spectrum is also advantageous when the torsional scanner 52 operates in a quasi-static mode such as when switching a point at which the light beam 74 impinges upon other elements. Operating in a quasi-static mode, the torsional scanner 52 rotates to and remains fixed in one orientation for some interval of time, and subsequently rotates swiftly through a relatively large angle to another orientation where it again remains fixed for some interval of time.

As illustrated in FIG. 2 of U.S. Pat. No. 5,673,139 ("the '139 patent"), for applications in which torsional scanners 52 must rotate about one or two axes and must be packed very closely together it is often desirable to eliminate open space between the frame 56 and the plate 58 or second frame occupied by the length of the torsion bars 54. This open space may be eliminated if the length of the torsion bars 54 is located within a "butterfly-shaped" frame as illustrated in the '139 patent, or within a butterfly-shaped plate 58. However, since torsion bars 54 tend to be very long and slender even the butterfly-shaped plate 58 or frame such as that illustrated in the '139 patent may occupy too much space. Merely shortening the torsion bars 54 to reduce the space which they occupy can be disadvantageous because, in general, shortening the torsion bars 54 make them stiffer which raises the frequency of the principal torsional vibrational mode, or alternatively increases the force that must be applied to rotate either the plate 58 or the second frame about the axis 62.

In many instances for various reasons energizing rotation of the plate 58 with low power electrostatic fields as described above is highly desirable. However, some applications for the torsional scanner 52 may require that the plate 58 rotate through large angles. Due to an electrostatic instability, using electrostatic force to energize rotation of the plate 58, or a second frame, either statically or dynamically without feeding a signal that is proportional to angular rotation back to the circuit that generates the electrostatic drive signals generally limits the rotation angle of the plate 58.

The electrostatic instability occurs because a restoring torque applied to the plate 58 by the torsion bars 54 increases linearly with rotation of the plate 58 while a driving torque generated by electrostatic attraction between the plate 58 and one of the electrodes 66 increases quadratically as the separation between them decreases. For sinusoidally oscillating electrostatically driven torsional scanners operating at the resonance frequency of their principal torsional vibrational mode, the electrostatic instability is of little concern because voltage applied between the electrodes 66 and the plate 58 is generally zero (0.0) when the plate 58 rotates nearest to the closest electrode 66. That is, for sinusoidally oscillating electrostatically driven torsional scanners operating at the resonance frequency of their principal torsional vibrational mode, rotation of the plate 58 is out of phase with, i.e. lags, application of the alternating voltage V between the plate 58 and first one and then the other of the electrodes 66. However, if for quasi-static operation a constant voltage V that exceeds some threshold value were applied across the plate 58 and one of the electrodes 66, rotation of the plate 58 about the axis 62 becomes unstable. That is, if the voltage V applied between the plate 58 and one of the electrodes 66 has a particular value and responsive to that voltage the plate 58 rotates to a particular angle, unless restrained mechanically the plate 58 will continue rotating to a position nearest to the electrode 66 without any change in the voltage V.

The curves in FIG. 2 graphically illustrate the phenomenon of electrostatic instability. The straight line 82 in FIG. 2, which slopes upward from left to right proportional to a torsional spring constant for the torsion bars 54, indicates the amount of restoring torque that the torsion bars 54 apply to the plate 58 upon its rotation about the axis 62 to various angular orientations. A family of driving torque curves 84a, 84b and 84c in FIG. 2 depict various driving torques applied to the plate 58 by increasingly higher fixed voltages Va, Vb and Vc between the plate 58 and the electrode 66 for various angles of rotation of the plate 58 about the axis 62. The electrostatic attractive driving torque for a particular voltage Va or Vb in relation to the restoring torque illustrated by the straight line 82 are in equilibrium where driving torque curves 84a and 84b respectively intersect the straight line 82 at points labeled Aa and Ab. The first intersection point Aa for the driving torque curve 84a is a point of stable equilibrium at which further rotation of the plate 58 produces a larger restoring torque than the increase in driving torque applied to the plate 58 electrostatically. A second intersection point Ba is a point of unstable equilibrium because any increase in the rotation angle of the plate 58 increases the electrostatic driving torque more rapidly than the restoring torque. Therefore, if for the voltage represented by the driving torque curve 84a the plate 58 rotates to the angle at which the straight line 82 and driving torque curve 84a intersect at Ba, then unless restrained mechanically the plate 58 will continue rotating to a position nearest to the electrode 66 without any change in the voltage V.

If the fixed voltage V increases, for example from the driving torque curve 84a to the driving torque curve 84b, the driving torque applied electrostatically increases and the two points of intersection move closer together to the points Ab and Bb. However, as the voltage V applied across the plate 58 and the electrodes 66 continues increasing eventually the curves for restoring torque and driving torque become tangent. When tangency occurs, a stable point of intersection no longer exists and application of a fixed voltage V of that magnitude causes the plate 58 to instantaneously flip and slam into the underlying electrode 66. This situation is illustrated by the driving torque curve 84c for which the two intersection points coincide at a single point AcBc.

Consequently, for the voltage V illustrated by the driving torque curve 84c the plate 58 is no longer statically stable without feeding back a signal that is proportional to angular rotation to the circuit that generates the electrostatic drive signals. Consequently, without angular rotation feedback quasistatic rotation of the plate 58 cannot be controlled for many desirable angular orientations of the plate 58.

Due to this electrostatic instability, electrostatically energized rotation of the plate 58 about the axis 62 is typically limited to approximately one-third (⅓) of the separation between the rest position of the plate 58 and the electrode 66. For a particular size of plate 58, obtaining an appreciable angle of rotation without feeding back an angular rotation signal to the electrostatic drive circuit requires increasing the spacing between the plate 58 and the electrodes 66. However, wider spacing between the plate 58 and the electrodes 66 requires applying a higher driving voltage V across the plate 58 and the electrode 66. However, the extent to which the voltage V applied between the plate 58 and the electrodes 66 may increase is limited because that voltage cannot exceed the breakdown voltage between them. Alternatively, increasing the torsional spring constant substantially in regions of FIG. 2 where the electrostatic instability occurs provides a stable equilibrium for larger angular rotations of the plate 58 about the axis 62 without increasing the spacing between the plate 58 and the electrodes 66.

The '09289 PCT patent application depicts and describes a torsional scanner 52 having a non-linear torsional spring constant. As illustrated in FIG. 3 hereof and in FIG. 3 of the '09289 PCT patent application, the torsional spring constant for the torsion bars 54 disclosed in the '09289 PCT patent application is rendered non-linear by attaching one or more tethers 86 to the plate 58. The tethers 86 consist of springs made of nitride or oxide that have corrugations oriented parallel with the axis 62 established by the torsion bars 54. As the plate 58 rotates about the axis 62, the tethers 86 initially increase the torsional spring constant of the torsion bars 54 only slightly. However as the plate 58 rotates further about the axis 62 the torque which the tethers 86 apply increases rapidly thereby creating a non-linear torsional spring constant for the torsional scanner 52 depicted in FIG. 3.

FIG. 3a illustrates a driving torque curve 92 for application of a fixed voltage V between the plate 58 and one of the electrodes 66 depicted in FIG. 3. A first straight line segment 94a in FIG. 3a illustrates a hypothetical restoring torque applied only by the torsion bars 54 upon initial rotation of the plate 58 about the axis 62 up to a critical angular orientation. A second straight line segment 94b in FIG. 3a illustrates the restoring torque that the torsion bars 54 together with the tethers 86 hypothetically apply upon rotation of the plate 58 about the axis 62 beyond the critical angular orientation. The differing slopes of the two line segments 94a and 94b in FIG. 3a depict a torsional spring constant that changes from k1 to k2 at the critical angular orientation due to the restraint which the tethers 86 apply to the plate 58. A low torsional spring constant k1 permits good initial rotation of the plate 58 about the axis 62. The change from the torsional spring constant k1 to the torsional spring constant k2 eliminates the electrostatic instability for larger angular rotations of the plate 58 about the axis 62. However, as those skilled in the art will recognize, in reality the tethers 86 do not actually produce the abrupt change from a flexible to a stiff torsional spring constant suggested by FIG. 3a.

Nevertheless, for the torsional scanner 52 depicted in FIG. 3, if the torsional spring constant of the torsion bars 54 is small in comparison with the effect of the tethers 86 on the spring constant, then rotation of the plate 58 may be dominated by the tethers 86. Moreover, if the tethers 86 do not restrain the plate 58 exactly symmetrically, they tend to bend it thus destroying its optical flatness. As noted in the '09289 PCT patent application, the torsional scanner 52 including the tethers 86 depicted in FIG. 3 permits stable rotation of the plate 58 about the axis 62 only up to angles of plus or minus two degrees ($\mp 2.0°$) because the tethers 86 produce an extreme non-linearity in the torsional spring constant.

The '790 patent discloses advantages that inclusion of a box frame reinforcing rim around the plate 58, or the second frame, provides for the torsional scanner 52. The box frame reinforcing rim thickens the plate 58, or the second frame, about their periphery while leaving the remainder of their structure thin. The box frame reinforcing rim maintains the plate 58 optically flat, and also provides differing thicknesses for the torsion bars 54 and the frame 56 thereby increasing the rigidity of the torsional scanner 52. In comparison with a solid plate 58 or second frame, reinforcing the plate 58, or the second frame, with a box frame also reduces the mass of the plate 58, or the second frame, while preserving its moment of inertia. A large moment of inertia increases the Q of the torsional scanner 52 as illustrated by the analysis of Buser, et al. (Sens. & Act., A23, 1990, pg. 323).

A major concern in fabricating reflective torsional scanners 52 is the reflectivity and planarity of the mirror surface 76 throughout a range of operating temperatures. Increasing the reflectivity of or controlling the polarization of light reflected from the plate 58 may also require depositing dielectric coatings over the mirror surface 76. Usually inorganic materials such as oxides, nitrides etc. deposited onto a metal coated mirror surface 76 yield the desired reflective properties. Because such inorganic material coatings must be at least 0.1 to 0.2 microns thick, the stress which they may apply to the plate 58 is a major concern, particularly since they must be deposited onto torsional scanners only a few microns thick.

For certain applications, torsional oscillators must dissipate a significant amount of heat from the plate 58. For example, if rotation of the plate 58 with respect to the frame 56 about the axis 62 is energized electro-magnetically using a coil attached to the plate 58, then the plate 58 must dissipate heat generated by an electric current flowing through the coil, i.e. must dissipate $i^2R$ heating. However, even if the plate 58 does not carry a coil because electrostatic force energizes rotation, reflecting a 100 milliwatt (mw) light beam 74 from a mirror surface 76 that is ninety-eight and one-half percent (98.5%) reflective, requires that the plate 58 must dissipate 1.5 mw of energy deposited there by the incident light beam 74. Absorption of 1.5 mw of energy into 1.0 mm$^2$ of silicon, a relatively low thermal conductivity material, may raise the temperature of the plate 58 by twenty (20.0) to thirty (30.0) °C. above the surrounding ambient temperature. The temperature of the plate 58 increases even more dramatically if the plate 58 has poor thermal conductivity to the remainder of the torsional scanner 52.

In many applications for torsional scanners 52 such as two dimensional ("2D") pointing or scanning, sometimes several electrical leads must pass from the frame 56 to the plate 58 via the torsion bar 54 that includes a torsion sensor such as that as described in the '618 patent. The locations for these numerous electrical leads can be severely constrained by the width of the torsion bar 54. Extremely narrow torsion bars 54 can also constrain placement of electrical leads and operation of a torsion sensor.

Various applications for reflective micromachined torsional scanners 52, such as fiber optic switching, envision using the torsional scanner 52 for optically aligning a beam of light using stationary or quasi-stationary positioning along at least one axis of a 2D raster. Another non-parallel axis of rotation for the plate 58 may provide either periodic motion (sinusoidal, linear), or static or quasi-statically positioning for the light beam. Such applications may result in effectively switching a beam of light on or off by flipping the mirror surface 76 into the light beam's path. Usually for such applications it is desirable to flip the plate 58 into the light beam as swiftly as practicable. Further-more, after the mirror surface 76 intersects the light beam 74, making small trimming adjustments in, i.e. tailoring, the angle at which the mirror surface 76 reflects the light beam may be advantageous or even required.

In fiber optic switching technologies, such compound motions of the plate 58 may provide tracking along one or two axes to keep a light beam on target. Such pointing applications may require that the light beam be deflected along at least one axis through a relatively large angle, and then held at a particular angle for an extended interval of time while dissipating a small amount of power in the torsional scanner 52. For such quasi-static pointing applications the plate 58 must be held stationary after rotating through a very large angle, e.g. 5° to 45°. Such large angular rotations are difficult to achieve electrostatically, because, as explained previously, large electrostatically energized rotations of the plate 58 inherently require a very large spacing between the plate 58 and the electrodes 66. Such large angular rotations are also difficult to achieve electro-magnetically because the magnetic field generated by a coil carried on the plate 58 becomes reoriented with respect to an external unidirectional magnetic field as the plate 58 rotates about the axis 62. Consequently, electro-magnetically energized quasi-static rotation of the plate 58 through large angles normally requires that the coil carry very large electrical current while holding the plate 58 at a fixed angular rotation. As described above, such a large electrical current significantly raises the temperature of the plate 58.

For some applications of torsional oscillator, as disclosed in the '139 and '790 patents it is advantageous to include one or more light detecting elements, usually as photo-diodes, in the torsional scanner 52, perhaps locating them on the plate 58. As described in U.S. Pat. No. 5,416,324 ("the '324 patent"), including a polarized light detector is particularly advantageous for some image processing applications. Similarly, some application for torsional oscillators will likely require detecting Faraday rotation of a planar polarized light for sensing the presence or absence of magnetically recorded data. The '324 patent discloses a two dimensional ("2D") ensemble of receiver assemblies. Each of the receiver assemblies includes four (4) light detectors each of which responds to light polarized in a different orientation. The '324 patent discloses that such polarizers may be formed by wire grids disposed immediately adjacent to the light detector, or at an appropriate location in the optical system. The cost of the imaging system disclosed in the '324 patent could be significantly reduced if it were possible to reduce the ensemble of receiver assemblies to a single receiver assembly.

The '790, '553, '618, '139 and '324 patents, and the '09289 PCT patent application are hereby incorporated by reference.

SUMMARY OF THE INVENTION

An object of the present invention is to provide improved structures for micromachined members coupled for relative rotation by torsional flexure hinges.

Another object of the present invention is to improve operating characteristics of micromachined members coupled for relative rotation by torsional flexure hinges.

Another object of the present invention is to provide torsional flexure hinges for micromachined members coupled for relative rotation that are more compact than conventional, unfolded torsion bars.

Another object of the present invention is to provide torsional flexure hinges for micromachined members coupled for relative rotation which exhibit increased separation between a frequency of a member's principal torsional vibrational mode and frequencies of that member's other vibrational modes.

Another object of the present invention is to provide structures for micromachined members coupled for relative rotation by torsional flexure hinges for which torque required to rotate a member about an axis established by the torsional flexure hinges increases non-linearly with increasing angular rotation of the micromachined members.

Another object of the present invention is to provide an electrostatic drive circuit for applying a drive signal that urges micromachined members coupled for relative rotation by torsional flexure hinges to rotate about an axis established by the torsional flexure hinges which changes non-linearly with angular deflection of the micromachined members.

Another object of the present invention is to decrease the electrostatic potential required for rotating micromachined members coupled for relative rotation by torsional flexure hinges.

Another object of the present invention is to provide structures for micromachined members coupled for relative rotation by torsional flexure hinges having enhanced thermal conductivity.

Another object of the present invention is to ruggedize torsional flexure hinges that couple micromachined members for relative rotation which include a torsion sensor.

Another object of the present invention is to provide a method for enhancing optical reflectivity of micromachined members which does not alter the micromachined member's flatness.

Another object of the present invention is to provide structures for optically reflective micromachined members which permit tailoring reflective characteristics of a mirror surface.

Another object of the present invention is to provide a micromachined member which includes a polarization-sensitive scanned photo-detector.

Another object of the present invention is to provide structures for micromachined members coupled for relative rotation by torsional flexure hinges together with an electronic drive therefor that urges members to rotate about an axis established by the torsional flexure hinges swiftly and then immediately fixes the micromachined member at a specified angular rotation.

Another object of the present invention is to provide structures for micromachined members coupled for relative rotation by torsional flexure hinges together with a lower power consumption electronic drive therefor that urges members to rotate about an axis of the torsional flexure hinges swiftly and then immediately fixes the micromachined member in a specified angular orientation.

Another object of the present invention is to provide structures for micromachined members coupled for relative rotation by torsional flexure hinges together with a lower power consumption electronic drive therefor that permits trimming the orientation of a member after that member has been rotated through a specified angle and been fixed at that orientation.

Briefly, the present invention includes an improved integrated, micromachined structure that has a reference member, a pair of diametrically opposed torsional flexure hinges projecting from the reference member, and a dynamic member supported by the pair of torsional flexure hinges from the reference member. The torsional flexure hinges support the dynamic member from the reference member for rotation about an axis established by the pair of torsional flexure hinges. As used herein, the phrase torsional flexure hinge, when applied most broadly, encompasses a conventional unfolded torsion bar, and also encompasses hinge structures in which one or more hinge segments included in that structure do not experience pure torsion when the dynamic member rotates about the axis established by the torsional flexure hinges. The reference member, the pair of torsional flexure hinges and the dynamic member are all monolithically fabricated using a stress-free semiconductor layer of a silicon substrate. The integrated micromachined structure also includes drive means for imparting rotary motion to the dynamic member about the axis established by the pair of torsional flexure hinges. The drive means may apply torque electrostatically or electro-magnetically to the dynamic member, either singly or in combination.

The improved micromachined structure in one embodiment forms at least one of the torsional flexure hinges by coupling together first ends of at least three torsion-bar segments. The first end of each torsion-bar segment is located along the multi-segment torsional flexure hinge between the reference member and the dynamic member. In another embodiment, the improved micromachined structure forms at least one of the torsional flexure hinges by disposing a bifilar beam between the reference member and the dynamic member. The bifilar beam is disposed symmetrically on opposite sides of the axis for rotation of the dynamic member established by the pair of torsional flexure hinges.

Another embodiment of the improved micromachined structure that enhances electrostatic stability includes an appendage having a first end that attaches to one of the torsional flexure hinges at a point along the torsional flexure hinge that is located between the reference member and the dynamic member. The appendage projects outward from the torsional flexure hinge and is shaped so that upon sufficient rotation of the dynamic member about the axis with respect to the reference member a projecting end of the appendage contacts a stop having a fixed relationship with the reference member. When the projecting end of the appendage contacts the stop the torsional spring constant of the torsional flexure hinge changes. In another embodiment the improved micromachined structure includes a tether that is coupled at a first end to the reference member and at a second end to one of the torsional flexure hinges at a point along the torsional flexure hinge that is located between the reference member and the dynamic member. Upon sufficient rotation of the dynamic member about the axis with respect to the reference member the tether changes the torsional spring constant of the torsional flexure hinge. In yet another electrostatically energized embodiment, the improved micromachined structure includes a torsion sensor that is adapted for producing a signal responsive to angular rotation of the dynamic member about the axis with respect to the reference member. The signal produced by the torsion sensor is fed back to the drive means for altering the drive signal which electrostatically energizes rotation of the dynamic member.

An improved torsional oscillator increases torque applied electrostatically between an electrode and a dynamic member that includes a reinforcing rim by sharpening a tip of the reinforcing rim immediately adjacent to the electrode which enhances the electric field between them. In another improved torsional oscillator, to enhance the Q of the torsional oscillator a hollow first cavity in the dynamic member, that is encircled by the reinforcing rim, is disposed adjacent to a hollow second cavity that is formed in a substrate and which opens toward the first cavity formed into the dynamic member. In another improved torsional scanner either the reference member or the dynamic member includes a slot formed therein that is disposed alongside one of the torsional flexure hinges. Damping material disposed across the slot and contacting the adjacent torsional flexure hinge near the reference member reduces the torsional oscillator's Q. Yet another improved torsional oscillator adds auxiliary driving-plates along opposite sides of the torsional flexure hinges between the dynamic member and the reference member. The auxiliary driving-plates are coupled to the torsional flexure hinge adjacent to the dynamic member and have a combined width perpendicular to the rotation axis which is less than a width of the dynamic member perpendicular thereto. In this improved torsional oscillator, the drive means applies an electrostatic drive signal between the auxiliary driving-plates and to electrodes disposed adjacent thereto.

In another improved torsional oscillator, the torsional flexure hinges have a width-to-thickness (w:t) ratio that exceeds four-to-one (4:1) to increase thermal conductivity between the dynamic member and the reference member in comparison with narrower and thinner torsional flexure hinges having an equivalent torsional spring constant. Further increasing the width-to-length (w:l) ratio of the torsional flexure hinges to greater than one-to-two (1:2) provides a non-linear torsional spring constant that improves electrostatic stability. Another improved torsional oscillator improves thermal conductivity between the dynamic member and the reference member by fabricating them from isotopically pure $14Si^{28}$ silicon.

In another improved torsional oscillator the dynamic member includes a stress relief cut that almost completely encircles a decoupled portion of the dynamic member. The stress relief cut establishes beams for supporting that decoupled portion of the dynamic member from a surrounding portion thereof whereby stress is decoupled between the decoupled portion and the surrounding portion. In another improved torsional scanner both front and back sides of the dynamic member have a reflective mirror coating applied thereto to balance any stress applied to the dynamic member. In another improved torsional oscillator at least one of the torsional flexure hinges includes a widened section having a torsion sensor disposed there which produces a signal responsive to angular rotation of the dynamic member about the axis with respect to the reference member.

In another improved torsional scanner adapted for switching a light beam the drive means initially energizes rotation of the dynamic member about the axis electro-magnetically with a current pulse. The current pulse impulsively starts the dynamic member rotating about the axis established by the torsional flexure hinges. After the dynamic member rotates near to a pre-established orientation, the drive means holds the dynamic member in the pre-established orientation with an electrostatic force.

In another improved torsional oscillator the dynamic member carries a wire grid polarizer disposed adjacent to a photo-detector so that illumination incident on the photo-detector must traverse the wire grid polarizer before impinging upon the photo-detector.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a cross-sectional elevational view illustrating a prior art torsional oscillator in the form of a torsional scanner as described in the '790 patent adapted for applying a torque electrostatically for rotating a mirror plate about a rotation axis established by supporting torsion bars;

FIG. 2 is a graph which illustrates the electrostatic driving torque and the torsion bar restoring torque as a function of plate rotation angle for a torsional oscillator, such as that depicted in FIG. 1, in which the torsion bars have a fixed torsional spring constant;

FIG. 3 is a perspective diagram of a prior art torsional scanner that reproduces FIG. 3 of the '09289 PCT patent application;

FIG. 3a is a graph which illustrates the electrostatic driving torque and the restoring torque as functions of plate rotation angle for a torsional oscillator, such as that depicted in FIG. 3, in which the torsion bars exhibit a varying torsional spring constant;

FIGS. 4a and 4b are plan views depicting folded torsional flexure hinges having a torsion sensor integrated therein which are more compact and which exhibit a vibrational mode spectrum which is improved in comparison with those exhibited by a conventional, unfolded torsion bar;

FIG. 5a is a graph illustrating the torsional spring constant of a beam for varying width to thickness ratios;

FIG. 5b is a plan view of a unfolded, bifilar torsion bar which employs the torsional spring constant depicted in FIG. 5a advantageously to obtain improved vibrational mode spectrum characteristics;

FIG. 6a is a plan view illustrating a conventional, unfolded torsion bar;

FIG. 6b is a plan view illustrating a torsional flexure hinge which exhibits improved characteristics by including torsion bar segments having various width to thickness ratios both larger and smaller than one (1:1) that are selected to optimize the torsional flexure hinge's performance;

FIGS. 7a and 7b are plan views illustrating how big-filar torsional flexure hinges which rely mostly on bending provide very flexible rotation for the plate;

FIG. 7c is a plan view of a trifilar torsional flexure hinge which combines the bifilar torsional flexure hinge depicted in FIG. 7a with the conventional, unfolded torsion bar depicted in FIG. 6a;

FIGS. 8a and 8b are respectively plan and cross-sectional elevational views that illustrate using free-moving appendages attached to the torsion bars together with stops for changing the torsional spring constant abruptly thereby increasing the electrostatic stability of the torsional oscillator;

FIG. 8c is a graph, similar to those of FIGS. 2 and 3a which illustrates the electrostatic driving torque and the torsion bar restoring torque as functions of plate rotation angle for a torsional oscillator such as that depicted in FIGS. 8a and 8b that includes appendages a multi-segmented torsional spring constant;

FIGS. 9a and 9b are respectively plan and cross-sectional elevational views that illustrate using tethers for coupling the torsion bars to the frame for changing the torsional spring constant abruptly thereby increasing the electrostatic stability of the torsional oscillator;

FIG. 9c is a plan view depicting in greater detail a corrugated compression spring that may be included in the tethers depicted in FIGS. 9a and 9b;

FIG. 9d is a cross-sectional view of the spring depicted in FIG. 9c illustrating stops that may be included in the corrugations;

FIG. 10 and 10a are diagram depicting cross-sectional elevational view illustrating a torsional scanner and timing diagrams illustrating electrostatic, quasi-static drive signals applied respectively to electrodes included in the torsional scanner;

FIG. 10b is a block diagram depicting a circuit for generating electrostatic driving signals responsive to a signal received from a torsion sensor that improves electrostatic stability by compensating quasi-static driving signals for rotation of the plate about the axis with respect to the frame;

FIG. 10c illustrates timing diagrams, similar to those depicted in FIG. 10b, for electrostatic, quasi-static drive signals such as the circuit illustrated in FIG. 10b generates for application respectively to electrodes of the torsional scanner depicted in FIG. 10a;

FIG. 11 is a graph, similar to those of FIGS. 2, 3a and 8c, which illustrates the electrostatic driving torque and the torsion bar restoring torque as functions of plate rotation angle for a torsional oscillator, such as that depicted in FIG. 1, when rotation of the plate is energized electrostatically by driving signals produced by the circuit depicted in FIG. 7;

FIG. 12a is a graph which illustrated one-half of the surface and cross-section of a box frame reinforcing rim frequently incorporated into a plate or frame of a torsional oscillator, and which also illustrates a portion of an elliptical cylinder the surface of which approximates the surface of the box frame reinforcing rim;

FIG. 12b is a graph illustrating a magnitude for a horizontal (X-axis) component of electrostatic field between the box frame and an adjacent electrode, illustrated in FIG. 12a, for increasing distance along the box frame's surface from the electrode;

FIGS. 12c and 12d are cross-sectional views illustrating electrode configurations which may be used to further enhance the electrostatic attraction exhibited by a torsional oscillator that includes a box frame having sharpened tips;

FIGS. 13a and 13b are cross-sectional views illustrating a geometry for a plate having a box frame which reduces squeeze film damping of plate rotation;

FIG. 13c is a cross-sectional view illustrating how squeeze film damping of plate rotation may be further reduced;

FIG. 13d is a cross-sectional view illustrating a torsional oscillator with a reduced box frame and overhanging mirror surface that permits reduced driving voltage;

FIG. 13e is a plan view illustrating driving plates integrated along longitudinal edges of the torsion bars which permits using lower driving voltage;

FIG. 14 is an elevational view illustrating a preferred type of silicon wafer substrate used in fabricating torsional oscillators, particularly torsional scanners;

FIGS. 15a and 15b are plan views illustrating butterfly-shaped configurations for plates and frames of micromachined, silicon torsional scanners that are adapted for damping their high Q;

FIGS. 16a and 16b are plan views illustrating torsion bars having a widened section to provide additional surface area on the torsion bar for a torsion sensor;

FIGS. 17a and 17b are perspective views illustrating different arrangements for vacuum depositing a metallic mirror surface onto a silicon wafer substrate;

FIG. 18 is a cross-sectional view of a torsional scanner in which the mirror surface of the plate has been conformally coated with parylene to provide a nearly stress free layer which improves optical performance without bending the plate;

FIGS. 18a and 18b respectively illustrated performance enhancements that may be obtained by overcoating a mirror surface with a selected thickness of parylene;

FIGS. 19a and 19b respectively are plan and cross-sectional elevational views of torsional scanner adapted for light beam switching applications that includes both clamping and adjustment mechanisms which uses both electrostatic and electromagnetic actuation;

FIGS. 20a and 20b are cross-sectional elevational views, similar to the view of FIG. 19b, that illustrate alternative embodiments of the torsional scanner clamping and adjustment mechanisms;

FIG. 20c is a plan view of an adjustment mechanism adapted for use with the torsional scanner illustrated in FIGS. 19a and 19b taken along the line 20c—20c in FIG. 19a;

FIG. 21 is a plan view of a torsional oscillator that carries a wire grid polarized-light photo-detector on the plate;

FIG. 22a is a plan view of the wire grid polarized-light photo-detector illustrated in FIG. 21;

FIG. 22b is a cross-sectional view of the wire grid polarized-light photo-detector taken along the line 22b—22b in FIG. 21a;

FIG. 23 is a plan view of a torsional oscillator having photo-detectors located in the reference member, i.e. the frame;

FIG. 24a is a plan view of a torsional oscillator that carries a Fresnel lens formed into the dynamic member, i.e. the plate; and FIG. 24b is a partial cross-sectional view of the Fresnel lens carried on the dynamic member taken along the line 24b—24b in FIG. 24a.

DETAILED DESCRIPTION

Smaller and Better Performing Torsional Oscillators 52

As described in the '790 patent, the plate 58 of torsional oscillators, such as the torsional scanner 52, exhibit a plurality of vibrational modes. Those vibrational modes include a principal torsional vibrational mode about the axis 62, a vertical shaking vibrational mode, a vertical rocking vibrational mode, a lateral shaking vibrational mode, and a lateral rocking vibrational mode. Each of these vibrational modes of the plate 58 has a vibrational frequency which is determined by the physical characteristics of the torsional scanner 52. As disclosed in the '790 patent, operation of the torsional scanner 52 is significantly enhanced if the vibrational frequency of the principal torsional vibrational mode is lower by at least 20% than the vibrational frequency of any other vibrational mode of the plate 58. As described in greater detail below, the separation between the vibrational frequencies of the various vibrational modes of the plate 58 may be improved with a smaller frame 56 and plate 58 if hinges supporting the plate 58 are made by coupling together ends of at least three (3) hinge segments with the coupled ends being located along the hinge between the torsion bar 54 and the plate 58. For some applications, folded hinges formed in this way often exhibit a mode spectrum which is substantially better than that of torsion bars 54 having a conventional, unfolded shape because the frequencies of the vertical and lateral vibration modes of the folded torsion bar 54 are spaced further from the frequency of the principal torsional vibrational mode.

As depicted in FIG. 4a, in one embodiment a T-shaped folded torsional flexure hinge 96 for supporting the plate 58 from the frame 56 is made up of three (3) basic hinge-segments 102a, 102b and 102c. Each of the basid hinge-segments 102 has a longitudinal axis 98 which is not oriented perpendicular to the axis 62. For the centrally located basic hinge-segment 102b, the longitudinal axis 98 is colinear with the axis 62. An intermediate region 104 of the folded torsional flexure hinge 96 couples together immediately adjacent ends 106 of the basic hinge-segments 102a, 102b and 102c. In comparison with the basic hinge-segments 102a, 102b and 102c, both the frame 56, the plate 58, and the intermediate region 104 are thick and massive enough to be considered inflexible. For applications in which the plate 58 must move swiftly or oscillate, the plate 58 is preferably shaped symmetrically with respect to the axis 62 thus positioning a center of mass of the plate 58 on the axis 62. The basic hinge-segments 102a and 102c are usually shaped identically and have the same thickness as basic hinge-segment 102b. However, typically the basic hinge-segments 102a and 102c are narrower than the basic hinge-segment 102b such as approximately one-half (½) the width of the basic hinge-segment 102b. For the torsional flexure hinge 96 depicted in FIG. 4a, the basic hinge-segment 102b only twists while the basic hinge-segments 102a and 102c both twist and bend.

The basic hinge-segment 102b of the folded torsional flexure hinge 96 may include a torsion sensor 108, such as that described in the '618 patent, for measuring angular rotation of the plate 58 about the axis 62 with respect to the frame 56. The torsion sensor 108 located in the basic hinge-segment 102b is identical to that disclosed in the '618 patent. However, depending on specific characteristics of the folded torsional flexure hinge 96, the sensitivity of the torsion sensor 108 located in the basic hinge-segment 102b to rotation of the plate 58 will differ from a torsion sensor 108 located in a conventional, unfolded torsion bar 54.

The torsional stiffness of the folded torsional flexure hinge 96 illustrated in FIG. 6a approaches that of the conventional, unfolded torsion bar 54 of comparable width and thickness of the basic hinge-segment 102b and having a length equal to the combined lengths of the basic hinge-segment 102b and one of the basic hinge-segments 102a and 102c. However as is readily apparent from the illustration in FIG. 6a, the overall length of the folded torsional flexure hinge 96 including the intermediate region 104 is approximately one-half (½) that of the conventional, unfolded torsion bar 54. During rotation of the plate 58 with respect to the frame 56, basic hinge-segment 102b experiences nearly pure torsion, while the basic hinge-segments 102a and 102c experience both torsion and bending stresses. If the basic hinge-segments 102a and 102c are sufficiently close together, the bending stress can often be neglected when configuring the folded torsional flexure hinge 96 for a specific torsional scanner 52.

Compared to a conventional, unfolded torsion bar 54 of length "1," the folded torsional flexure hinge 96 exhibits greater vertical stiffness, and the frequencies of the vertical and lateral vibration modes of the folded torsional flexure hinge 96 are separated further from the frequency of the principal torsional vibrational mode. Because the basic hinge-segment 102b and the paired basic hinge-segments 102a and 102c both have lengths equal to one-half (½) of a comparable, conventional unfolded torsion bar 54, their vertical spring constants are only one-eighth (⅛) that of a comparable, conventional unfolded torsion bar 54. However, since the intermediate region 104 couples the basic hinge-segment 102b and the basic hinge-segments 102a and 102c in series, the folded torsional flexure hinge 96 is only four (4) times stiffer than the comparable, conventional unfolded torsion bar 54. The increased vertical stiffness of the folded torsional flexure hinge 96, in comparison with the comparable, conventional unfolded torsion bar 54, raises the resonant frequency of the vertical vibration mode by a factor of nearly two (2). The folded torsional flexure hinge 96 also increases the separation between the frequency of the principal torsional vibrational mode and the frequencies of the lateral and rocking vibration modes, although not as dramatically. Thus, the folded torsional flexure hinge 96 improves the separation between the frequencies of the various vibrational modes of the plate 58.

The improved characteristics of the folded torsional flexure hinge 96 may be used advantageously in microfabrication of torsional scanners 52 for severely restricted configurations. For example, the torsional flexure hinge 96 can be made more flexible for a chosen vertical stiffness thereby increasing angular rotation of the plate 58, or lowering power dissipation if rotation of the plate 58 is energized electro-magnetically. Alternatively, for a particular flexibility the folded torsional flexure hinge 96 increases the vertical stiffness thereby increasing shock resistance of the torsional scanner 52. Thus, the folded torsional flexure hinge 96 provides important advantages for the design of torsional scanners 52.

Furthermore, the torsional flexure hinge 96 may be subdivided into three (3) segments rather than two (2) segments thereby reducing its overall length even more, and further improving its vertical stiffness. Accordingly, the folded torsional flexure hinge 96 depicted in FIG. 4b adds to the basic hinge-segments 102a, 102b and 102c two (2) supplemental hinge-segments 102d and 102e together with intermediate regions 104a and 104b that respectively couple ends 112 of the basic hinge-segments 102a and 102c with immediately adjacent ends 112 of the supplemental hinge-segments 102d and 102e. Each of the hinge-segments 102a–102e typically have lengths that are one-third (⅓) the length "1" of a comparable, conventional unfolded torsion bar 54. In plan view, each pair of combined supplemental hinge-segments 102d or 102e, intermediate regions 104a or 104b and basic hinge-segments 102a or 102c appear U-shaped. If in comparison with a comparable, conventional unfolded torsion bar 54 the thickness of the hinge-segments 102a–102e are the same, the width of the basic hinge-segment 102b is the same, and the widths of the basic hinge-segments 102a and 102c and the supplemental hinge-segments 102d and 102e are approximately one-half (½) that of the basic hinge-segment 102b, then folded torsional flexure hinge 96 depicted in FIG. 4b has a vertical stiffness approximately nine (9) times greater than that of the comparable, conventional unfolded torsion bar 54.

Throughout the following description of various other aspects concerning micromachined members coupled for relative rotation, generally folded torsional flexure hinges 96 of the types described above may be used instead of the conventional unfolded torsion bars 54 described there. Moreover, any other torsional flexure hinge, appropriately configured to produce a restoring torque about an axis established by a pair of such hinges upon rotation of the plate 58 with respect to the frame 56 and which are monolithically fabricated using a stress-free semiconductor layer of a silicon substrate together with the frame 56 and plate 58, may be used instead of the conventional unfolded torsion bars 54 employed throughout the following description.

The frequencies of the various vibrational modes of the plate 58 reflect the geometry of the torsion bar 54. FIG. 5a depicts the non-linear relationship which exists between a rectangular beam's torsional spring constant and a ratio of the rectangular beam's width-to-thickness (w:t). For a micromachined beam such as a conventional unfolded torsion bar 54 having a width-to-thickness (w:t) less than 2:1, as illustrated by the graph in FIG. 5a reducing the width of the beam by one-half (½) reduces the torsional spring constant by more than one-half (½). As shown there, reducing by one-half (½) the width of a torsion beam having a width-to-thickness ratio (w:t) of two-to-one (2:1) reduces the beam's torsional spring constant by a factor of three (3.0).

FIG. 5b illustrates an unfolded, bifilar torsion bar 54 that is formed by two (2) beams 114 disposed symmetrically on opposite sides of the axis 62 each of which beams 114 has a width-to-thickness ratio (w:t) of one-to-one (1:1) For the reasons discussed above in connection with FIG. 5a, the unfolded bifilar torsion bar 54 depicted in FIG. 5b exhibits a torsional spring constant which is approximately sixty percent (60%) that of a torsion bar 54 formed by a single beam of the same thickness that has the same cross-sectional area as the combined beams 114, i.e. a single beam torsion bar 54 having a width-to-thickness ratio (w:t) of two-to-one (2:1). Thus, the unfolded, bifilar torsion bar 54 depicted in FIG. 5b exhibits a frequency for the principal torsional vibrational mode that is approximately seventy-five percent (75%) that of the equivalent, conventional, single-beam, unfolded torsion bar 54 while exhibiting an identical frequency for the vertical vibrational mode. Consequently, any conventional unfolded torsion bar 54 having a width-to-thickness ratio (w:t) between three-to-one (3:1) or less can usually be advantageously replaced by an equivalent bifilar torsion bar 54, such as that illustrated in FIG. 5b, while maintaining the same vertical stiffness.

In general, micromachined torsion bars 54 have a uniform thickness along their entire length. Usually this results in the conventional, unfolded torsion bar 54 having a width that exceeds its height. Therefore, the conventional, unfolded torsion bar 54 generally has a lateral stiffness which exceeds its vertical stiffness, and correspondingly a frequency for the lateral vibration mode that exceeds the frequency for the vertical vibration mode. Usually a torsion bar 54 having identical lateral and vertical stiffness is desirable if such a geometry permits reducing the torsional spring constant of the torsion bar 54. If a beam's width-to-thickness ratio (w:t) is less than one (1.0), then the lateral, rather than vertical, stiffness dominates. By combining beams of differing width-to-thickness ratios (w:t), both less than and greater than one (1.0), it becomes possible to advantageously improve the characteristics of the folded torsion bar 54.

FIG. 6a illustrates a conventional unfolded torsion bar 54. The torsion bar 54 may, for example have a length "l" of 400 microns, a thickness of 10 microns and a width of 20 microns, i.e. a width-to-thickness ratio (w:t) of two-to-one (2:1). Assume also that the frequency of the vertical vibrational mode is higher by a factor of three (3) than the frequency of the principal torsional vibrational mode. Based on the width-to-thickness ratio (w:t) of two-to-one (2:1) for the torsion bar 54, the frequency of the lateral vibrational mode is then a factor of six (6) higher than the frequency of the principal torsional vibrational mode.

FIG. 6b illustrates an adaptation of the folded torsion bar 54 depicted in FIG. 4a which uses the beams 114 for both of the basic hinge-segments 102a and 102c. By appropriately combining in the basic hinge-segments 102a, 102b and 102c beams having differing width-to-thickness ratios (w:t) that are both less than and greater than one-to-one (1:1), it becomes possible to approximately equalize the stiffness of the torsion bar 54 both vertically and laterally, while concurrently reducing the overall torsional spring constant of the folded torsion bar 54.

For the configuration illustrated in FIG. 6b, all the basic hinge-segments 102a, 102b and 102c torsion bars 54 are 10 micron thick. But in comparison with the conventional unfolded torsion bar 54 illustrated in FIG. 6a, the beams 114 making up each of the bifilar basic hinge-segments 102a and 102c have a width, i.e. 5.0 microns, that is only one-fourth (¼) that of basic hinge-segment 102b, i.e. 20.0 microns. Also, the beams 114 have a length, i.e. 135.0 microns, that is one-third (⅓) that of the conventional unfolded 400.0 micron long torsion bar 54 illustrated in FIG. 6a. The folded torsion bar 54 illustrated in FIG. 6b exhibits substantially the same vertical stiffness as the conventional unfolded torsion bar 54 illustrated in FIG. 6a. However, the extremely narrow beams 114 of the bifilar basic hinge-segments 102a and 102c have a width-to-thickness ratio (w:t) of (0.5:1.0) which drastically reduces their torsional spring constant as indicated by the graph of FIG. 5a, while concurrently reducing the lateral stiffness of the basic hinge-segments 102a and 102c. In a simplified way of understanding the torsion bar 54 depicted in FIG. 6b, the wider basic hinge-segment 102b of the torsion bar 54 maintains the lateral stiffness of the conventional, unfolded torsion bar 54 depicted in FIG. 6a while the bifilar basic hinge-segments 102a and 102c provide torsional flexibility matching that of the torsion bar 54 depicted in FIG. 6a.

In comparison with the conventional, unfolded torsion bar 54 depicted in FIG. 6a, the torsional spring constant of the folded torsion bar 54 depicted in FIG. 6b is twenty-two percent (22%) lower, and the frequencies of the vertical and lateral vibrational modes are both approximately eight and two-tenths (8.2) times higher in frequency than the frequency of the principal torsional vibrational mode. Thus, the torsion bar 54 illustrated in FIG. 6b provides the torsional scanner 52 with a vastly enhanced mode-spectrum with greater separation between the frequency of the principal torsional vibrational mode and the vertical and lateral vibrational modes than that exhibited by the torsion bar 54 depicted in FIG. 6a. The advantages provided by the configuration of the torsion bar 54 depicted in FIG. 6a can be used to make the torsional scanner 52 more rugged for the same torsional spring constant, or to maintain the same strength for the torsional scanner 52 while reducing the torsional spring constant. Thus, combining beams having width-to-thickness ratios (w:t) that differ and may be both greater than and less than one-to-one (1:1) can be advantageous exploited in designing folded torsion bars 54.

FIG. 7a depicts an alternative configuration for a bifilar torsion bar 54 that leaves ends 112 of L-shaped beams 114 free to deflect independently of the frame 56 and the plate 58. Freeing the ends 112 of the L-shaped beams 114, that are arranged symmetrically on both sides of the axis 62, to independently bend upward or downward greatly reduces the torsional spring constant of the torsion bar 54 while maintaining stiffness in the vertical and lateral directions.

Each of the beams 114 may include a bending sensor 116 that responds to uniaxial stress. Since the uniaxial stresses in the beams 114 have opposite signs, the signals produced by the bending sensors 116 may be advantageously combined to cancel noise and increase the signal due to uniaxial stress in the beams 114. Alternatively, the beams 114 may include torsion sensors 108 such as those described in the '618 patent.

FIG. 7b depicts an alternative embodiment for folded torsion bars 54 that includes U-shaped beams 114 arranged symmetrically on both sides of the axis 62. The torsion bar 54 depicted in FIG. 7b exhibits a lower torsional spring constant than that of the torsion bar 54 depicted in FIG. 7a. In the configuration of the beams 114 illustrated in FIG. 7b, the ends 112 of the beams 114 are free to bend upward or downward.

Alternatively, the two L-shaped beams 114 of the torsion bar 54 depicted in FIG. 7a may be augmented by a centrally-located, conventional unfolded beam 114 as illustrated forming the trifilar torsion bar 54 depicted in FIG. 7c. The torsion bar 54 depicted in FIG. 7c provides good vertical stiffness. The L-shaped beams 114 provide a low torsional spring coefficient and compliment the characteristics of the central unfolded beam 114 by providing good lateral stiffness.

For many if not all of the folded, bifilar and trifilar configurations for the torsion bars 54 described above, the relationship between the frame 56 and plate 58 and the torsion bar 54 are equivalent. Therefore, the relationship between the torsion bar 54 and the frame 56 and plate 58 illustrated in FIGS. 4a, 4b, 5b, 6a, 6b, 7a, 6b and 7c may usually be reversed.

Stabilizing Dynamic Member Rotation

In comparison with the tethers 86 connecting between the frame 56 and the plate 58 as disclosed in the '09289 PCT patent application that change the torsional spring constant of the torsional scanner 52 as the plate 58 rotates about the axis 62, as described below it is far more advantageous to attach one or more appendages or tethers to one or both of the torsion bars 54 that support the plate 58 rather than directly to the plate 58 itself. By attaching appendages or tethers to one or both of the torsion bars 54, the length of the torsion bar 54 can be effectively shortened at pre-established angles as the plate 58 rotates about the axis 62 thereby creating a marked change in the torsional spring constant of the torsional scanner 52 at each such angle. In this way it is possible to provide the torsional scanner 52 with a multi-segmented restoring torque curve that increases the electrostatic stability of the torsional scanner 52 without distorting the mirror surface 76.

An electrostatically energized torsional scanner 52 that exhibits a highly non-linear torsional spring constant, analogous to that illustrated by the line segments 94a and 94b in FIG. 3a, may be fabricated as depicted in FIGS. 8a and 8b. The torsional scanner 52 depicted in those FIGs. includes one or more appendages 122 attached to the torsion bars 54 at points which are located along the torsion bars 54 between the frame 56 and the plate 58. Each of the appendages 122 includes a free, projecting end 124 that does not contact any other portion of the torsional scanner 52 when the plate 58 is free of any torque about the axis 62. When the plate 58 rotates sufficiently far about the axis 62 the projecting end 124 of each appendage 122 contacts a stop 126 positioned either on the frame 56 or on the insulating substrate 64, or contacts the insulating substrate 64 directly. As illustrated in FIG. 8b, stops 126 may be located above or below the plane of the plate 58.

The appendages 122 may be made of the same silicon material as the torsion bars 54, and may be formed during fabrication of the torsional scanner 52 at the same time as the torsion bars 54. Alternatively, the appendages 122 may be formed by materials that are coated onto the torsion bars 54 during fabrication of the torsional scanner 52 such as layers of metals, oxides or nitrides. Depending upon precise details of the appendages 122 and the stops 126, the torsional scanner 52 may exhibit a torsional spring constant that is symmetric on both sides of the torque axis depicted in FIG. 8c, i.e. that exhibits the same torsional spring constant both for clockwise and counter-clockwise rotation of the plate 58 about the axis 62.

Engagement of the projecting end 124 of the appendage 122 with the stops 126 or the insulating substrate 64 impedes further rotation of the torsion bar 54 along a section 128 of the torsion bar 54 extending from the frame 56 to the point at which the appendage 122 attaches to the torsion bar 54. Impeding further rotation of the section 128 effectively removes the section 128 from the torsional spring supporting the plate 58, and effectively shortens the torsion bar 54. Dynamically shortening the torsion bar 54 in this way abruptly changes the slope of the torsional spring constant. Since initial rotation of the plate 58 away from the rest position is unencumbered, including one or more appendages 122 in the torsional scanner 52 increases the electrostatic stability of the torsional scanner 52. By coupling the appendages 122 to the torsion bars 54 rather than to the plate 58, the restraint which the appendages 122 impose on rotation of plate 58 does not change the flatness of the mirror surface 76. The appendages 122 may attach to one or both of the torsion bars 54 and, as illustrated in FIG. 8a, may attach at multiple points along the torsion bars 54 using appendages 122 that have differing lengths.

The graph of FIG. 8c illustrates, with respect to the driving torque curve 92 depicted from FIG. 3a, a multi-segmented restoring torque curve 132 in which the slope of the restoring torque curve 132 changes abruptly for angles at which the projecting end 124 of appendages 122 first engage their respective stops 126. As is apparent from the graphs in FIG. 8c, for the illustrative restoring torque curve 132 there does not exist an angular rotation of the plate 58 about the axis 62 with respect to the frame 56 which is electrostatically unstable. The dimensions of and the materials forming the appendages 122 may be chosen such that the appendages 122 flex slightly as the plate 58 continues rotating after their respective projecting ends 124 engage the stops 126. Such flexing of the appendages 122 yields a restoring torque curve 132 which has curved rather than linear segments with transitions between the different torsional spring constant segments changing more smoothly than illustrated in FIG. 8c.

In many pointing or steering applications for torsional scanners 52 such as fiber optic switching, the light beam 74 reflecting off the mirror surface 76 of the plate 58 may remain fixed in the same direction for a very long time, e.g. hours or even days. In such applications, infrequent impacts of the projecting ends 124 on the stops 126 does not adversely affect the life or reliability of the torsional scanner 52.

For torsional scanners 52 in which the plate 58 must rotate at high speed, the torsional scanners 52 may include a tether 142 attached as illustrated in FIGS. 9a and 9b to either one or both of the torsion bars 54. The tether 142 includes connection rods 144 each of which is coupled by a spring 146 to the frame 56 by flexible rods 148a and 148b. As illustrated in greater detail in FIG. 9b, the springs 146 use an inverted connection for corrugations 152 so the corrugations 152 compress during rotation of the plate 58 either clockwise or counter-clockwise about the axis 62. Use of the inverted connection corrugations 152 causes the stiffness of the springs 146 to increase dramatically when fully compressed.

All parts of spring 146 are made as stiff as possible, except for the corrugations 152 and flexible rods 148a and 148b, which allow the spring 146 to flex as connection rods 144 moves. As the torsion bar 54 rotates, the connection rods 144 move and flexible rods 148a and 148b are pulled thereby compressing the corrugations 152 until the corrugations 152 contact each other at which point the tether 142 becomes essentially inelastic. When the corrugations 152 contact each other, rotation of a section 128 of the torsion bar 54 is impeded similar to the tethers 142 causing the torsional spring constant to exhibit an abrupt change of value. Thus, the restoring torque curve for the torsional scanner 52 depicted in FIGS. 9a and 9b may be made multi-segmented as depicted in FIG. 8c for the torsional scanner 52 illustrated in FIGS. 8a and 8b. Moreover, the stiffening of the restoring torque curve obtained with each tether 142 occurs symmetrically for both clockwise and counter-clockwise rotation of the plate 58 with respect to the frame 56.

The corrugations 152 can be made extremely flexible so the corrugations 152 have little effect on the torsional spring constant of the torsion bars 54 until the corrugations 152 become compressed. The corrugations 152 may include stops 154 as illustrated in FIG. 9c, to limit compression of the corrugations 152. The corrugations 152 may also be spaced non-uniformly so some of the corrugations 152 in the spring 146 contact each other before contact occurs between other corrugations 152. Instead of the compression springs 146, as illustrated in FIG. 9a the tethers 142 may include an extension spring 156 connected to the torsion bar 54. Using the spring 156, an increase in torsional spring constant results from the increasing stiffness of corrugations 152 as they extend.

The springs 146 may be oriented at any angle with respect to the torsion axis 62 to save space. The connection rods 144, the springs 146 or springs 156, and the flexible rods 148a and 148b may all be made out of silicon during fabrication of the torsional scanner 52. Alternatively, they may be made of metal, polysilicon, nitride, oxide etc. applied onto a surface of a silicon wafer during fabrication of the torsional scanner 52.

If to measure rotation of the plate 58 the torsional scanner 52 depicted in FIGS. 8a and 8b or 9a and 9b includes a torsion sensor 108 located on at least one of the torsion bars 54 such as described in the '618 patent, the torsion sensor 108 must be located on one of the torsion bars 54 in a section thereof whose rotation is unrestrained by any of the appendages 122 or tethers 142. However the output signal from a torsion sensor 108 included in the torsional scanner 52 depicted in FIGS. 8a and 8b or 9a and 9b per unit angle of rotation of the plate 58 differs along each segment of the restoring torque curve 132. The output signal from the torsion sensor 108 varies because the stress in the section of the torsion bar 54 which carries the torsion sensor 108 per unit angle of rotation of the plate 58 is different along each segment of the restoring torque curve 132.

A non-linear torsional spring constant may also be obtained by using conventional, unfolded torsion bars 54 that are very wide in comparison with their length. For many applications, torsion bars 54 typically have a five-to-one (5:1) to ten-to-one (10:1) width-to-length ratio (w:1). However, if the torsion bars 54 have a much larger width-to-length ratio (w:1), e.g. a ratio that exceeds one-to-two (1:2), then upon rotation of the plate 58 about the axis 62 edges of the torsion bars 54 extending from the frame 56 to the plate 58 exhibit both twisting and stretching.

Another approach to at least partially alleviating electrostatic instability of the torsional scanner 52 is supplying feedback from a rotation sensor to the circuit that generates the electrostatic drive signals as described below. As disclosed in the '790 patent, in principle feeding back a rotation sensor signal to the circuit that generates the electrostatic drive signals should eliminate electrostatic instability for all angles of rotation of the plate 58 with respect to the torsion bar 54.

Referring to FIG. 2 that depicts the straight line 82 restoring torque curve and the curved driving torque curves 84a, 84b and 84c, the problem of electrostatic instability can be relieved by flattening the driving torque curves 84a, 84b and 84c. For a particular torsional scanner 52, flattening the driving torque curves 84a, 84b and 84c in comparison with those depicted in FIG. 2 also permits controllably rotating the plate 58 throughout larger angles. The effective driving torque curves 84a, 84b and 84c may be modified to become much flatter by subtracting from the driving voltages applied to the electrodes 66 a voltage which is proportional to an appropriate power-law, e.g. the second or third power, of the rotation sensed for the plate 58. Any angle sensor integrated in the torsion bar 54, such as the rotation sensor described in the '618 patent, or other type of angle sensor based on piezo-resistor bridges or capacitive angle sensors may be used for sensing rotation of the plate 58.

FIG. 10a depicts the torsional scanner 52 of FIG. 1 together with timing diagrams illustrating typical, conventional electrostatic drive signals applied respectively to the electrodes 66 included in the torsional scanner 52. As illustrated by the timing diagrams in FIG. 10a, a conventional electrostatic driving circuit preferably applies a driving signal between the plate 58 and one of the electrodes 66 which consists of a bias voltage "$V_0$" to which is added a driving voltage "v." Alternatively, the bias voltage "$V_0$" minus the voltage "v" is applied as the driving signal between the plate 58 and the other electrode 66. Adding and subtracting the voltage "v" respectively to the electrodes 66 unbalances the electrostatic attraction between the plate 58 and the electrodes 66 which causes the plate 58 to rotate either clockwise or counter-clockwise about the axis 62. Quasi-static motion of the plate 58 is obtained by periodically reversing the addition and substraction of the voltage "v" in the driving signals applied between the plate 58 and the electrodes 66.

FIG. 10b depicts a block diagram of a circuit adapted to provide driving voltages to the electrodes 66 of FIG. 1 which enhance electrostatic stability of the torsional scanner 52 by flattening the driving torque curves 84a, 84b and 84c of FIG. 2. In the block diagram of FIG. 10a, a rotation sensor 162, preferably the torsion sensor 108, generates an output signal "a" responsive to angular rotation of the plate 58 with respect to the frame 56 about the axis 62. An input of a multiplier 164 receives the output signal "a" and squares the signal "a" to produce an output signal "$a^2$." An input of an amplifier 166 receives the squared output signal "$a^2$" and amplifies that signal by a constant factor "K." The amplified output signal from the amplifier 166 "$Ka^2$" together with the voltage "v" applied to the plate 58 is then received by inputs respectively of unity gain summing amplifiers 168− and 168+. The summing amplifier 168− subtracts the output signal "$Ka^2$" received from the amplifier 166 from the voltage "v" and supplies the difference thus obtained "+v−$Ka^2$" as an input signal to a summing amplifier 172a. The summing amplifier 168+ adds the output signal "$Ka^2$"

received from the amplifier 166 to the negative of the voltage "v" and supplies the result thus obtained "−v+Ka²" as an input signal to a summing amplifier 172b. The voltage "$V_0$" also received by both summing amplifiers 172a and 172b is added to the signals received respectively from the summing amplifiers 168− and 168+ and the summing amplifiers 172a and 172b supply the results of such addition, i.e. and "$V_0$+v−Ka²" "$V_0$−v+Ka²" to the respective electrodes 66. The timing diagrams of FIG. 10c illustrate typical drive signals as may be applied by the circuit depicted in FIG. 10b between the plate 58 and the electrodes 66 that enhance electrostatic stability.

The multiplier 164 may be configured to raise the output signal "a" from the rotation sensor 162 to a power other than 2, i.e. 3, 4, etc. The power "n" applied to the output signal "a" from the rotation sensor 162 to obtain "$a^n$" is selected to reduce the control voltage "v" thus appropriately flattening the driving torque curve. The bias voltage $V_0$ may also be scaled, according to one an appropriately chosen power law, which further increases the flatness of the driving torque curve. For an electrostatically energized plate 58 1.5 mm on a side, with torsion bars 54 that are 150 micron long, 8 microns thick and 12 microns wide, and for an applied voltage $V_0$ of 310 V and the signal voltage v is 300 volts, the driving torque curve, as illustrated in FIG. 11, becomes much flatter using the driving circuit depicted in FIG. 10. A driving torque curve 176 illustrates the torque applied to the plate 58 by the circuit illustrated in FIG. 2 in which the multiplier 164 squares the output signal "a" from the rotation sensor 162. A driving torque curve 178 in FIG. 11 illustrates the torque applied to the plate 58 by the circuit illustrated in FIG. 2 in which bias voltage $V_0$ has also been subjected to the same angular feedback. The stability region is found to improve from about 2° to 4° for a drive circuit illustrated by the driving torque curve 176. In this way, the stability and flatness of the driving curve are vastly improved.

Improved Electrostatic Drive

Intuitively, it seems reasonable to expect that for identically shaped plates 58, one with and one without a box frame, that upon application of voltage to the electrodes 66 the plate 58 having the box frame would exhibit a lesser torque. It seems logical initially that the plate 58 without the box frame would exhibit more torque because most of a hollow central region of the plate 58 surrounded by the box frame contributes little to the total torque since the plate 58 at the central region is relatively far away from the electrodes 66. However, a theoretical analysis establishes that torque applied to the plate 58 of a torsional oscillator such as the torsional scanner 52 by an electrostatic driving field may be substantially enhanced by sharpening tips of a box frame that face the electrodes 66. Moreover, for an appropriate geometry of a box frame and corresponding electrodes, the enhanced electrostatic field resulting from sharp tips of the box frame increases the torque obtained electrostatically. Since the box-frame is typically made out of electrically conductive silicon, sharpening the box frame increases attraction between the plate 58 and the electrodes 66 by geometrically concentrating the electrostatic field at tips of the box frame. Since the box frame tip and the electrostatic field enhanced by sharpening tips of the box frame are, in many instances, both located about the periphery of the plate 58 far from the torsion bars 54 and the rotation axis 62 which the torsion bars 54 establish, electrostatic attraction between the box frame and the corresponding electrodes 66 produces a maximum amount of torque. Thus, even though the area of electrostatic interaction between the plate 58 and the electrodes 66 decreases, the torque applied electrostatically to the plate 58 increases for particular geometrical configurations of the plate 58 and the electrodes 66. Tips of a suitably designed box frame may be easily sharpened by appropriate anisotropic etching of the silicon plate 58.

A curve 182 in FIG. 12a, made up of straight line segments 182a and 182b, illustrates a surface 184 of one-half (½) of a box frame 186 reinforcing rim included in a torsional oscillator such as the plate 58 or a frame, usually about the periphery thereof. The box frame 186 that is illustrated in the partial cross-sectional view of FIG. 12a:

1. is spaced 160.0 microns from the electrode 66 which is located along the vertical axis of the graph at 0.0 on the horizontal axis of the graph;
2. is oriented perpendicularly into and out of the plane of FIG. 12a along the periphery of the plate 58 parallel to the axis 62 established by the torsion bars 54;
3. is approximately 90.0 microns wide at a tip 188 of the box frame 186 nearest to the electrode 66; and
4. has a width of approximately 600.0 microns at a juncture between the box frame 186 and the remainder of the plate 58.

In FIG. 12a, a curve 192, which represents of a surface 194 of a portion of an elliptical cylinder oriented parallel to the box frame 186, overlays the curve 182 to illustrate graphically how little difference exists between the surface 194 of that particular elliptical cylinder and the surface 184 of the box frame 186. A dashed line 196 illustrates a (111) crystallographic plane of a silicon wafer after anisotropic etching.

Representing a closed solution obtained analytically using the elliptically-shaped surface 194 depicted in FIG. 12a, FIG. 12b illustrates graphically a component of electrostatic field strength oriented perpendicular to the electrode 66 upon application of an electrical potential of 600 V between the electrode 66 and the box frame 186 as spacing between the box frame 186 and the electrode 66 varies due to rotation of the plate 58 about the axis 62 established by the torsion bars 54. In comparison with a flat plate 58 oriented parallel to the electrode 66, a computation using the elliptically-shaped surface 194 establishes that the presence of the tip 188 of the box frame 186 adjacent to the electrode 66 increases electrostatic field by a factor of almost two (2.0). Therefore, the attractive force between the electrode 66 and the plate 58 that includes the box frame 186 is approximately four (4) times greater than the attractive force between a flat plate 58 and the electrode 66.

The theoretical analysis of the attractive force between electrodes 66 and plates 58 that includes the box frame 186 indicates that box frames 186 having a width at the tip 188 which is between zero (0.0) and three (3.0) times the average spacing between the electrode 66 and the tip 188 exhibit increased electrostatic attractive force. Because of the increased electrostatic attraction between the sharpened box frames 186 and the electrodes 66, and because the box frame 186 is located about the periphery of the plate 58, for a plate 58 having a width of one (1.0) mm perpendicular to the axis 62, the torque per unit length of the box frame 186 is about fifteen percent (15%) greater than that for the plate 58 without the box frame 186.

To further increase attractive force between the electrodes 66 and the plate 58 for those applications that require maximum torque but not necessarily maximum Q, the electrodes 66 may be shaped as illustrated in FIGS. 12c and 12d to conform with the shape of the box frame 186. The electrodes 66 shaped to conform with the sharpened box frame 186 increase the electrostatic field produced by electrodes 66 located about the box frame 186. The conforming shapes respectively illustrated in FIGS. 12c and 12d may be formed by plating-up structures onto the insulating substrate 64, or by anisotropically etching (111) crystallographic planes of silicon material. To create the desired shape for the electrode 66 by anisotropically etching silicon, that portion of the electrodes 66 which conform with sloping side surfaces of the box frame 186 is first etched into a separate piece of silicon. The anisotropically etched piece of silicon is then fixed to the underlying insulating substrate 64 and electrically interconnected with portions of the electrodes 66 formed on the insulating substrate 64 adjacent to the tips 188. The conforming electrodes 66 can also be silk-screened onto, or can be machined into the insulating substrate 64. The electrodes 66 may be overcoated with a dielectric material such as polyimide to reduce the likelihood that electrical sparking will occur between the plate 58 and the electrodes 66.

In general, rotation of the plate 58 causes air to move laterally across the insulating substrate 64 with both compression and rarefaction occurring concurrently on opposite sides of the plate 58. As is readily apparent, such movement of the air dissipates energy supplied by the plate 58. The hollow-center box frame 186 significantly reduces such energy loss thereby providing a torsional oscillator, such as the torsional scanner 52, with higher Q. For those torsional oscillators such as the torsional scanner 52 that require a high Q, as illustrated in FIG. 13a the central portion of the box frame 186 should be hollowed out as much as practicable forming a hollow cavity 198. The cavity 198 should also possess a substantial opening between the moving plate 58 and both the insulating substrate 64 and the electrodes 66. When comparing the plate 58 having the box frame 186 illustrated in FIG. 13a with a solid plate 58 illustrated in FIG. 13b both of which are spaced equally from the electrodes 66, it is apparent the hollow plate 58 depicted in FIG. 13a exhibits less air friction than the solid plate 58 depicted in FIG. 13b, particularly due to reduced squeeze film damping. Losses due to air friction may be further reduced, as illustrated in FIG. 13c, by hollowing a cavity 202 into the insulating substrate 64 that opens toward the cavity 198 formed into the plate 58.

For applications in which flatness of the plate 58 is not a dominant consideration, a thinner portion of the plate 58 may extend outward away from the torsion bar 54 and axis 62 beyond the box frame 186 as illustrated in FIG. 13d. For the plate 58 depicted there, rather than being located at the periphery of the plate 58, the smaller box frame 186 is located between the periphery of the plate 58 furthest from the axis 62 and the torsion bars 54. For the box frame 186 depicted in FIG. 13d, the tips 188 of the box frame 186 rotate less than if the box frame 186 encircles the periphery of the plate 58. Lesser movement of the plate 58 permits reducing both the spacing between the box frame 186 and the electrodes 66 and the driving voltage applied thereacross. Extension of the plate 58 outward from the torsion bar 54 and the axis 62 may also be employed with the solid plate 58 illustrated in FIG. 13b.

FIG. 13e illustrates an alternative embodiment configuration of the plate 58 adapted for energizing rotation about the axis 62 electrostatically. In the configuration depicted in FIG. 13e, the electrodes 66 are not disposed adjacent to the periphery of the plate 58 where they are most effective for applying torque to the plate 58. Rather the torsional scanner 52 includes pairs of auxiliary driving-plates 212 each of which pairs is disposed along conventional, unfolded torsion bars 54 on both opposite sides thereof. Each pair of plates 58 is coupled to the torsion bar 54 located between them at an end of the torsion bar 54 which is immediately adjacent to the plate 58. Each pair of auxiliary driving-plates 212 has a width perpendicular to the axis 62 which is significantly less than a width of the plate 58 perpendicular to the axis 62. Since each pair of auxiliary driving-plates 212 is narrower than the plate 58, spacing between the auxiliary driving-plates 212 and pairs of electrodes 66 disposed adjacent thereto may be significantly smaller than if the electrodes 66 were disposed adjacent to the periphery of the plate 58. Since each of the auxiliary driving-plates 212 is disposed nearer to its corresponding electrode 66, a lower voltage may be applied between the auxiliary driving-plates 212 and the electrodes 66. Because electrostatic driving electrodes 66 for applying torque to the plate 58 are not disposed adjacent to the plate 58, both a front side and a back side of the plate 58 may function as mirror surfaces 76 for reflecting light beams 74. If the torsional scanner 52 need reflect only a single light beam 74, then the electrodes 66 may extend parallel to the axis 62 adjacent to one surface of the plate 58 fully from one pair of auxiliary driving-plates 212 to the other pair auxiliary driving-plates 212.

Increased Thermal Conductivity Torsion Bars

Heat dissipation from the plate 58 may be increased by using wide and thin torsion bars 54 for supporting the plate 58 within the frame 56. Use of wide and thin torsion bars 54 improves heat dissipation from the plate 58 because, for an equivalent torsion spring constant, wide and thin torsion bars 54 have greater cross-sectional area and thermal conductivity than narrower and thicker torsion bars 54. For the unfolded torsion bar 54, the torsional spring constant increases as the third power of the thickness, and is proportional to the width of the torsion bar 54. Therefore, decreasing the thickness of the bar by one-half, and increasing the width eight times provides the same torsional spring constant. However, the cross-sectional area of the wider and thinner torsion bar 54 is four (4) times larger, which correspondingly increases the thermal conductivity of the wider and thinner torsion bar 54.

For many applications, micromachined torsion bars 54 typically have a two-to-one (2:1) to four-to-one (4:1) width-to-thickness ratio (w:t), e.g. 30.0 microns wide and 10.0 microns thick. However, if the torsion bars 54 have a much larger width-to-thickness ratio (w:t), e.g. a width-to-thickness (w:t) ratio that exceeds four-to-one (4:1), then thermal conductivity between the plate 58 and the frame 56 may doubles or triple in comparison with narrower and thicker torsion bars 54 having the same torsional spring constant.

As described in detail in the '790, '553 and '618 patents, Simox, silicon-on-insulator or bonded silicon wafer substrates are a particularly preferred starting material for fabricating reflecting torsional scanners 52 because they permit easily fabricating a very flat, stress-free membrane, possibly only a few microns thick, for the reflective plate 58. As illustrated in FIG. 14, a Simox or bonded wafer 222 includes an electrically insulating layer of silicon dioxide 224 that separates single crystal silicon layers 226 and 228. The torsion bars 54 and plate 58 of torsional scanners 52 are formed in the thinner device silicon layer 226 while other portions of torsional scanners 52, such as the box frame 186, are formed by backside etching in the thicker handle silicon layer 228. The intermediate silicon dioxide 224 provides a perfect etch stop for backside etching, and yields torsion bars 54 and plates 58 having uniform thickness.

In addition to geometrical techniques that may be used for improving thermal conductivity of torsion bars 54, plates 58 or frames and their associated torsion bars 54 may be made out of pure isotopic silicon, e.g. $14Si^{28}$. Isotopically pure $14Si^{28}$, the predominant silicon isotope, has a thermal conductivity that is fifty percent (50%) greater than standard isotopically impure silicon. To enhance thermal conductivity between the plate 58 and the frame 56 via the torsion bars 54, the device silicon layer 226 of bonded wafer 222, which provides the material both for the plate 58 and torsion bars 54, is made of pure isotopic $14Si^{28}$ silicon. For such bonded wafers, the handle silicon layer 228 may be made from isotopically impure silicon. If a Simox wafer is used for fabricating the torsional scanner 52, then the entire wafer 222 must made from pure isotopic $14Si^{28}$ silicon. Forming the torsion bars 54 from isotopically pure $14Si^{28}$ silicon increases thermal conductivity between the plate 58 and the frame 56 thereby enhancing heat dissipation of the plate 58.

Adjusting Dynamic Member's Q

In many applications for micromachined, silicon torsional oscillators, particularly those in which the plate 58 oscillates back and forth at the frequency of the principal torsional vibrational mode, the high Q, e.g. greater than 5000, exhibited by the torsional scanner 52 is highly desirable. However, for other applications, such as those in which the torsional scanner 52 rotates to and remains fixed in one orientation for some interval of time, and subsequently rotates swiftly through a relatively large angle to another orientation where it again remains fixed for some interval of time, high Q can be disadvantageous. For such applications of micromachined silicon torsional oscillators, after the plate 58 rotates from one orientation to another its high Q causes the plate 58 to vibrate back and forth around the new orientation for some interval of time until energy stored in the plate 58 dissipates.

The "butterfly-shaped" frame as illustrated in the '139 patent, or butterfly-shaped plate 58 may be very advantageously adapted for controlling the Q of the moving plate 58 or frame. FIG. 15*a* illustrates a configuration of the torsional scanner 52 in which a conventional frame 56 encircles a "butterfly-shaped" plate 58. Elongated slots 232 formed in the plate 58, which give the plate 58 its "butterfly" shape, extend alongside conventional, elongated torsion bars 54 which support the plate 58 within the frame 56. A blob of damping material 236, which may be formed by a tape or some viscous material, spans across each of the slots 232 near the frame 56 to lossyly couple the plate 58 to the torsion bars 54. Because the end of the torsion bar 54 near the frame 56 is almost motionless compared with movement of the plate 58, disposing the material 236 near the frame 56 applies substantial stress to the material 236 whenever the plate 58 moves. Application of substantial stress to the lossy material 236 provides strong damping for movements of the plate 58. However, forces which the damping material 236 couples to the torsion bars 54 are likely to distort the plate 58. Therefore, it may be advantageous to almost totally encircle a central mirror portion 242 of the plate 58 with a stress relief cut 244. Almost totally surrounding the central mirror portion 242 with the stress relief cut 244 leaves the central mirror portion 242 supported within the plate 58 by short beams 246 thereby decoupling stress in the surrounding portion of the plate 58 from the central mirror portion 242 and ensuring the flatness of the mirror surface 76.

FIG. 15*b* depicts an alternative embodiment of the torsional scanner 52 which is also advantageously adapted for controlling the Q of the moving plate 58 or frame. In the embodiment depicted there, slots 232 alongside the torsion bars 54 are formed in the frame 56 rather than in the plate 58. Again material 236 spans across each of the slots 232 near the essentially motionless end of each torsion bar 54. Configured in this way, taut damping material 236 couples substantial stress from the torsion bars 54 to the frame 56 whenever the plate 58 moves. Because in the embodiment depicted in FIG. 15*b* the damping material 236 couples stress from the torsion bars 54 into the comparatively thick and rigid frame 56 rather than into the relatively thin and flexible plate 58, the embodiment depicted there may possibly omit the stress relief cut 244 and the beams 246.

Applying the damping material 236 across the slots 232 and the torsion bars 54 changes the stiffness of the torsion bars 54 somewhat. However, reductions of Q to as low as two (2.0) or even lower are obtainable. For the "butterfly-shaped" frame illustrated in the '139 patent, the damping depicted in FIGS. 15*a* and 15*b* could be applied to either or both of the torsion bars 54 that support its moving gimbal ring within its fixed thin film frame, or that support the moving, central gimbal plate within its gimbal ring. The Q of torsional scanners 52 that employ folded, bifilar, or trifilar torsion bars 54, such as those depicted in FIGS. 4*a*, 4*b*, 5*b*, 6*a*, 6*b*, 7*a*, 6*b* and 7*c*, may also be controlled with damping material 236.

Ruggedized Torsion Bars That Include A Torsion Sensor

Some applications of torsional oscillators require that the torsion bars 54 be very narrow. Such narrow torsion bars 54 provide limited surface area on the torsion bar 54 for the torsion sensor 108 described in detail in the '618 patent. Alternatively, electrical leads or other structures may compete with the torsion sensor 108 for surface area on the torsion bar 54.

FIG. 16*a* depicts a narrow torsion bar 54 having a widened section 252 located near the frame 56 which provides space on the torsion bar 54 for the torsion sensor 108. As explained in greater detail in the '618 patent, the torsion sensor 108 preferably includes electrical current pads 254*a* and 254*b* which connect via leads 256*a* and 256*b* to current electrodes 258*a* and 258*b*. For ease in laying out the torsion sensor 108, the current electrodes 258*a* and 258*b* are usually oriented perpendicular to the axis 62 established by the torsion bars 54. With the current electrodes 258*a* and 258*b* oriented in that way, an electrical current applied to the torsion sensor 108 through the pads 254*a* and 254*b* flows through the torsion bar 54 parallel to the axis 62 between the current electrodes 258*a* and 258*b*. An output voltage from the torsion sensor 108, that appears across output electrodes 262*a* and 262*b*, varies in response to changes in shear stress in the surface of the widened section 252. The output voltage produced by the torsion sensor 108 is carried by leads 264*a* and 264*b* to output pads 266*a* and 266*b*. The pads 254*a* and 254*b*, leads 256*a* and 256*b*, leads 264*a* and 264*b* and output pads 266*a* and 266*b* are electrically insulated from the torsion bar 54 and the frame 56.

One advantage of locating the torsion sensor 108 in the widened section 252 is that electrical leads connecting to the torsion sensor 108 pass immediately onto the frame 56 which usually has a comparatively wide surface. Locating the torsion sensor 108 on the comparatively spacious widened section 252 also significantly reduces or eliminates any requirement for fine line lithography. Analogously, any electrical leads extending across the narrow torsion bar 54 to the plate 58 pass easily around the area of the widened section 252 occupied by the torsion sensor 108.

However, locating the torsion sensor 108 in the widened section 252 reduces its sensitivity to shear stress in the torsion bar 54 due to rotation of the plate 58 about the axis 62 with respect to the frame 56. Nevertheless, in comparison with other possible configurations for narrow torsion bars 54 which include the torsion sensor 108, the widened section 252 may be comparatively advantageous. If the torsion bar 54 is narrower than its thickness, i.e. has a width-to-thickness ratio (w:t) less than one-to-one (1:1), then shear stress in the surface of the torsion bar 54 carrying the torsion sensor 108 decreases dramatically. Hence, the torsion sensor 108 located on the widened section 252, such as that illustrated in FIG. 16b for a bifilar torsion bar 54, may actually measure a higher shear stress than if the torsion sensor 108 were located on one or both of the narrow beams 114 making up the torsion bar 54. Furthermore, the lower shear stress in the widened section 252 reduces any likelihood that metallic electrical leads in that area of the torsion bar 54 will exhibit fatigue due to rotation of the plate 58. The widened section 252 carrying the torsion sensor 108 may be incorporated into any conventional unfolded, folded, bifilar, or trifilar torsion bar 54 such as those depicted in FIGS. 4a, 4b, 5b, 6a, 6b, 7a, 6b and 7c.

Highly Reflective Micromachined Members

A significant concern in fabricating micro-machined mirror surfaces 76 is obtaining a high reflectivity surface while keeping the mirror surface 76 flat. Concern about flatness of the mirror surface 76 increases if the torsional scanner 52 must operate throughout an extended temperature range. A mirror surface 76 that satisfies these requirements may be formed, without significantly altering stress in the stress-free plate 58 obtained by micro-machining the torsional scanner 52 from the preferred wafer 222 described above, by applying balanced metal coatings on both a front side and a back side of the plate 58, i.e. sides of the plate 58 that are the same as or oriented parallel to the device silicon layer 226 of the wafer 222. Generally such metal coatings should be very thin to reduce the possibility of bending the plate 58.

In this way high-quality reflective mirror surfaces 76 may generally be formed for such applications of the torsional scanner 52 by first coating one the plate 58 with a thin, e.g. 4 A°, layer of an adhesive material. While chromium (Cr) may be used for the adhesion layer, for flat mirrors, particularly on thin plates 58, preferably titanium (Ti) or zirconium (Zr) forms a lower stress adhesion layer 10.0 to 100.0 A° thick. After the plate 58 has been coated with the adhesion layer, then the plate 58 is coated with a thicker reflective metallic layer such as 500 to 800 A° of gold. The plate 58 may be coated with these materials in various different ways. Even if a light beam 74 is to reflect from only one side of the plate 58 as illustrated in FIG. 1, to reduce the possibility of unbalanced stresses on the plate 58 after one side has been coated to establish the mirror surface 76 the other side receives an identical coating deposited under identical conditions. Depositing identical coatings while maintaining the processing conditions and environment constant produces compensating, balancing stresses on surfaces of the plate 58 which leaves the reflective mirror surface 76 flat.

Typically, metallic coatings forming the mirror surface 76 are applied in a vacuum deposition system, for instance by thermal or electron beam evaporation of metals, or sputtering of metals. Alternatively, metallic coatings forming the mirror surface 76 may be plated onto the plate 58. During conventional evaporation or sputtering of metals onto silicon wafers as depicted conceptually in FIG. 17a, a chuck 272 holds the wafer 222 to be coated with the device silicon layer 226 facing a source 274 that sprays a beam 276 of metal onto the wafer 222. Because the source 274 may not always emit a uniform beam 276, to increase yields of acceptable semiconductor products the chuck 272 may rotate the wafer 222 in the plane of the device silicon layer 226, as indicated by a curved arrow 282 in FIG. 17a attempting to uniformly coat the wafer 222.

Using the conventional metal evaporation or sputtering process described above to apply balanced metal coatings on both the front side and the back side of plates 58 that have been micro-machined in the wafer 222 requires sequentially depositing two (2) mirror surfaces 76, one after the other, on opposite sides of the plate 58. Such a sequential deposition of two (2) mirror surfaces 76 offers a possibility for introducing minor differences between coatings on opposite sides of the plate 58 which could result in unbalanced stress on the plate 58.

FIG. 17b depicts, conceptually, an alternative metal evaporation or sputtering process which reduces the possibility that coatings on opposite sides of the plate 58 will apply unbalanced stress on the plate 58. In the process illustrated there, rather than the chuck 272 rotating the wafer 222 in the plane of the device silicon layer 226, the chuck 272 rotates the wafer 222 about an axis 284 that is parallel to the device silicon layer 226. Rotation about the axis 284 causes plates 58 micro-machined in the wafer 222 to alternate between the front side and the back side thereof during exposure to the beam 276. In this way, portions of metallic coatings that provide the mirror surface 76 are applied alternately to opposite sides of the plate 58 until the entire mirror surface 76 builds up which improves the stress-balance between coatings on opposite sides of the plate 58. This process for rotating the wafer 222 about the axis 284 parallel to the device silicon layer 226 may also be used in applying any other type of coating onto the plate 58 particularly when stress in the plate 58 must not change.

As described above, applying the same material simultaneously to both sides of the plate 58 either by vacuum evaporation, sputtering or plating is preferred for obtaining flat, high quality mirror surfaces 76. If both sides of the plate 58 cannot be coated simultaneously with the same material, then preferably each of the layers are built up stepwise on the plate 58 by a series of partial coatings alternating back and forth between opposite sides of the plate 58. If it is impractical to build up the layers by partial coatings alternating between sides of the plate 58, then the thin adhesion layer should be applied first to one side and then the other side of the plate 58. After forming the adhesion layer, the reflective layer is applied first to one side and then the other side of the plate 58. Finally, if both layers must be coated onto one side of the plate 58 before coating them onto the other side, the coatings must surely be applied as a single continuous process performed with processing conditions and environment being maintained constant throughout the entire process, e.g. without breaking vacuum.

In addition to providing a reflective plate 58 with a high quality mirror surface 76, for some applications of the plate 58 may also require depositing a dielectric coating over a metallic one perhaps to increase the reflectivity of the mirror surface 76, or to adjust polarization of the light beam 74 reflected from the mirror surface 76. In most instances reflective characteristics a mirror surface are tailored for a particular application by depositing inorganic materials, such as oxides, nitrides, etc., onto the reflective material such as a metallic film. Because a coating of such an inorganic material needs to be approximately 0.1 to 0.2 microns thick, which is much thicker than the reflective metallic coating applied to the plate 58, the stress which the optical coating may apply to the plate 58 is a significant concern, particularly since the coating must be deposited in perfect stress balance sometimes onto plates 58 that are only a few microns thick.

For applications in which it is necessary to tailor reflective characteristics of the mirror surface 76, perhaps to increase its reflectivity or to adjust polarization of the light beam 74 reflected from the mirror surface 76, rather than applying an oxide, nitride, etc. overcoating onto the reflective material, parylene, used as a conformal dielectric coating, is preferably applied onto reflective mirror surfaces 76. Parylene is an organic material, which exhibits very low yield stress. Typically parylene deposits conformally at room temperature in a vacuum system at a pressure of a few Torr. For tailoring reflective characteristics of the mirror surface 76, parylene type "C," which has an index of refraction of 1.64 and a low expansion coefficient, is to be preferred. Parylene is transparent in the visible portion of the light spectrum, and has few absorption bands even in the infrared. As indicated in FIG. 18, parylene also has the unique property that, during a single deposition process, it produces a conformal overcoat 292 of equal thickness on opposite sides of metal coated mirror surfaces 76 of torsional scanners 52. Hence, when parylene overcoats the mirror surface 76 it forms an identical film both on the front side and the back side of the plate 58 as is desired for stress balancing. Because of parylene's properties, that overcoating will exhibit a much lower inherent stress than conventional inorganic coatings. Thus, overcoating 0.1 to 0.3 microns of parylene onto the mirror surfaces 76 of plates 58 permits fabricating optically tailored mirrors with optimized reflectivity without bending the plate 58.

FIG. 18a depicts reflectivity of 0.659 micron wavelength light having respectively "S" and "P" polarizations from the mirror surface 76 for differing thickness of parylene conformal overcoat 292. FIG. 18b depicts a difference between phases of the "S" and "P" polarized monochromatic light reflected from the mirror surface 76 for differing thicknesses of the parylene conformal overcoat 292. As is apparent from FIG. 18b, the "S" and "P" polarized monochromatic light reflected from the mirror surface 76 is in phase if the parylene conformal overcoat 292 is approximately 0.85 microns thick, and if it is approximately 1.75 microns thick. As indicated by FIG. 18a, the reflectivity of mirror surface 76 is poor if the parylene conformal overcoat 292 is approximately 0.85 microns thick, while the reflectivity is at a maximum if the parylene conformal overcoat 292 is approximately 1.75 microns thick. Thus, FIGS. 18a and 18b demonstrate that with a parylene conformal overcoat 292 of the proper thickness applied to the mirror surface 76 a highly reflective surface may be obtained which reflects both "S" and "P" polarized monochromatic light without any phase difference between the two polarizations.

Swift, Adjustable Optical Switch

The plan and cross-sectional elevational views of FIG. 19a and 19b illustrate a torsional scanner 52 adapted for light beam switching applications. The plate 58, carrying the mirror surface 76, is supported within the frame 56 for rotation about the axis 62 by the torsion bars 54. The frame 56 also includes an actuator portion 302 and is supported for rotation with respect to an outer frame 304 by a second pair of outer torsion bars 306. The torsional scanner 52 depicted in FIGS. 19a and 19b is similar to a 2D scanner such as those described in the '790 and '553 patents, but the center of the mirror plate 58 is not located on an axis 312 established by the outer torsion bars 306 about which the frame 56 rotates. Rather, the torsional scanner 52 adapted for light beam switching locates the plate 58 entirely to one side of the axis 312.

The light beam 74 to be switched propagates parallel to the device silicon layer 226 of the wafer 222 in which the plate 58 and torsion bars 54 lie when the actuator portion 302 of the frame 56 is un-energized for rotation about the axis 312. When the actuator portion 302 becomes energized and the frame 56 rotates about the axis 312 to the position indicated by dashed lines in FIG. 19b, the mirror surface 76 moves into the propagation path of the light beam 74 thereby reflecting the light beam 74 along a different propagation path.

Conceptually, rotation of the frame 56 about the axis 312 could be energized electrostatically by applying a voltage V between the actuator portion 302 and an electrode 66. The electrode 66 is secured to an electrically insulating plug 308 shaped to fit within a cavity created in the wafer 222 during fabrication of the torsional scanner 52. The plug 308 orients the electrode 66 at an angle similar to that to which the frame 56 tilts to intercept the light beam 74 thereby maximizing the attractive electrostatic force between the electrode 66 and the actuator portion 302. However, if the frame 56 is to rotate quickly about the axis 312, it must exhibit a high resonant frequency for its principal torsional vibrational mode about the axis 312. To establish a high resonant frequency for the frame 56, the outer torsion bars 306 must possess a high torsional spring constant. However, outer torsion bars 306 having a high torsional spring constant require applying a strong torque to the actuator portion 302 first to rotate the frame 56 and then to maintain it in the tilted orientation. As a practical matter, the requirement that a strong force be applied to the actuator portion 302 almost precludes using electrostatic attraction to quickly rotate the frame 56 from its rest position to its tilted orientation. Electro-magnetically energized rotation of the frame 56 about the axis 312 can supply the strong force required to overcome the resistance due to the high torsional spring constant of the outer torsion bars 306. However, the large electrical current required to maintain the frame 56 in its tilted orientation is undesirable for continuous operation.

In a preferred embodiment for the torsional scanner 52 illustrated in FIGS. 19a and 19b, rotation is initially energized electro-magnetically with a subsequent attractive electrostatic force between the electrode 66 and the actuator portion 302 being applied merely to hold the frame 56 in the tilted orientation. For example, a small permanent magnet 318 located near the actuator portion 302 together with a coil 322 carried on the actuator portion 302 which receives a large current pulse may be used to impulsively initiate rotation of the frame 56 about the axis 312 out of the plane of the wafer 222. A several hundred milliampere ("mA") current pulse may be applied to the coil 322 in accordance with a pre-programmed profile. Alternatively, either of the outer torsion bars 306 may include a torsion sensor 108 to permit servoing the current pulse so rotation of the frame 56 follows a pre-programmed profile. To most quickly rotate the frame 56 to the desired orientation, either the programmed or servoed current pulse may, near the end of the impulse, reverse the direction of current flow to decelerate rotation. Rotation of the frame 56 should be arranged to provide a soft landing for actuator portion 302 against a plastic support plate 324 located beneath the wafer 222. That is, the actuator portion 302 should approach the desired orientation with a near zero velocity. After the actuator portion 302 of the frame 56 rotates near the electrode 66, it can be easily held in the desired orientation without dissipating any power using an electrostatic force because the separation between the rotated actuator portion 302 and the electrode 66 is tiny.

Configured as depicted in FIG. 19b, the magnet 318 establishes a magnetic field that is tilted in a direction indicated by an arrow 325 to optimize the magnetic interaction with the magnetic field produced by the coil 322. The available field determines how much force can be exerted on the actuator portion 302, and hence the thickness of the frame 56 and the obtainable switching time. A Nd—B—Fe permanent magnet material, or a plastic variant thereof, is preferred for the magnet 318 to obtain optimum performance. The structure for electro-magnetically energizing rotation of the frame 56 is conveniently assembled by inserting the magnet 318, and also possibly a magnetic keeper 326, into an elongated hole 332 that pierces the wafer 222. The plastic support plate 324 beneath the wafer 222 includes a hole 334 that receives a portion of the magnet 318, and also possibly the magnetic keeper 326.

To permit trimming the orientation of the plate 58, the frame 56 includes at least one, and preferably two, flexible beams 338 that project away from the axis 312 slightly beyond a periphery of the actuator portion 302. As the plate 58 rotates into the orientation illustrated by dashed lines in FIG. 19b, tips of the beams 338 contact the support plate 324. By adjusting the voltage V applied between the frame 56 and the immediately adjacent electrode 66, the plate 58 is pulled into the desired orientation by the attractive electrostatic force between them thus bending the beams 338. Alternatively, trimming the orientation of the frame 56 may also be accomplished by applying a small electric current to the coil 322. The electromagnetic force resulting from the small electric current may either compliment or oppose a constant electrostatic force obtained by maintaining the voltage V constant. One of the outer torsion bars 306 may include a torsion sensor 108 which provides an output signal for precisely measuring the orientation of the frame 56.

FIGS. 20a and 20b illustrate alternative ways of holding the frame 56 in a desired orientation respectively following a forty-five degree (45°) and a ninety degree (90°) angular rotation, or following any arbitrarily chosen angular rotation. In both of these embodiments the wafer 222 includes a stop 342 where the periphery of the actuator portion 302 included in the frame 56 comes to rest. The electrode 66, positioned at the stop 342, is attached to the wafer 222 and overcoated with a suitable insulator, e.g. a few microns of polyimide. Overcoating the electrode 66 with an insulator combined with the extended close contact between the periphery of the frame 56 and the electrode 66 permits establishing very strong electrostatic holding force between the electrode 66 and the periphery of the rotated frame 56. The embodiment of the torsional scanner 52 depicted in FIG. 20b employs a arcuate-shaped magnet 318 to provide a magnetic field, indicated by arrows 325, that is oriented substantially parallel to the coil 322 throughout the ninety degree (90°) rotation of the frame 56 from its rest position to contacting the stop 342.

As described thus far the stop 342 and the electrode 66 located there are comparatively rigid. Further overcoating the electrode 66 with a layer of resilient material permits effecting small angular adjustments in the orientation of the frame 56 by varying the voltage V applied between the frame 56 and the electrode 66.

FIG. 20c illustrates an alternative embodiment of the frame 56 illustrated in FIGS. 19a and 19b that includes a mechanism for adjusting the orientation of the frame 56 after application of the electrostatic force fixes the frame 56 in the orientation in which the plate 58 reflects the light beam 74 along a different propagation path. For the adjustment mechanism illustrated in FIG. 20c, the frame 56 includes a U-shaped partial sub-frame 352 which the outer torsion bars 306 couple to the outer frame 304. A set of trimming torsion bars 354, that are located immediately adjacent to the outer torsion bars 306, couple the partial sub-frame 352 to the remainder of the frame 56 which carries the coil 322. Typically the trimming torsion bars 354 are much stiffer than the pair of outer torsion bars 306.

The frame 56 includes a groove 356 which separates most of the frame 56 that includes the plate 58 and the coil 322 from the partial sub-frame 352. Thus, the portion of the frame 56 that includes the plate 58 and the coil 322 can rotate about an axis 358 established by the trimming torsion bars 354 independently of the partial sub-frame 352 when the partial sub-frame 352 is clamped to the stop 342. Since the stiff trimming torsion bars 354 permit the frame 56 except for the partial sub-frame 352 to rotate about the axis 358, a small electric current applied to the coil 322 trims the orientation of the plate 58 with respect to the light beam 74. Thus, in the embodiment of the torsional scanner 52 depicted in FIG. 20c, electric currents applied sequentially to the coil 322 first provide an impulse for rotating the frame 56 from its rest position to its active position, and then trim the orientation of the plate 58 while the plate 58 is in its active position.

The trimming torsion bars 354 may include a torsion sensor 108 so trimming the orientation of the frame 56 may be tracked or servoed. Electro-magnetic trimming as described above may be employed to rotate the frame 56 both clockwise and counter-clockwise about the axis 358. If the torsional scanner 52 requires trimming in only one direction, then trimming could be effected by applying an electrostatic force between that area of the actuator portion 302 which carries the coil 322 and an immediately adjacent electrode which is separate from the electrode 66 depicted in FIGS. 19b, 20a and 20b.

Micromachined Optical Processing Elements

As described in the '324 patent, a polarized light detector may be provided by a set of wires forming a wire grid polarizer appropriately oriented over a photo-detector. Wire grid polarizers suitable for this application are described in "Handbook of Optics", Mc Graw Hill, copyright 1978, pp. 10–72–10–77. Wire grid polarizers block light having its electric field oriented parallel to the length of wires making up the grid, while passing light having its electric field oriented perpendicular to the wires. As disclosed in the '324 patent by disposing the wire grid in a suitable configuration with respect to a silicon photo-detector, the photo-detector becomes polarization sensitive. As described in the "Handbook of Optics," the spacing of wires making up the wire grid must be designed for the wavelength of the light incident on the polarized-light photo-detector.

FIG. 21 depicts the plate 58 of the conventional torsional scanner 52 carrying a wire grid polarizer 362. The wire grid polarizer 362 is disposed over a photo-diode, not separately illustrated in FIGS. 21, 21a or 22b, that is formed in the plate 58. The wire grid polarizer 362, depicted in greater detail in FIG. 22a, includes a number of parallel wires 364. Each of the wires 364 is spaced apart from the immediately adjacent wires 364 by a distance which is no greater than one-half (½) the wavelength of light impinging on the plate 58. If required for a particular application, stress in the area of the plate 58 occupied by the wire grid polarizer 362 may be decoupled from the remainder of the plate 58 by encircling the wire grid polarizer 362 with a stress relief cut 244 and supporting it with beams 246, similar to those depicted in FIG. 15a for the central mirror portion 242 located in the plate 58.

As disclosed in the '790 patent, the torsional scanner 52 may contain a photo-detector, preferably located along the periphery of the plate 58 to monitor reflected light. As illustrated in FIG. 23a, photo-detectors 372, e.g. photo-diode, may also be incorporated into the frame 56. Signals from the photo-detectors 372 located in the frame 56, suitably processed, can be used for tracking or other purposes. The photo-detectors 372 may be used to sense light scattered from edges of an object being illuminated by a scanning beam reflected off a mirror surface 76 on the plate 58. Similar to the torsional scanner 52 depicted in FIGS. 21, 22a and 22b, a wire grid polarizer 362 may be is disposed over the photo-detectors 372 so they become polarization sensitive.

The plate 58 may carry other optical devices instead and/or in addition to a photo-detector. Thus, the plate 58 may carry a diffraction grating, a beam splitter, pinhole, etc., or, as depicted in FIGS. 24a and 24b, a transmissive or reflective Fresnel lens 376. As illustrated in FIG. 24b, the Fresnel lens 376, made up of concentric ridges 378, is formed into the plate 58 using reactive ion etching ("RIE"). The Fresnel lens 376 as illustrated transmits light at wavelengths for which silicon is transparent, e.g. at wavelengths used for optical telecommunications. Overcoating the ridges 378 with a reflective layer establishes a reflective Fresnel lens 376 on the plate 58. As described above, applying a low stress mirror surface 76 to both sides of the plate 58 preserves the shape of the Fresnel lens 376 as initially formed in the plate 58.

Industrial Applicability

Fabricating the structures described above begins with a wafer 222 of bulk silicon, or a wafer of bulk silicon that includes a silicon-on-insulator ("SOI") layer. Either of these two types of wafers are then micromachined employing well known techniques which utilize in combination photolithography, various electrochemical or plasma etching processes, and suitable plating, depositing, growing and, as appropriate, micromachining processes that establishes on the wafer suitably patterned layers of metals, nitrides, oxides, ceramics, polysilicon, amorphous silicon, polymeric, or other desired material.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. An integrated, micromachined structure comprising:
   a reference member;
   a pair of diametrically opposed torsional flexure hinges projecting from the reference member, at least one of the torsional flexure hinges being formed by coupling together first ends of at least three (3) interconnected basic hinge-segments, each basic hinge-segment having a longitudinal axis, the first end of each basic hinge-segment being located between ends of the torsional flexure hinge; and
   a dynamic member coupled by the pair of torsional flexure hinges to the reference member to be thereby supported from the reference member for rotation about an axis established by the pair of torsional flexure hinges and that is not oriented perpendicular to any of the hinge-segment longitudinal axes; the reference member, the pair of torsional flexure hinges and the dynamic member monolithically fabricated using a stress-free semiconductor layer of a silicon substrate;
   whereby the micromachined structure is more compact than if the dynamic member were supported from the reference member by a conventional unfolded torsion bar, and the torsional flexure hinge is stiffer either horizontally or vertically, or both, than a conventional unfolded torsion bar having the same torsional spring constant as the torsional flexure hinge.

2. The micromachined structure of claim 1 wherein the longitudinal axis of basic hinge-segments are aligned parallel with the axis established by the pair of torsional flexure hinges whereby upon observing the torsional flexure hinge formed thereby in plan view the torsional flexure hinge appear T-shaped.

3. The micromachined structure of claim 1 wherein a second end of one of the basic hinge-segments couples to the reference member, and second ends of two of the basic hinge-segments couple to the dynamic member.

4. The micromachined structure of claim 1 wherein a second end of one of the basic hinge-segments couples to the dynamic member, and second ends of two of the basic hinge-segments couple to the reference member.

5. The micromachined structure of claim 1 wherein at least one of the basic hinge-segments is formed by a conventional unfolded torsion bar that has a torsion sensor included therein.

6. The micromachined structure of claim 1 wherein the torsional flexure hinges formed by coupling together basic hinge-segments further includes at least two supplemental hinge-segments each of which includes a first end which couples to a second end of one of the basic hinge-segments, each supplemental hinge-segment having a longitudinal axis that is not oriented perpendicular to the axis about which the dynamic member rotates.

7. The micromachined structure of claim 6 wherein the longitudinal axis of basic hinge-segments and of the supplemental hinge-segments are aligned parallel with the axis established by the pair of torsional flexure hinges whereby upon observing the torsional flexure hinge formed thereby in plan view each pair of coupled basic hinge-segments and supplemental hinge-segments respectively appears U-shaped.

8. The micromachined structure of claim 6 wherein a second end of the basic hinge-segment that is not coupled to either of the supplemental hinge-segments couples to the reference member, and second ends of the supplemental hinge-segments couple to the dynamic member.

9. The micromachined structure of claim 6 wherein a second end of the basic hinge-segment that is not coupled to either of the supplemental hinge-segments couples to the dynamic member, and second ends of the supplemental hinge-segments couple to the reference member.

10. The micromachined structure of claim 6 wherein at least one of the supplemental hinge-segments is a bifilar beam.

11. The micromachined structure of claim 6 wherein the basic hinge-segments and the supplemental hinge-segments have differing width-to-thickness (w:t) ratios.

12. The micromachined structure of claim 6 wherein the basic hinge-segments and the supplemental hinge-segments have differing lengths.

13. The micromachined structure of claim 1 wherein at least one of the basic hinge-segments is a bifilar beam.

14. The micromachined structure of claim 1 wherein the basic hinge-segments have differing width-to-thickness (w:t) ratios.

15. The micromachined structure of claim 1 wherein the basic hinge-segments have differing lengths.

16. An integrated, micromachined structure comprising:
a reference member;
a pair of diametrically opposed torsional flexure hinges projecting from the reference member, at least one of the torsional flexure hinges being formed by a bifilar beam; and
a dynamic member coupled by the pair of torsional flexure hinges to the reference member to be thereby supported from the reference member for rotation about an axis established by the pair of torsional flexure hinges, the axis being located between the bifilar beam; the reference member, the pair of torsional flexure hinges and the dynamic member monolithically fabricated using a stress-free semiconductor layer of a silicon substrate.

17. The micromachined structure of claim 16 wherein each of the beams forming the bifilar beam upon being observed in plan view is L-shaped.

18. The micromachined structure of claim 16 wherein each of the beams forming the bifilar beam upon being observed in plain view is U-shaped.

19. The micromachined structure of claim 16 further comprising a conventional unfolded torsion bar that is disposed between the two (2) beams included in the bifilar beam of the torsional flexure hinge, and that extends between the reference member and the dynamic member.

20. An integrated, micromachined structure comprising:
a reference member;
a pair of diametrically opposed torsional flexure hinges projecting from the reference member;
a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate;
drive means for imparting rotary motion to the dynamic member about the axis established by the pair of torsional flexure hinges; and
at least one appendage having a first end that attaches to one of the torsional flexure hinges at a point along the torsional flexure hinge that is located between the reference member and the dynamic member, the appendage projecting outward from the torsional flexure hinge and being shaped so that upon sufficient rotation of the dynamic member about the axis with respect to the reference member a projecting end of the appendage contacts a stop having a fixed relationship with the reference member thereby stiffening a torsional spring constant of the torsional flexure hinge.

21. The micromachined structure of claim 20 wherein while the second end of the appendage remains in contact with the stop the appendage flexes as the dynamic member continues rotating about the axis with respect to the reference member to gradually increase the torsional spring constant.

22. An integrated, micromachined structure comprising:
a reference member;
a pair of diametrically opposed torsional flexure hinges projecting from the reference member;
a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate;
drive means for imparting rotary motion to the dynamic member about the axis established by the pair of torsional flexure hinges; and
at least one tether that is coupled at a first end to the reference member and at a second end to one of the torsional flexure hinges at a point along the torsional flexure hinge that is located between the reference member and the dynamic member whereby upon sufficient rotation of the dynamic member about the axis with respect to the reference member the tether increases a torsional spring constant of the torsional flexure hinge.

23. The micromachined structure of claim 22 wherein the tether includes a spring.

24. The micromachined structure of claim 23 wherein corrugations included in the spring compress as rotation of the dynamic member about the axis with respect to the reference member increases.

25. An integrated, micromachined structure comprising:
a reference member;
a pair of diametrically opposed torsional flexure hinges projecting from the reference member;
a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate;
a rotation sensor that is adapted for producing a signal responsive to angular rotation of the dynamic member about the axis with respect to the reference member;
at least one electrode disposed adjacent to the dynamic member; and
drive means for applying an electrostatic drive signal between the dynamic member and electrode that imparts rotary motion to the dynamic member about the axis established by the pair of torsional flexure hinges, the drive means receiving a signal from the rotation sensor and altering the drive signal in response thereto to improve electrostatic stability of the micromachined structure.

26. The micromachined structure of claim 25 wherein a component, added to the drive signal, is proportional to the received signal raised to a power.

27. The micromachined structure of claim 26 wherein the power is two (2).

28. The micromachined structure of claim 25 wherein the rotation sensor is a torsion sensor located in one of the torsional flexure hinges.

29. An integrated, micromachined structure comprising:
a reference member;
a pair of diametrically opposed torsional flexure hinges projecting from the reference member;
a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; the dynamic member including a reinforcing rim having a tip that is sharpened;

at least one electrode disposed adjacent to the tip of the reinforcing rim; and drive means for applying an electrostatic drive signal between the dynamic member and electrode that imparts rotary motion to the dynamic member about the axis established by the pair of torsional flexure hinges, an electrostatic field between the reinforcing rim and the electrode produced by the drive signal being enhanced by the sharpening of the reinforcing rim.

30. The micromachined structure of claim 29 wherein the tip is sharpened by anisotropic etching along (111) crystallographic planes of the silicon substrate.

31. The micromachined structure of claim 29 wherein the tip has a width that is no greater than three (3.0) times the spacing between the dynamic member and the electrode.

32. The micromachined structure of claim 29 wherein:

the reinforcing rim encircles a hollow first cavity formed into the dynamic member that opens toward the electrode; and the electrode is supported upon a substrate having a hollow second cavity formed therein that opens toward the first cavity formed into the dynamic member.

33. The micromachined structure of claim 32 wherein the substrate is fabricated using a silicon substrate and the second cavity is formed thereinto by anisotropic etching along (111) crystallographic planes of the silicon substrate.

34. An integrated, micromachined structure comprising:

a reference member;

a pair of diametrically opposed torsional flexure hinges projecting from the reference member;

a dynamic member coupled by the pair of torsional flexure hinges to the reference member to be thereby supported from the reference member for rotation about an axis established by the pair of torsional flexure hinges; the dynamic member including reinforcing rim; the reference member, the pair of torsional flexure hinges and the dynamic member monolithically fabricated using a stress-free semiconductor layer of a silicon substrate; the reinforcing rim encircling a hollow first cavity formed into the dynamic member and a substrate upon which the reference member rests having a hollow second cavity formed therein that opens toward the first cavity formed into the dynamic member and that is disposed adjacent thereto.

35. The micromachined structure of claim 34 wherein the substrate is fabricated using a silicon substrate and the second cavity is formed thereinto by anisotropic etching along (111) crystallographic planes of the silicon substrate.

36. The micromachined structure of claim 34 wherein a drive means energizes rotation of the dynamic member about the axis with respect to the reference member electrostatically by applying a drive signal between the dynamic member and an electrode attached to the substrate.

37. An integrated, micromachined structure comprising:

a reference member;

a pair of diametrically opposed torsional flexure hinges projecting from the reference member;

a dynamic member coupled by the pair of torsional flexure hinges to the reference member to be thereby supported from the reference member for rotation about an axis established by the pair of torsional flexure hinges;

at least one pair of auxiliary driving-plates disposed along opposite sides of one of the pair of torsional flexure hinges between the dynamic member and the reference member, the auxiliary driving-plates being coupled to the torsional flexure hinge adjacent to the dynamic member, the pair of auxiliary driving-plates having a width perpendicular to the axis which is less than a width of the dynamic member perpendicular to the axis, the reference member, the pair of torsional flexure hinges, the dynamic member and the auxiliary driving-plate monolithically fabricated using a stress-free semiconductor layer of a silicon substrate;

at least one electrode that is disposed adjacent to one of the auxiliary driving-plates; and drive means for imparting rotary motion to the dynamic member about the axis established by the pair of torsional flexure hinges electrostatically by applying a drive signal between the auxiliary driving-plate and the electrode.

38. The micromachined structure of claim 37 wherein the auxiliary driving-plate adjacent to the electrode includes a reinforcing section having a tip that is sharpened by anisotropic etching along (111) crystallographic planes of the silicon substrate.

39. The micromachined structure of claim 38 wherein the tip has a width that is no greater than three (3.0) times the spacing between the dynamic member and the electrode.

40. The micromachined structure of claim 38 wherein the electrode does not occlude the dynamic member whereby light may reflect from reflective mirror surfaces located on either or both sides of the dynamic member.

41. An integrated, micromachined structure comprising:

a reference member;

a pair of diametrically opposed torsional flexure hinges projecting from the reference member which have a width-to-thickness (w:t) ratio that exceeds four-to-one (4:1) whereby the torsional flexure hinges exhibit increase thermal conductivity in comparison with narrower and thinner torsional flexure hinges having an equivalent torsional spring constant; and a dynamic member coupled by the torsional flexure hinges to the reference member to be thereby supported from the reference member for rotation about an axis established by the torsional flexure hinges; the reference member, the torsional flexure hinges and the dynamic member monolithically fabricated using a stress-free semiconductor layer of a silicon substrate.

42. An integrated, micromachined structure comprising:

a reference member;

a pair of diametrically opposed torsion bars projecting from the reference member, at least a portion of one of the torsion bars having a width-to-length (w:l) ratio that exceeds one-to-two (1:2) whereby the torsion bars exhibit a non-linear torsional spring constant; and a dynamic member coupled by the torsion bars to the reference member to be thereby supported from the reference member for rotation about an axis established by the pair of torsional flexure hinges; the reference member, the torsion bars and the dynamic member monolithically fabricated using a stress-free semiconductor layer of a silicon substrate.

43. An integrated, micromachined structure comprising:

a reference member;

a pair of diametrically opposed torsional flexure hinges projecting from the reference member; and a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using an isotopically pure, stress-free semiconductor layer of a silicon substrate.

44. The micromachined structure of claim 43 wherein the dynamic member is also fabricated using isotopically pure silicon.

45. An integrated, micromachined structure comprising:

a reference member;

a pair of diametrically opposed torsional flexure hinges projecting from the reference member;

a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; a micromachined member selected from a group consisting of the reference member and the dynamic member having at least one slot formed therein that is disposed alongside one of the torsional flexure hinges; and damping material disposed across the slot and contacting the adjacent torsional flexure hinge near the reference member.

46. The micromachined structure of claim 45 wherein the dynamic member includes a stress relief cut that almost completely encircles a decoupled portion of the dynamic member thereby establishing beams for supporting that decoupled portion from a surrounding portion of the dynamic member whereby stress is decoupled between the decoupled portion and the surrounding portion.

47. The micromachined structure of claim 46 wherein the decoupled portion of the dynamic member has at least one reflective mirror surface coated thereon.

48. An integrated, micromachined structure comprising:

a reference member;

a pair of diametrically opposed torsional flexure hinges projecting from the reference member; and a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; the dynamic member includes a stress relief cut that almost completely encircles a decoupled portion of the dynamic member thereby establishing beams for supporting that decoupled portion from a surrounding portion of the dynamic member whereby stress is decoupled between the decoupled portion and the surrounding portion.

49. The micromachined structure of claim 48 wherein the decoupled portion of the dynamic member has at least one reflective mirror surface coated thereon.

50. An integrated, micromachined structure comprising:

a reference member;

a pair of diametrically opposed torsional flexure hinges projecting from the reference member and at least one of the torsional flexure hinges includes a widened section;

a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; and a torsion sensor located in the widened section that is adapted for producing a signal responsive to angular rotation of the dynamic member about the axis with respect to the reference member.

51. The micromachined structure of claim 50 wherein the torsional flexure hinge that having the widened section is formed by coupling together multiple basic hinge-segments one of which includes the widened section.

52. An integrated, micromachined structure comprising:

a reference member;

a pair of diametrically opposed torsional flexure hinges projecting from the reference member; and a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; the reference member and the dynamic member having front and back sides, and both the front and back sides of the dynamic member having a stress balanced reflective mirror coating applied thereto.

53. The micromachined structure of claim 52 wherein during application of the reflective mirror coating to the dynamic member both sides are sequentially coated stepwise to produce balanced stresses.

54. The micromachined structure of claim 53 wherein the dynamic member rotates intermittently during application of the reflective mirror coating.

55. The micromachined structure of claim 53 wherein the dynamic member rotates continuously during application of the reflective mirror coating.

56. The micromachined structure of claim 52 wherein the reflective mirror coating is vacuum deposited onto the dynamic member.

57. The micromachined structure of claim 56 wherein throughout deposition of the reflective mirror coating deposition conditions and environment are maintained constant.

58. The micromachined structure of claim 52 wherein the reflective mirror coating is plated from a liquid solution onto the dynamic member.

59. The micromachined structure of claim 52 wherein a thin adhesion layer is first applied to both the front and back sides of the dynamic member followed by a thicker reflection layer which provides the reflective mirror coating.

60. The micromachined structure of claim 59 wherein a low stress material form s the thin adhesion layer.

61. The micromachined structure of claim 60 wherein the low stress material is selected from a group consisting of titanium and zirconium.

62. The micromachined structure of claim 52 wherein the reflective mirror coatings applied to both the front and back side of the dynamic member are overcoated with parylene.

63. An integrated, micromachined structure comprising:

a reference member;

a pair of diametrically opposed torsional flexure hinges projecting from the reference member;

a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; and drive means for imparting rotary motion to the dynamic member about the axis established by the pair of torsional flexure hinges, the drive means initially energizing rotation of the dynamic member about the axis electro-magnetically with a current pulse to impulsively start rotation of the dynamic member to a desired orientation, the stopped dynamic member being held in the desired orientation with an electrostatic clamping force.

64. The micromachined structure of claim 63 wherein the current pulse for impulsively initiating rotation of the dynamic member follows a pre-established profile that causes the dynamic member to approach the desired orientation at a near-zero velocity.

65. The micromachined structure of claim 63 wherein:
the micromachined structure further comprises a torsion sensor that is adapted for producing a signal responsive to angular rotation of the dynamic member about the axis with respect to the reference member; and
the drive means receives the signal produced by the torsion sensor and uses the signal for servoing the impulsive rotation of the dynamic member to a pre-established profile during application of the current pulse that causes the dynamic member to approach the desired orientation at a near-zero velocity.

66. The micromachined structure of claim 63 wherein the micromachined structure further comprises a stop which the dynamic member contacts while the dynamic member is being held in the desired orientation by the electrostatic clamping force.

67. The micromachined structure of claim 66 wherein the stop is overcoated with a resilient insulating material which the dynamic member contacts while the dynamic member is being held in the desired orientation by the electrostatic clamping force.

68. The micromachined structure of claim 63 further comprising a fine adjusting means which tailors rotation of the dynamic member to the desired orientation while the dynamic member is being held by the electrostatic clamping force.

69. The micromachined structure of claim 68 wherein the fine adjusting means includes at least one flexible beam that projects away from the axis established by the torsional flexure hinges beyond a periphery of the dynamic member and that contacts a support while the dynamic member is being held by the electrostatic clamping force, and wherein a force applied to the dynamic member bends the flexible beam.

70. The micromachined structure of claim 69 wherein an electrostatic force is applied to the dynamic member in tailoring rotation of the dynamic member to the desired orientation.

71. The micromachined structure of claim 69 wherein an electromagnetic force is applied to the dynamic member in tailoring rotation of the dynamic member to the desired orientation.

72. The micromachined structure of claim 68 wherein the fine adjusting means includes in the dynamic member:
a sub-frame with the torsional flexure hinges coupling between the sub-frame and the reference member; and
a pair of fine adjusting torsional flexure hinges also included in the dynamic member for coupling between a remaining portion of the dynamic member and the sub-frame thereby supporting the remaining portion of the dynamic member for rotation with respect to the sub-frame about a fine adjustment axis established by the fine adjusting torsional flexure hinges; and
wherein a force applied to the remaining portion of the dynamic member rotates the remaining portion about the fine adjustment axis in tailoring rotation of the dynamic member to the desired orientation.

73. The micromachined structure of claim 72 wherein an electrostatic force is applied to the remaining portion of the dynamic member in tailoring rotation of the dynamic member to the desired orientation.

74. The micromachined structure of claim 72 wherein an electromagnetic force is applied to the remaining portion of the dynamic member in tailoring rotation of the dynamic member to the desired orientation.

75. An integrated, micromachined structure comprising:
a reference member;
a pair of diametrically opposed torsional flexure hinges projecting from the reference member; and
a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; the dynamic member also having a photo-detector formed therein and a wire grid polarizer disposed thereon adjacent to the photo-detector, whereby illumination incident on the photo-detector must traverse the wire grid polarizer before impinging upon the photo-detector.

76. The micromachined structure of claim 75 wherein the wire grid polarizer is disposed on a decoupled portion of the dynamic member that is almost completely encircled by a stress relief cut thereby establishing beams for supporting that decoupled portion from a surrounding portion of the dynamic member whereby stress is decoupled between the decoupled portion and the surrounding portion.

77. An integrated, micromachined structure comprising:
a reference member having a photo-detector formed therein adapted for detecting light scattered from an object being scanned optically;
a pair of diametrically opposed torsional flexure hinges projecting from the reference member; and
a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate.

78. The micromachined structure of claim 77 further comprising a wire grid polarizer disposed on the reference member adjacent to the photo-detector, whereby illumination incident on the photo-detector must traverse the wire grid polarizer before impinging upon the photo-detector.

79. An integrated, micromachined structure comprising:
a reference member;
a pair of diametrically opposed torsional flexure hinges projecting from the reference member; and a dynamic member coupled by the pair of torsional flexure hinges to the reference member to be thereby supported from the reference member for rotation about an axis established by the pair of torsional flexure hinges; the reference member, the pair of torsional flexure hinges and the dynamic member monolithically fabricated using a stress-free semiconductor layer of a silicon substrate; the dynamic member also including a Fresnel lens.

80. The micromachined structure of claim 79 having a reflective mirror coating applied over the Fresnel lens.

81. The micromachined structure of claim 79 wherein the reflective mirror coating is applied to both front and back sides of the dynamic member whereby stresses become balanced.

82. The integrated micromachined structure of claim 1, 16, 20, 22, 25, 29, 34, 37, 41, 42, 43, 45, 48, 50, 52, 63, 75, 77, or 79 wherein the silicon substrate is a silicon-on-insulator substrate.

* * * * *